United States Patent
Lue

(10) Patent No.: US 9,698,156 B2
(45) Date of Patent: Jul. 4, 2017

(54) VERTICAL THIN-CHANNEL MEMORY

(71) Applicant: MACRONIX INTERNATIONAL CO., LTD., Hsinchu (TW)

(72) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/637,187

(22) Filed: Mar. 3, 2015

(65) Prior Publication Data
US 2016/0260732 A1   Sep. 8, 2016

(51) Int. Cl.
| | |
|---|---|
| G11C 16/04 | (2006.01) |
| H01L 27/11582 | (2017.01) |
| H01L 29/786 | (2006.01) |
| H01L 29/51 | (2006.01) |
| H01L 29/06 | (2006.01) |
| H01L 29/66 | (2006.01) |

(Continued)

(52) U.S. Cl.
CPC .... *H01L 27/11582* (2013.01); *H01L 27/1157* (2013.01); *H01L 27/11565* (2013.01); *H01L 29/0649* (2013.01); *H01L 29/511* (2013.01); *H01L 29/66742* (2013.01); *H01L 29/786* (2013.01); *G11C 16/0483* (2013.01)

(58) Field of Classification Search
CPC ............. G11C 16/24; H01L 21/28282; H01L 21/30604; H01L 23/528; H01L 27/11582; H01L 29/0649; H01L 29/511; H01L 29/66742; H01L 29/786; H01L 29/7926
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |

(Continued)

FOREIGN PATENT DOCUMENTS

EP    2048709 A2    4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Khamdan Alrobaie
(74) *Attorney, Agent, or Firm* — Yiding Wu; Haynes Beffel & Wolfeld LLP

(57) ABSTRACT

A memory device which can be configured as a 3D NAND flash memory, includes a plurality of stacks of conductive strips, including even stacks and odd stacks having sidewalls. Some of the conductive strips in the stacks are configured as word lines. Data storage structures are disposed on the sidewalls of the even and odd stacks. Active pillars between corresponding even and odd stacks of conductive strips include even and odd semiconductor films having outside surfaces and inside surfaces, the outside surfaces disposed on the data storage structures on the sidewalls of the corresponding even and odd stacks in the plurality of stacks forming a 3D array of memory cells, the inside surfaces are separated by an insulating structure that can include a gap. The semiconductor films can be thin-films.

23 Claims, 35 Drawing Sheets

(51) Int. Cl.
*H01L 27/11565* (2017.01)
*H01L 27/1157* (2017.01)

(56) References Cited

U.S. PATENT DOCUMENTS

| | | | |
|---|---|---|---|
| 7,696,559 B2 | 4/2010 | Arai et al. | |
| 7,851,849 B2 | 12/2010 | Kiyotoshi | |
| 8,008,732 B2 | 8/2011 | Kiyotoshi et al. | |
| 8,363,476 B2 | 1/2013 | Lue et al. | |
| 8,467,219 B2 | 6/2013 | Lue | |
| 8,503,213 B2 | 8/2013 | Chen et al. | |
| 8,648,438 B2 | 2/2014 | Cai et al. | |
| 8,759,899 B1 | 6/2014 | Lue | |
| 8,853,818 B2 | 10/2014 | Lue | |
| 9,147,468 B1* | 9/2015 | Lue | G11C 11/5671 |
| 9,287,291 B2* | 3/2016 | Lue | G11C 11/5671 |
| 9,524,980 B2 | 12/2016 | Lue | |
| 2005/0280061 A1 | 12/2005 | Lee | |
| 2007/0045708 A1 | 3/2007 | Lung | |
| 2007/0158736 A1 | 7/2007 | Arai et al. | |
| 2007/0252201 A1 | 11/2007 | Kito et al. | |
| 2008/0073635 A1 | 3/2008 | Kiyotoshi et al. | |
| 2008/0175032 A1 | 7/2008 | Tanaka et al. | |
| 2008/0180994 A1 | 7/2008 | Katsumata et al. | |
| 2009/0097321 A1 | 4/2009 | Kim et al. | |
| 2009/0184360 A1 | 7/2009 | Jin et al. | |
| 2010/0270593 A1 | 10/2010 | Lung et al. | |
| 2011/0018051 A1 | 1/2011 | Kim et al. | |
| 2012/0068241 A1 | 3/2012 | Sakuma et al. | |
| 2012/0119283 A1 | 5/2012 | Lee et al. | |
| 2012/0147644 A1* | 6/2012 | Scheuerlein | G11C 13/0002 365/51 |
| 2012/0182806 A1 | 7/2012 | Chen et al. | |
| 2013/0009235 A1* | 1/2013 | Yoo | H01L 29/7926 257/329 |
| 2013/0134492 A1* | 5/2013 | Yang | H01L 27/11582 257/314 |
| 2013/0207178 A1* | 8/2013 | Lee | H01L 29/66833 257/324 |
| 2013/0248956 A1* | 9/2013 | Kim | H01L 27/0629 257/296 |
| 2014/0097484 A1* | 4/2014 | Seol | H01L 29/42332 257/324 |
| 2014/0231954 A1* | 8/2014 | Lue | H01L 27/11524 257/528 |
| 2015/0263016 A1* | 9/2015 | Cha | G11C 16/0483 257/314 |
| 2015/0318301 A1* | 11/2015 | Lee | H01L 27/11582 257/324 |
| 2015/0364487 A1* | 12/2015 | Yun | H01L 27/11575 257/324 |
| 2016/0043100 A1* | 2/2016 | Lee | H01L 27/11565 257/324 |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 14/309,622, entitled "Bandgap-engineered Memory With Multiple Charge Trapping Layers Storing Charge," by Hang-Ting Lue, filed Jun. 19, 2014, 108 pages.

U.S. Appl. No. 14/471,788, entitled "Multiple-Bit-Per-Cell, Independent Double Gate, Vertical Channel Memory," by Hang-Ting Lue, filed Aug. 28, 2014, 79 pages.

U.S. Appl. No. 14/637,204, entitled "U-Shaped Vertical Thin-Channel Memory," by Hang-Ting Lue, filed Mar. 3, 2015, 78 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

VERTICAL THIN-CHANNEL MEMORY

BACKGROUND OF THE INVENTION

This application is related to co-pending U.S. patent application Ser. No. 14/637,204, filed 03 Mar. 2015, entitled U-SHAPED VERTICAL THIN-CHANNEL MEMORY.

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around the cell at each layer.

Katsumata et al. has suggested that the structure can be implemented using multiple-bit-per-cell programming technologies. These multiple-bit-per-cell programming technologies require fine control over threshold voltages, making read and program disturb characteristics even more critical. Therefore, even with high density three-dimensional flash technologies, the density of data storage can be limited.

Because of the relatively large cross-section of the column and dielectric charge trapping structure used to limit disturbance, the density of the three-dimensional memory structure is limited.

It is desirable to provide a structure for three-dimensional integrated circuit memory with a low manufacturing cost, including reliable, very small memory elements, and high data densities.

SUMMARY

A vertical, thin-channel memory is described, which can be configured as a 3D NAND flash memory. In some embodiments, the memory can be configured for independent double gate operation, establishing two memory sites per frustum of a vertical channel pillar. The array can be configured, in addition, for multiple-bit-per-site operation.

In an example described herein, the memory device comprises a plurality of stacks of conductive strips, the plurality of stacks including even stacks and odd stacks. A plurality of active pillars, arranged between corresponding even and odd stacks of conductive strips in the plurality of stacks, defines a multilayer array of interface regions at cross-points between opposing side surfaces of the active pillars and conductive strips in the corresponding even and odd stacks of conductive strips. The active pillars can include first and second vertical thin channel films having outside surfaces and inside surfaces, the outside surfaces disposed on the data storage structures on the sidewalls of the first and second stacks, with an insulating structure such as a gap separating the vertical thin channel films at least in the frustums at which memory cells are disposed. The vertical thin channel films can be thin-film semiconductor material, where the term thin-film for the purposes of this application means 10 nanometers or less thick. The thickness of the thin-film provides for improved performance by suppressing the short channel effect for the memory cells. Also, the thin-film enables uniform channel thicknesses less dependent on the level of the memory cell than prior approaches. Also, the structure provides for channel length dimensions which are determined by the thickness of the conductive strips rather than on an etched layout pattern. This enables very short and uniform channel lengths for the memory cells. In combination with the short channel, and the improved short channel performance provided by the thin-channel film, high density, high performance memory can be achieved.

A 3D array of even and odd memory cells is described. Even memory cells are disposed in the interface regions accessible via the active pillars and conductive strips in the even stacks of conductive strips. Odd memory cells are disposed in the interface regions accessible via the active pillars and conductive strips in the odd stacks of conductive strips. Control circuitry is configured to apply different bias voltages to the even and odd conductive strips, and can be configured to execute a program operation by which one, or more than one, bit of data can be stored in both the even memory cell and odd memory cell in a given frustum of a selected active strip.

The odd memory cells on a given active pillar can be configured as a first NAND string, and the even memory cells on said given active pillar can be configured as a second NAND string. The active pillars can comprise a vertical channel structure including a seam, at least in the regions between the even and odd memory cells in a given frustum of the active pillar.

In a dual NAND string embodiment, the conductive strips in an upper level in the even and odd stacks can be configured as string select lines for both the first and second NAND strings on a given active pillar. The conductive strips in intermediate levels in the even and odd stacks can be configured as word lines for respective ones of the first and second NAND strings on a given active pillar. The conductive strips in a lower level in the even and odd stacks can be configured as ground select lines for both the first and second NAND strings on a given active pillar.

The memory block structure can include a reference conductor below the plurality of stacks, which can be a unitary structure for a single block, or a plurality of reference lines beneath and connected to the corresponding rows of active pillars in the plurality of active pillars. In a device described herein, the conductive strips configured as ground select lines have a thickness such that they overlap with corresponding reference lines and with lower portions of the active pillars in the corresponding rows.

Also, examples are described in which the active pillars comprise a vertical channel structure including a seam at the intermediate levels, and no seam at the upper level.

The plurality of stacks of conductive strips are arranged in blocks and, in a given block, conductive strips in a given layer of an odd stack can be configured in a comb-like structure with strips extending from an odd pad, and conductive strips in a given layer of an even stack can be configured in a comb-like structure with strips extending from an even pad, the conductive strips extending from the odd and even pads in the given block being interdigitated.

Methods for manufacturing memory devices as described herein are also provided. In one aspect, a method for manufacturing includes forming a thin film semiconductor layer over a plurality of stacks of conductive strips, including on the sidewalls of the trenches between the stacks. The thin film semiconductor layer is then patterned to form vertical thin channel films on opposing sides of the trenches, with an insulating structure that can include a gap between opposing vertical thin channel films.

Other aspects and advantages of the present invention can be seen on review of the drawings, the detailed description and the claims, which follow.

DETAILED DESCRIPTION

A detailed description of embodiments of the present invention is provided with reference to the FIGS. 1-36.

Figure 1:
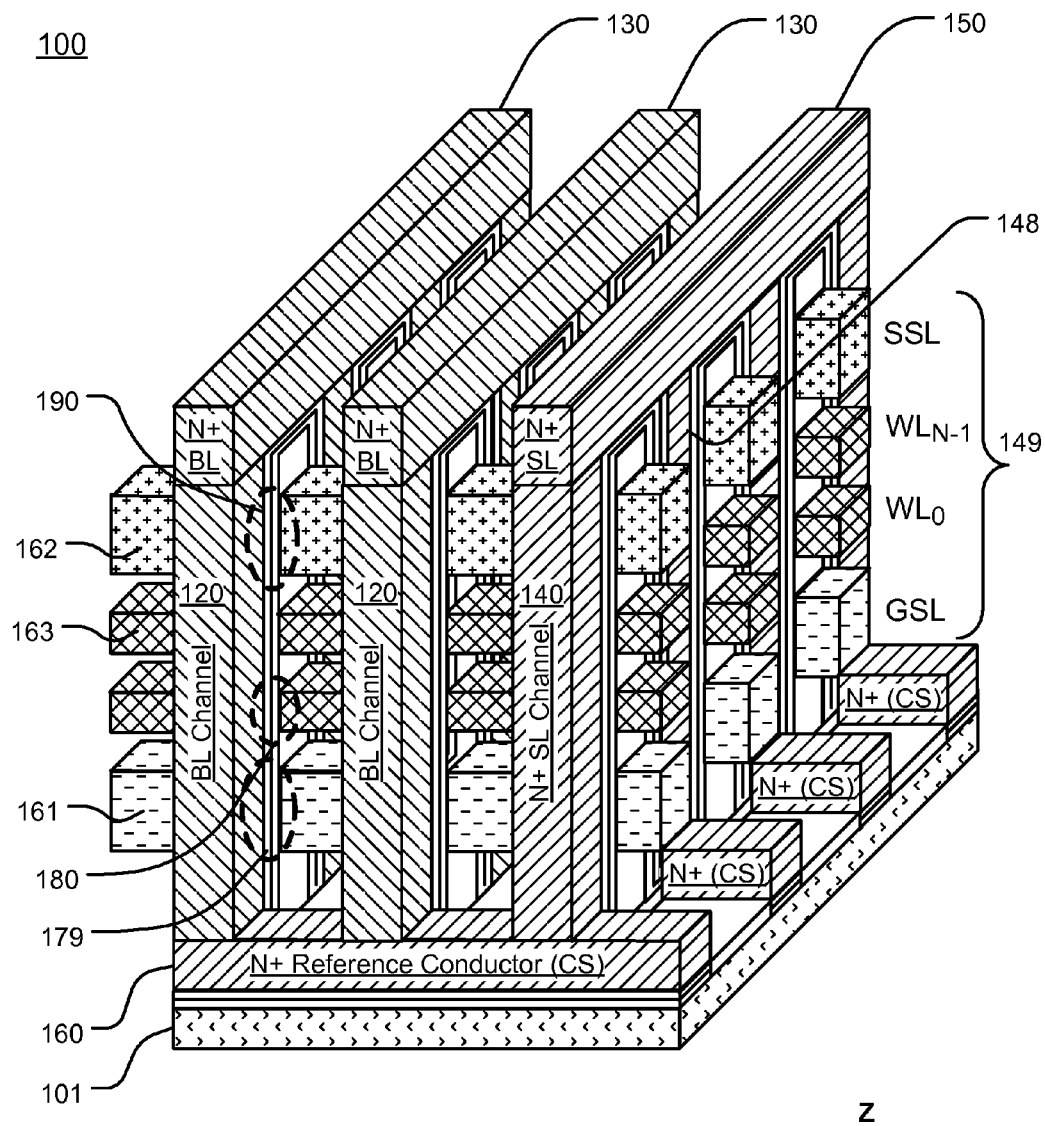
FIG. 1 is a simplified perspective diagram of a 3D memory device including vertical channel structures.

FIG. 1 is a schematic diagram of a three-dimensional 3D memory device 100 having an independent double gate, vertical channel structure, like that described in commonly owned, co-pending application Ser. No. 14/471,788, filed on 28 Aug. 2014, which application is incorporated by reference as if fully set forth herein.

The memory device 100 includes an array of NAND strings of memory cells, configured in an independent double gate vertical channel memory array (IDGVC) with two NAND strings per vertical channel, and suitable for multiple-bit-per-cell data storage. The memory device 100 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 1, a stack 149 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. Adjacent even word lines WLi and odd word lines WLi+1 are connected to separate bias circuits (not shown), so that two charge storage sites at the frustum of each vertical channel structure between the adjacent word lines can be separately accessed and used for data storage. This arrangement of independent word lines can be implemented for example by connecting even word lines to a first bias structure, and odd word lines to a separate bias structure, examples of which are described below.

The conductive strips acting as word lines, string select lines and ground select lines can comprise a variety materials including doped semiconductors, metals, and conductive compounds, including materials comprising Si, Ge, SiGe, SiC, TiN, TaN, W, and Pt.

Vertical channel structures (e.g. 120) are a part of a bit line structure in the memory device, and can comprise semiconductor materials adapted to act as channels for the memory cells, such materials as Si, Ge, SiGe, GaAs, SiC, and graphene.

In the illustrated example, the plurality of bit line structures are arranged orthogonally over, and have surfaces conformal with, the plurality of stacks, including inter-stack semiconductor body elements acting as vertical channel structures 120, between the stacks and linking elements 130 over the stacks connecting the inter-stack vertical channel structures 120. The linking elements 130 in this example comprise a semiconductor, such as polysilicon, having a relatively high doping concentration so that they have higher conductivity than the inter-stack vertical channel structures 120, which are configured to provide channel regions for the cells in the stacks. In alternative implementations, the linking elements can be part of overlying patterned metal layers, connected to the vertical channel structures by interlayer connectors or plugs.

The memory device includes memory layers, such as data storage structures, in interface regions at cross-points 180 between side surfaces of the even and odd conductive strips in the plurality of intermediate planes (WLs) in the stacks and the inter-stack vertical channel structures 120 of the plurality of bit line structures.

The memory layer can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon). In other embodiments, the memory layer can be a dielectric charge trapping structure like that shown in FIG. 35, as described in our co-pending, and commonly owned, U.S. patent application Ser. No. 14/309,622, entitled BANDGAP-ENGINEERED MEMORY WITH MULTIPLE CHARGE TRAPPING LAYERS STORING CHARGE, by H. T. Lue, which application is incorporated by reference as if fully set forth herein.

In a representative device, the dielectric layer 115 of memory material can include a bandgap engineered composite tunneling dielectric layer comprising a layer of silicon dioxide less than 2 nm thick, a layer of silicon nitride less than 3 nm thick, and a layer of silicon dioxide less than 4 nm thick. In one embodiment, the composite tunneling dielectric layer consists of an ultrathin silicon oxide layer $O_1$ (e.g. $\leq$15 Å), an ultrathin silicon nitride layer $N_1$ (e.g. $\leq$30 Å) and an ultrathin silicon oxide layer $O_2$ (e.g. $\leq$35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields. These layers can be conformally deposited using for example LPCVD.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_x$-$O_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, and can be formed by LPCVD or other wet conversion from the nitride by a wet furnace oxidation process. Other blocking dielectrics can include high-K materials like aluminum oxide.

The deposition techniques applied to form these layers of BE-SONOS ONO films and channel material can be carried out by conventional LPCVD processes, which provides excellent film quality and conformality required. On the other hand, tools such as atomic layer deposition ALD tools can be utilized for these films. The gate dielectric layer in the regions of the SSL and GSL layers can have a different composition than the memory layer.

The combination of a vertical channel structure and its data storage structures is referred to herein as an active pillar (e.g., active pillar 148). In the illustrated example, the memory cells in the cross-points 180 are configured in vertical NAND strings. In this configuration, two separate NAND strings are established on the opposing sides of a single inter-stack vertical channel structure. The two separate NAND strings can be operated independently for single-bit-per-cell or multiple-bit-per-cell, read, erase and program operations.

In the illustrated example, a reference conductor 160 is disposed between the bottom plane (GSL) of conductive strips and the integrated circuit substrate (not shown). At least one reference line structure is arranged orthogonally over the plurality of stacks, including inter-stack vertical conductive elements 140 between the stacks in electrical communication with the reference conductor 160, and linking contact pads 150 over the stacks (e.g. 149) connecting the inter-stack vertical conductive elements 140. The inter-stack vertical conductive elements 140 can be formed using the same material as the vertical channel structures 120, or can alternatively be formed using a material that provides a higher conductivity than the inter-stack vertical channel structures 120.

In the structure shown in FIG. 1, a string select line (e.g. 162) is disposed on each side of each active pillar (e.g. 148). Also, word lines (e.g. 163) are disposed on each side of each active pillar (e.g. 148). In addition, ground select lines (e.g. 161) are disposed on each side of each active pillar (e.g. 148).

The memory device includes string select switches 190 at interface regions with the top plane, or an upper level, of conductive strips, and reference select switches 179 at interface regions with the bottom plane (GSL) of conductive strips. The dielectric layers of the data storage structure can act as gate dielectric layers for the switches 179, 190 in some examples.

The memory device includes a first overlying patterned conductor layer (not shown) connected to the plurality of bit line structures, including a plurality of global bit lines coupled to sensing circuits. The memory device also includes a second overlying patterned conductor layer (not shown), which can be patterned, and can be above or below the first patterned conductor layer. The second overlying patterned conductor layer is connected to the at least one reference line structure, such as by contact to the linking contact pad 150. The second patterned conductor layer can connect the at least one reference line structure to a reference voltage source, or to circuitry for providing a reference voltage.

In the example shown in FIG. 1, the linking elements 130 of the bit line structures include N+ doped semiconductor material. The inter-stack vertical channel structures 120 of the bit line structures include undoped or lightly doped semiconductor material suitable for acting as channels. In the example shown in FIG. 1, the reference conductor 160 includes N+ doped semiconductor material, and the linking contact pads 150 of the at least one reference line structure include N+ doped semiconductor material. The inter-stack vertical conductive elements 140 of the at least one reference line structure also include N+ doped semiconductor material. In alternative implementations a metal or metal compound can be used in place of the doped semiconductors.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

Figure 2:
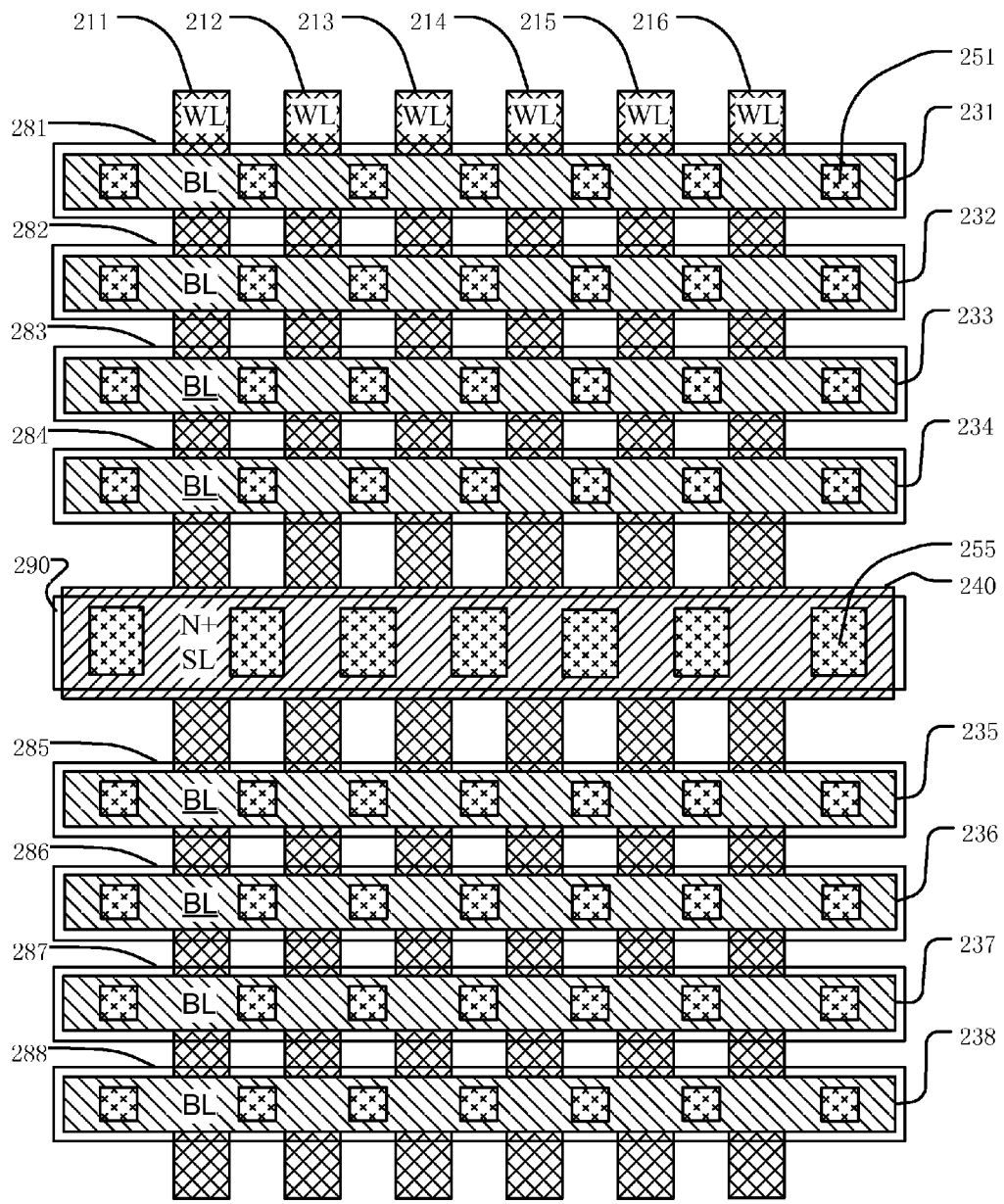
FIG. 2 is a layout view of a 3D structure like that illustrated in FIG. 1.

FIG. 2 is a layout schematic corresponding to a top view of the 3D schematic diagram in FIG. 1. Bit lines 231 through 234, and bit lines 235 through 238 correspond to the linking elements 130 in the plurality of bit line structures (FIG. 1). Source line 240 corresponds to the linking contact pad 150 in the at least one reference line structure (FIG. 1); other source lines can be disposed at intervals along the array. The bit lines (BL) and the source line (SL) are arranged orthogonally over word lines (WL) 211 through 216, which word lines are in the plurality of intermediate planes of conductive strips. Although only four bit lines are shown at each side of the source line 240, there can be any number of bit lines on each side of the source line 240. For instance, there can be eight or sixteen bit lines at each side of the source line 240.

In the example shown in FIG. 2, the memory device includes a first overlying patterned conductor layer, which includes first overlying lines 281-288. The first overlying patterned conductor layer can include metal, doped semiconductor or combinations of materials. The first overlying lines 281-288 are directly connected to the bit lines 231-238 via bit line contacts 251 to minimize bit line loading resistance. As described herein, bit lines 231-238 correspond to the linking elements 130 in the plurality of bit line structures (FIG. 1), thus the first overlying patterned conductor layer is connected to the plurality of bit line structures. The bit line structures can include a plurality of global bit lines coupled to sensing circuits (not shown). Locations of bit line contacts 251 are representative of one example. The physical layout of bit line contacts can be periodic or aperiodic, where more regular layouts can provide for better lithography exposure.

In the example shown in FIG. 2, the memory device includes a second overlying patterned conductor layer including conductor 290. The second overlying patterned conductor layer can include metal, doped semiconductor or combinations of materials. The conductor 290 is directly connected to the source line 240 via source line contacts 255 to minimize source line loading resistance. As described herein, the source line 240 corresponds to the linking contact pad 150 in the at least one reference line structure (FIG. 1), thus the second overlying patterned conductor layer is connected to the at least one reference line structure. The second overlying patterned conductor layer can be coupled to a reference voltage source (not shown). Locations of source line contacts 255 are representative of one example. The physical layout of source line contacts can be periodic or aperiodic, where more regular layouts can provide for better lithography exposure.

The inter-stack vertical conductive elements 140 (FIG. 1) in the at least one reference line structure can have a larger cross-sectional area than the inter-stack vertical channel structures 120 (FIG. 1) in the bit line structures. Correspondingly, source line contacts 255 can have a larger cross-sectional area than bit line contacts 251.

Figure 3:
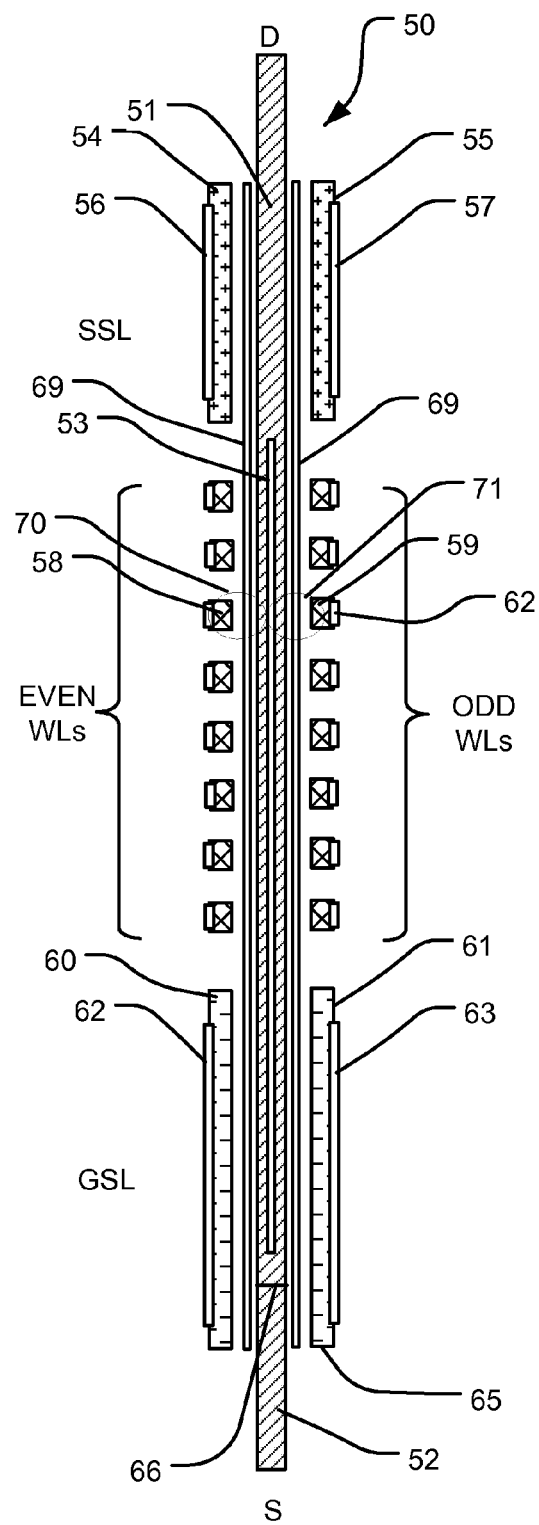
FIG. 3 is a heuristic cross-section of an active pillar in a 3D memory device.

FIG. 3 is a cross-section of an active pillar, such as the active pillar 148 of FIG. 1, with adjacent string select lines, ground select lines, even word lines and odd word lines. The active pillar in FIG. 3 includes a vertical channel structure 50, including a vertical polysilicon semiconductor body including even and odd vertical thin channel films separated by a seam 53, and a charge storage element 69 on each side of the semiconductor body, which can be continuous on the sidewalls of the stacks as shown, or separated into separate elements on the sidewalls of the conductive layers in the stacks which act as word lines. The vertical channel structure 50 includes a portion 51 providing a vertical channel body for string select line transistors, and a portion which incorporates the reference conductor 52, such as the reference conductor 160 as shown in FIG. 1. Between the portion 51 and the portion of the vertical channel structure which contacts or incorporates the reference conductor 52, the seam 53 is disposed within the vertical channel structure 50 between the even and odd word lines. The seam 53 separates the two separate thin-channel film bodies at the frustum of the column (e.g. at the level of word lines 58 and 59) at which the word lines cross, in the regions of the conductive strips acting as word lines, providing thin channel films for the memory cells. Although the seam 53 extends only partly between, or does not extend between, the conductive strips 54, 55 acting as SSL gates in the illustrated example, in other embodiments the seam can divide the vertical channel structure into separate vertical thin channels which extend through the SSL gates.

FIG. 3 illustrates conductive strips 54 and 55 configured as string select lines. The string select line conductive strips 54 and 55 can include a more highly conductive film 56, 57 on the outside surfaces, such as a film of a metal silicide.

FIG. 3 also illustrates ground select lines 60 and 61. The ground select lines 60, 61 can include more highly conductive films 62, 63 on the outside surfaces, such as a film of metal silicide.

Likewise, conductive strips are disposed as even and odd word lines on opposing sides of the vertical channel structure 50. Thus, an even word line 58 is disposed opposite an odd word line 59 in the structure. Eight word line layers are illustrated in this example. Of course a smaller or larger number of word line layers, such as 4, 16, 32, or more can be utilized. Also, in some embodiments, dummy word lines may be included, in addition those used for actual data storage.

As illustrated in FIG. 3, word lines may also include silicide films or other more highly conductive films (e.g. 62) on the outside surfaces.

In other embodiments, all or some of the string select lines, word lines and ground select lines are implemented using metal, or other conductive material, rather than polysilicon.

The structure illustrated in FIG. 3 provides memory cells 70, 71 having independent charge storage sites on the even and odd sides of the vertical channel structure 50. Also, the structure supports operating first and second NAND strings on opposing sides of the vertical channel structure 50.

In the illustration of FIG. 3, the thickness in the vertical dimension of the word lines, the string select lines and the ground select lines determines the channel lengths of the string select transistor, the memory cells, and the ground select transistors.

The string select line conductive strips 54, 55 in the structure of FIG. 3 have substantially greater thickness than the word line conductive strips, such as more than four times the thickness. This greater channel length facilitates operating the string select transistor using a bias voltage on one side of the vertical channel structure which is sufficient to turn off the transistor, even when the bias voltage on the opposite side might otherwise be sufficient to turn it on. Using this structure, the decoding operation utilized to select individual vertical channel structures can take advantage of independent double gate operation.

The ground select lines 60, 61 in the structure illustrated in FIG. 3 also have substantially greater thickness than the word lines. Again, this facilitates the decoding operation. The ground select lines 60, 61 shown in FIG. 3 also extend over the reference conductor 52. As illustrated, the upper surface 66 of the reference conductor lies at a layer substantially above the lower surface 65 of the ground select line 61. This overlapping of the ground select line structure with a reference conductor can be utilized to improve the conductivity of the reference conductor for selected rows of vertical channel structures.

It can be seen, therefore, that the reference conductor 52 is configured as a source line conductor structure beneath the plurality of active pillars. Though not seen in FIG. 3, the source line conductor can be connected to one or more conductive pillars between conductive strips in the even and odd multilayer stacks, connected to the source line conductor structure. A reference line structure, such as a line in a patterned metal layer, can be arranged orthogonally over the even and odd stacks of conductive strips. The one or more conductive pillars is/are connected to the reference line structure. The conductive pillars can be provided by a subset of the active pillars in the block. However, the conductive pillars need not have the data storage structures of the active pillars, and can have different dimensions. In some embodiments, the active pillars and the conductive pillars can be different materials.

Also, as shown in FIG. 3, the memory device is configured so that the odd memory cells on a given active pillar are configured as a first NAND string, and the even memory cells on said given active pillar are configured as a second NAND string. Thus, dual NAND strings are formed on a shared active pillar.

In a dual NAND string configuration, the conductive strips in an upper level in the even and odd stacks are configured as string select lines for both the first and second NAND strings on a given active pillar. The conductive strips in intermediate levels in the even and odd stacks are configured as word lines for respective ones of the first and second NAND strings on a given active pillar. The conductive strips in a lower level in the even and odd stacks are configured as ground select lines for both the first and second NAND strings on a given active pillar. As illustrated in FIG. 3, the conductive strips are configured as ground select lines having a thickness such that they overlap with corresponding reference lines and with lower portions of the active pillars in the corresponding rows.

Also, the active pillars comprise a vertical channel structure including a seam at the intermediate levels, and no seam at the upper level where the string select transistors are disposed. The channels in the memory cells 70 and 71 are respective thin-films of semiconductor material separated by a gap which acts as an insulating structure, or as part of an insulating structure between the thin-films. The gap encloses gas, such as gas from the atmosphere in the chamber during formation, which can be called "air" for the purposes of this description.

Figure 4:
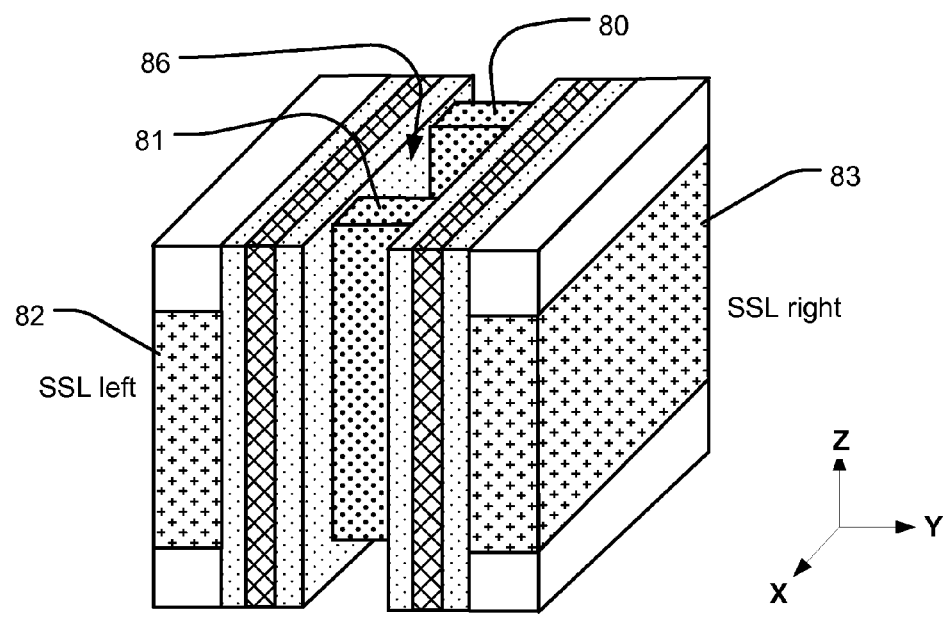
FIG. 4 is a perspective view of a string select transistor structure for an active pillar in a 3D memory device, like that of FIG. 1.

FIG. 4 illustrates a top section of an active pillar in the region of the string select lines 82, 83. In the illustration, active pillars 80 and 81, with data storage structures 84 and 85 formed on opposing sides, extend between a left side string select line 82 and a right side string select line 83. In the frustum of each active pillar that is between the string select lines, a string select transistor is implemented.

In this illustration, gap 86 is implemented between the active pillars 80, 81. This can reduce capacitive coupling between the vertical channel structures. In other embodiments, the gap 86 can be filled with a solid insulator, such as silicon oxide, low-K dielectric materials or other suitable insulators.

Figure 5:
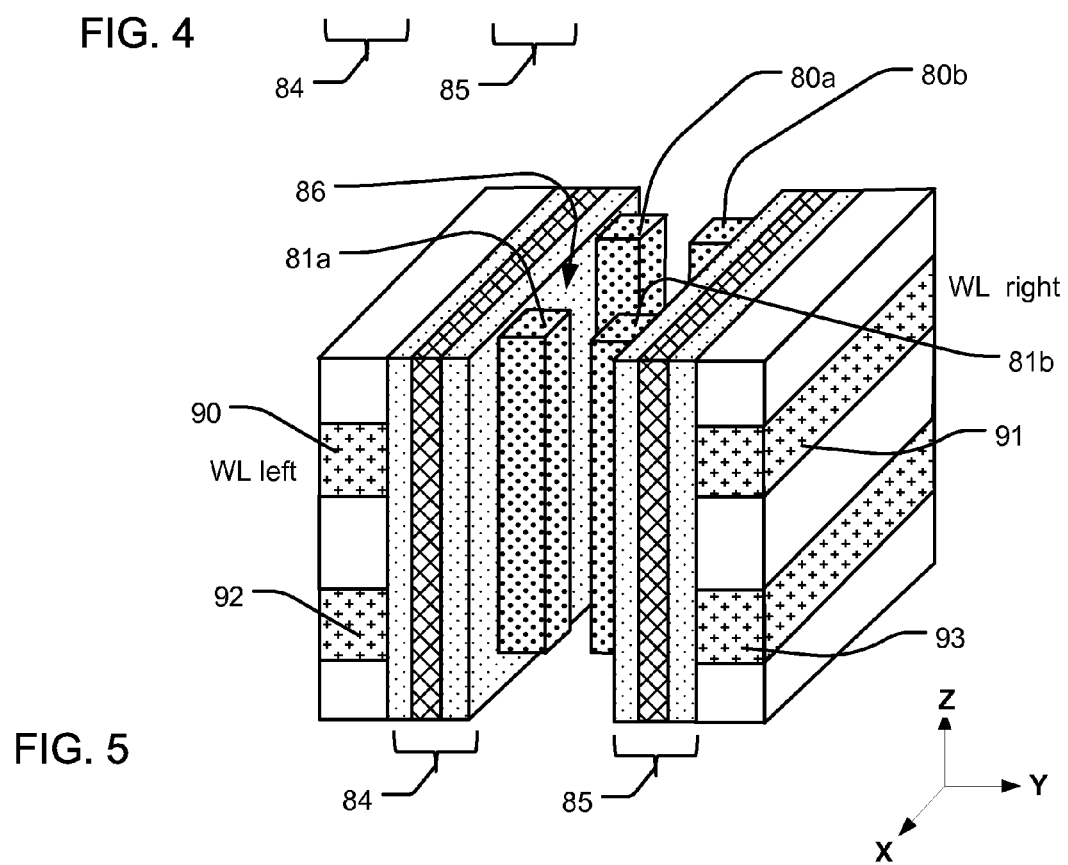
FIG. 5 is a perspective view of two frustums of an active pillar having thin-channel film structures separated by a gap, with memory cells for an active pillar in a 3D memory device.

FIG. 5 illustrates an intermediate section of an active pillar in the region of the word lines. In the illustration, the active pillars have vertical channel structures including even and odd thin-channel films split by a gap or seam as discussed above, resulting in a first active pillar portion 80*a* formed of thin semiconductor film, and a second active pillar portion 80*b* formed of a thin semiconductor film in active pillar 80. Also, a seam in active pillar 81 results in a first active pillar portion 81*a* and a second active pillar portion 81*b*, both of which are formed of a thin semiconductor film. The data storage structures 84, 85 line sides of the word lines, including even word lines 90, 92 on the left and odd word lines 91, 93 on the right.

Although not illustrated in FIGS. 4 and 5, in the region of the ground select lines, the seam in the vertical channel structures can merge into a single body which can be part of the reference line as in the example of FIG. 3, described above.

Figure 6:
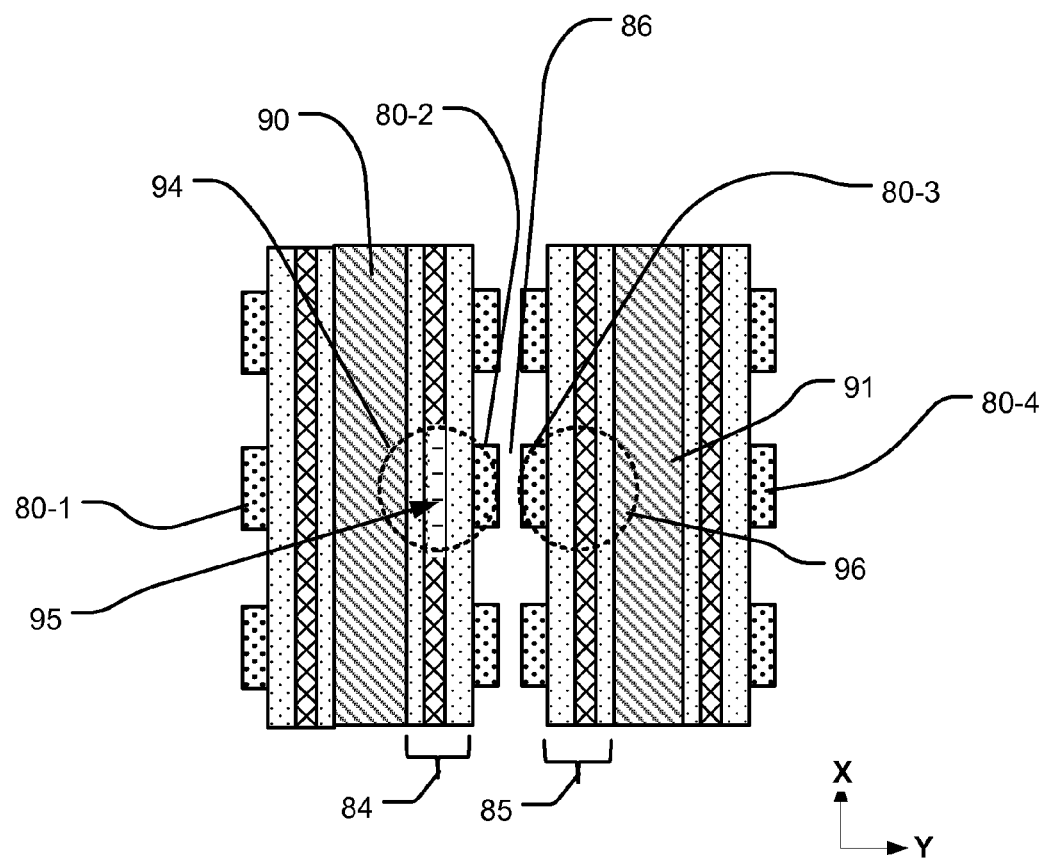
FIG. 6 is a top view of a frustum of an active pillar including memory cells with thin-channel film structures on even and odd sides.

FIG. 6 is a top view taken at the level of word lines 90, 91, which are conductive strips in first and second stacks of conductive strips. FIG. 6 illustrates the memory cell structure at each frustum of the active pillars. The word line 90 is a conductive strip in a stack of conductive strips. The stack of conductive strips has a first side and a second side on which data storage structures (e.g. 84) are disposed. The data storage structures (e.g. 84) are on the sidewalls of the conductive strips in the stack, on both the first and second sides. Referring to the word line 90, a first thin-film semiconductor strip 80-1 is disposed vertically in contact with the data storage structure on the first side. Likewise a second thin-film semiconductor strip 80-2 is disposed vertically in contact with the data storage structure 84 on the second side of the word line 90. Memory cells in the plurality of memory cells have channels in the thin-film semiconductor strips (80-1, 80-2) and gates in the conductive strips that make up the word lines (90).

Also shown in FIG. 6 is a word line 91, which is a conductive strip in a second stack of conductive strips. The second stack of conductive strips has a first side and a second side on which data storage structures (e.g. 85) are disposed. The data storage structures (e.g. 85) are on the sidewalls of the conductive strips in the stack, on both the first and second sides.

Referring to the word line 91, a third thin-film semiconductor strip 80-3 is disposed vertically in contact with the data storage structure on the first side of the word line 91. A fourth thin-film semiconductor strip 80-4 is disposed vertically in contact with the data storage structure on the second side of the word line 91. An insulating structure, which in this illustration consists of a gap 86, separates the second thin-film semiconductor strip 80-2 and the third thin-film semiconductor strip 80-3. In some embodiments, the insulating structure can comprise a solid insulator, such as silicon dioxide, or a combination of a solid insulator and a gap.

In the embodiment illustrated in FIG. 6, an active pillar between two stacks of conductive strips (including word lines 90, 91) consists of the second and third thin-film semiconductor strips in this illustration. In the region of the memory cells (94, 96), the thin-film semiconductor strips are separated into separate semiconductor bodies in which the channels of the memory cells are formed.

As described with reference to other embodiments below, the plurality of stacks of conductive strips can be formed on a reference conductor structure. The reference conductor structure can be a unitary planar conductor underlying a plurality of stacks of conductive strips in some embodiments. In this configuration, the second thin-film semiconductor strip and the third thin-film semiconductor strip which are part of an active pillar, are electrically connected to the reference conductor between the first and second stacks. A single interlayer connector can be used to connect the second thin-film semiconductor strip and the third thin-film semiconductor strip in common to a conductor (such as a global bit line) in an overlying patterned conductor layer for this configuration.

In order to independently program each side of the active pillar, programming bias voltages can be applied independently to word line 90 and word line 91. In order to program the cell 94 on the left side, gate program voltages are applied to the left word line 90, while inhibit voltages are applied to the right word line 91. The vertical channel structures in the active pillars are biased at a suitable level so that the difference between the gate program voltage and the voltage on the vertical channel is sufficient to induce charge trapping in the region 95 of the cell 94, while inhibiting transfer of charge out of the dielectric charge trapping structure in the adjacent cell 96.

Figure 7:
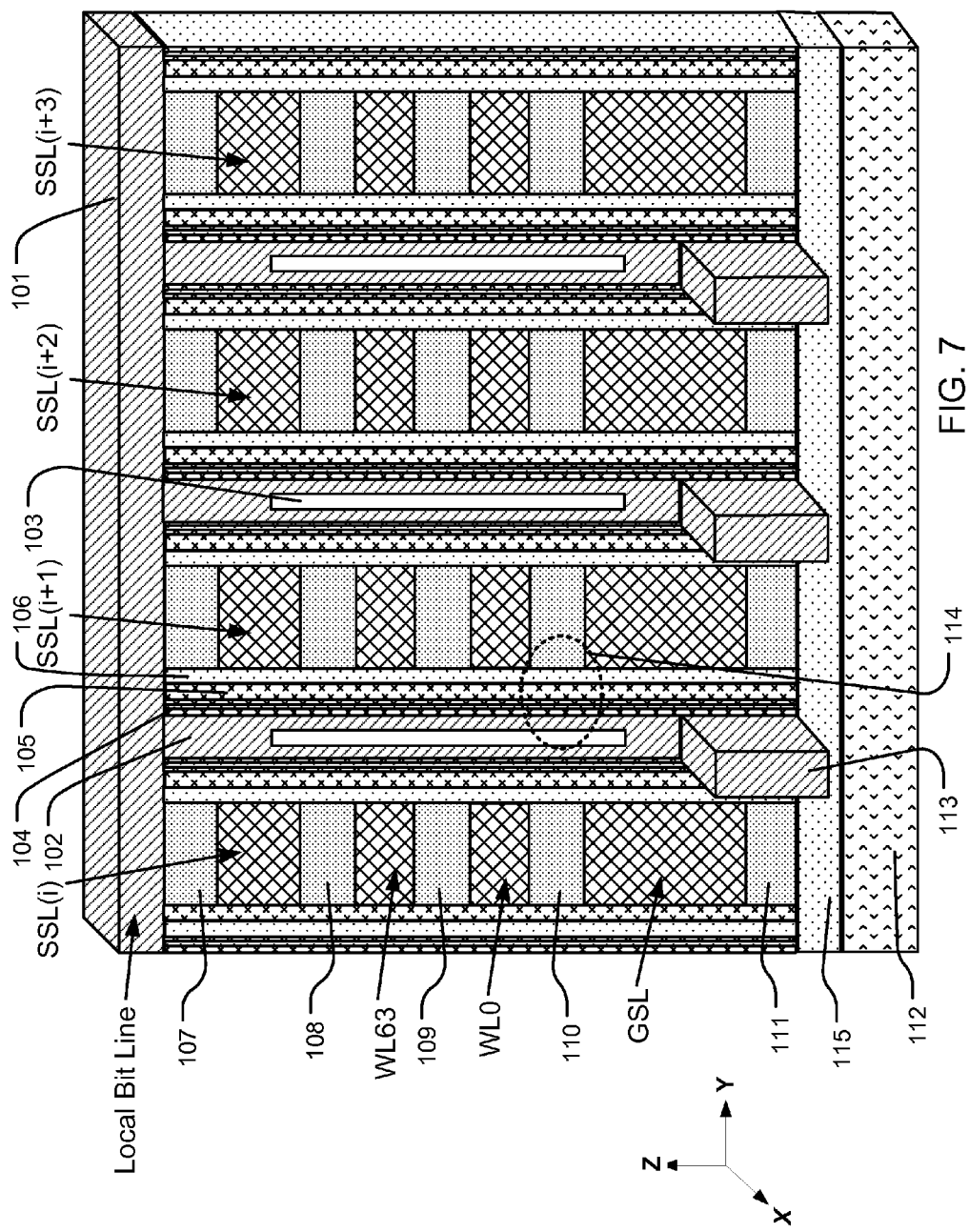
FIG. 7 is a 3D perspective diagram illustrating a row of active pillars including vertical channel structures as described herein.

FIG. 7 illustrates a slice of a 3D block configurable for independent double gate, multiple-bit-per-cell operation, in which NAND strings are disposed on each side of the active pillars as discussed above. The structure includes a local bit line overlying a column of active pillars, including vertical channel structure 102. Each of the active pillars includes a seam (e.g. seam 103). String select lines SSL(i) to SSL(i+3) are disposed in an upper layer of the stack on opposing sides of each active pillar. Independent word lines are also disposed on the opposing sides of the active pillars, in a plurality of layers. This illustration schematically represents 64 word line layers, by the labels WL0 to WL63. Ground select lines GSL are disposed in a lower layer of the active pillars. The string select lines, word lines and ground select lines are separated by insulating layers 107, 108, 109, 110, 111 in this illustration. Insulating layers 107-111 can comprise a selected interlayer dielectric, including silicon dioxide or other materials having higher or lower dielectric constants, or combinations of dielectrics.

Each of the active pillars terminates in a reference line 113 in this example. Alternatively, other reference conductor structures can be implemented. The structure overlies a dielectric layer 115, which in turn overlies the substrate 112. This region of the substrate 112 can be configured as a bottom gate structure, such as by implementing it as an isolated conductively doped well which can be biased as needed. The bottom gate structure can be used to improve the conductivity of the reference lines, if desired.

FIG. 7 illustrates a memory cell 114 in which the data storage structure includes a multilayer tunneling structure 104, a dielectric charge trapping layer 105 and a blocking layer 106. The structures can be formed on the sidewalls of a trench in the word line stack structure, starting with the blocking dielectric layer 106, and ending with the multilayer tunneling structure 104.

Figure 8:
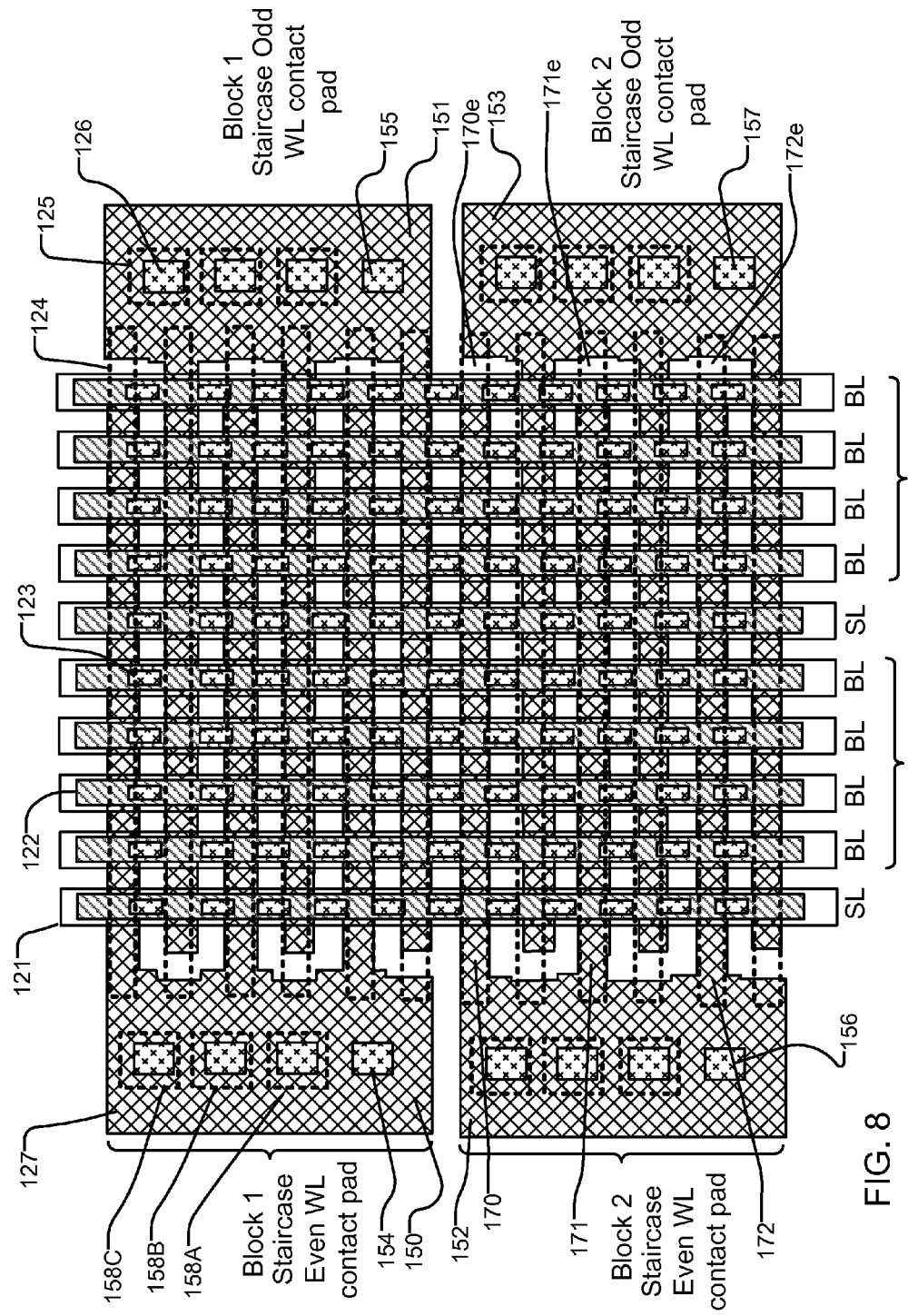
FIG. 8 is a partial layout view showing two blocks of a 3D memory device configured as described herein.

FIG. 8 is a layered layout view showing two blocks of independent double gate vertical channel structures. The layers illustrated include a layer 127 which shows the pattern of the word line structures. A layer 121 shows the pattern of overlying metal lines which are connected to the local bit lines or source lines in the structure. Layer 122 shows the pattern of the local bit lines and local source lines and the structure. The layer 123 illustrates interlayer contacts between the local bit lines and local source lines and the overlying metal lines. The layer 124 shows the layout of the string select lines which are adjacent the vertical channel structures in the active pillars. The layer 125 illustrates openings in the contact landing pads used in the formation of a stairstep contact structure. The layer 126 illustrates the interlayer contacts used in the stairstep structure.

As illustrated, there are two source lines SL in the pattern, and eight bit lines BL. It can be seen therefore that the layout pattern includes bit line structures utilized as source lines for connection to the underlying reference conductor as a source line (like the reference conductor 160 of FIG. 1). The number of source lines used for connection to the underlying reference conductor can be set as suits a particular implementation. Between each of the source line structures, a set of bit lines is used for connection to actual memory cells (like the bit line structures shown in FIG. 1).

The SSL lines are illustrated by the outlines in patterned layer 124. However, the material is removed from this illustration to improve the view of the layout of the word line structures. Therefore, the SSL lines, as can be seen from the outlines, are separate from one another, and overlie the word line structures. Contacts to the SSL lines can be made that are connected to an overlying patterned conductor layer for connection to SSL decoding logic.

Referring to the layer 127, the word line patterns for two blocks, Block 1 and Block 2, in the array structure are shown. Block 1 includes an even word line contact pad 150, and an odd word line contact pad 151. Likewise, Block 2 includes an even word line contact pad 152, and an odd word line contact pad 153. An interlayer connector 154 contacts the pad 150 in a landing area on the pad, and extends to an overlying patterned conductor, which is connected to word line decoding circuitry for the even word lines. Interlayer connector 155 contacts the odd word line pad 151 in a landing area on the pad, and also extends to an overlying patterned conductor which is connected to word line decoding circuitry for the odd word lines.

Referring to the even word line pad 152, openings 158A, 158B, 158C are formed to expose landing areas on the underlying layers of word lines, forming a stairstep contact structure. Also, interlayer conductors extend from the landing areas on the respective contact pads to the overlying decoding circuitry. Corresponding stairstep structures are formed on the other even and odd word line contact pads in the structure.

Referring to the even word line contact pad 152 in Block 2, the conductive strips 170, 171, 172 extend from the contact pad landing areas in a comb-like structure. The end 170e of the conductive strip 170 is separated from the odd word line contact pad 153 for the odd word lines in the block. Likewise, the end 171e of the conductive strip 171 is separated from the odd word line contact pad 153. Finally for this illustration, the end 172e of the conductive strip 172 is separated from the odd word line contact pad 153. An interlayer connector 156 contacts the pad 152 in a landing area on the pad, and extends to an overlying patterned conductor, which is connected to word line decoding circuitry for the even word lines. Referring to the odd word line contact pad 153 in Block 2, a similar pattern is formed, and disposed in an interdigitated manner with the even word lines which extend from the pad 152. An interlayer connector 157 contacts the pad 153 in a landing area on the pad, and extends to an overlying patterned conductor, which is connected to word line decoding circuitry for the even word lines.

This enables the conductive strips acting as even word lines on the left side to be biased independently of the conductive strips acting as odd word lines on the right side.

Figure 9:
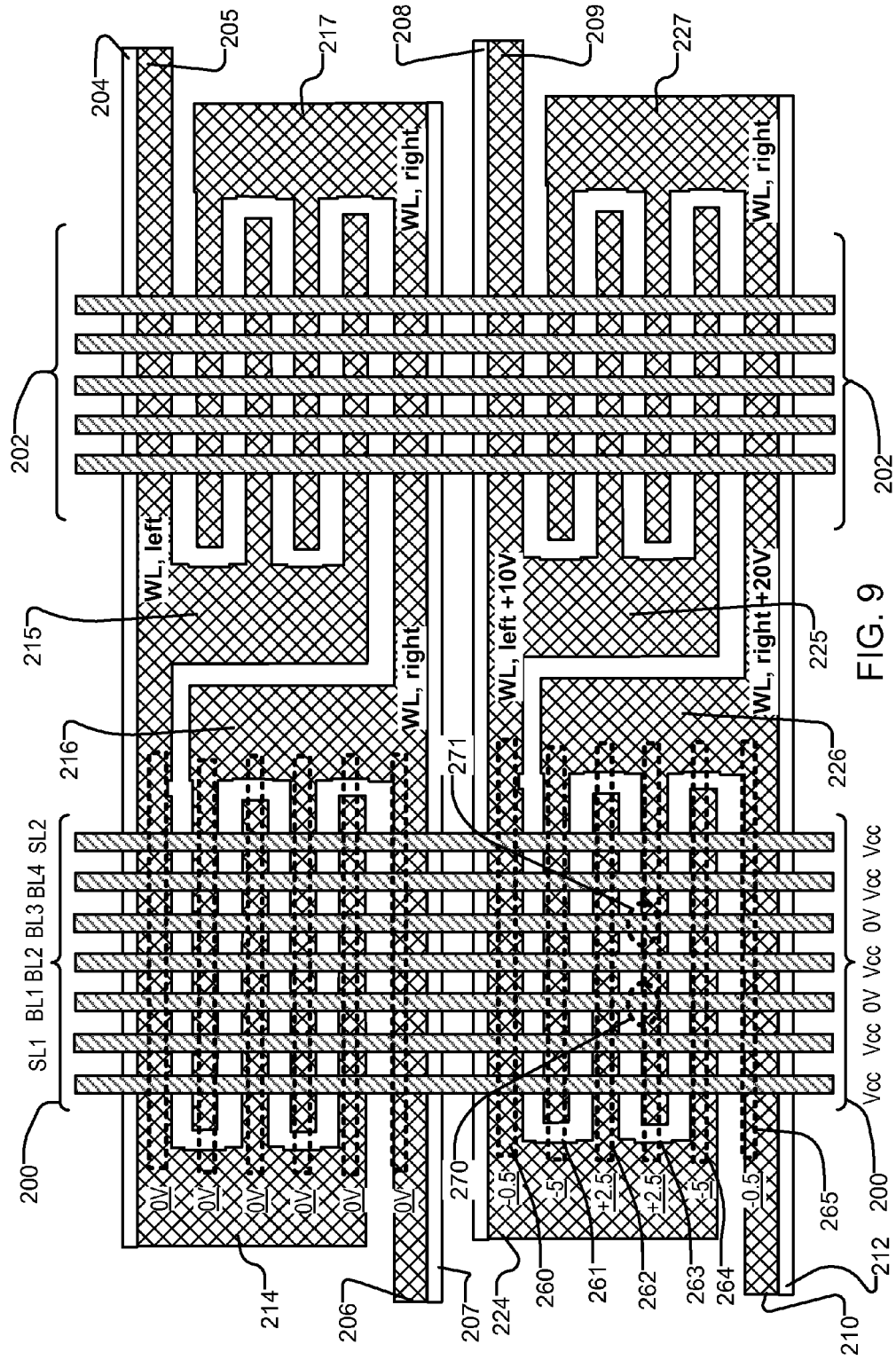
FIG. 9 is a partial layout view showing four blocks of a 3D memory device configured as described herein, and showing a program pulse bias arrangement.

FIG. 9 illustrates the layout of the word line structures, bit line structures, and string select line structures of two columns and two rows of blocks in a 3D array. A first column of blocks 200 between brackets shares the source lines SL1-SL2 and the bit lines BL1-BL4. A second column of blocks 202 between brackets similarly share source lines and bit lines. The numbers of source lines and bit lines are relatively small to simplify the illustration. In some embodiments, there can be 16, 32, 64 or more bit lines interleaved with source lines for every four or eight bit lines, for example. Other configurations can be utilized.

One row of blocks is coupled in common to the horizontal conductor 205 (left word line structure) and the horizontal conductor 206 (right word line structure). Along the sidewalls of the conductors 205 and 206, silicide films 204, 207 or other conductive films can be applied.

The pads 214, 215 extend orthogonally from the conductor 205, and include conductive strips extending therefrom into the memory array structure for their corresponding blocks in comb-like structures as described above. The pads 216, 217 extend orthogonally from the conductor 206, and include conductive strips extending therefrom into the memory array structure for their corresponding blocks in comb-like structures that are interdigitated with the comb-like structures coupled to the conductor 205.

A second row of blocks is coupled in common to the horizontal conductor 209 (left word line structure) and the horizontal conductor 210 (right word line structure). Along sidewalls of the conductors 209, 210, silicide films 208, 212, or other conductive films, can be applied.

Pads 224, 225 extend orthogonally from the conductor 209, and include conductive strips extending therefrom into the memory array structure for their corresponding blocks in comb-like structures as described above. The pads 226, 227 extend orthogonally from the conductor 210, and include conductive strips extending therefrom into the memory array structure for their corresponding blocks in comb-like structures that are interdigitated with the comb-like structures coupled to the conductor 209.

String select lines overlie the conductive strips as discussed above, and are illustrated in outline for the first column of blocks 200. Thus, in the block coupled to the pads 224 and 226, string select lines 260-265 are disposed over corresponding word line structures.

In FIG. 9, bias voltages are illustrated for a programming operation, targeting charge storage sites for cells 270, 271 on one side of an active pillar, which support two physical charge storage sites in each frustum. As can be seen, the charge storage sites for cells 270, 271 are disposed on the side of the right word line structure which receives a high programming potential, while charge storage sites on opposing sides of the active pillar are not programmed because of the lower voltages applied to the left word lines.

Programming operations can be utilized to program one, two, or more, bits per charge storage site, using single-bit-per-cell or multiple-bit-per-cell programming techniques.

The illustrated bias for a program pulse utilized in such a program technique includes a neutral or zero voltage on the string select lines of the upper, unselected block in the first column of block 200, which disconnects the memory cells in the upper block from the overlying bit lines. In the selected block, the two string select lines on opposing sides of a selected active pillar are biased at about +2.5 volts, connecting the active pillar to the overlying bit line. The adjacent string select lines are biased at an inhibit voltage of about −5 V for example, which is sufficient to turn off the string select transistor in adjacent active pillars even in the presence of the 2.5 V on the opposing side. More distant string select lines can be biased at a lesser inhibit voltage, such as about −0.5 V decoupling them from their corresponding bit lines. The selected word line, in this example the right conductor 210, can be biased at a high program pulse, such as about +20 V or other level as suitable for the particular stage of the programming operation. The unselected word line in the same block, conductor 209 in this example, can be biased at a lower voltage insufficient to cause programming, such as about +10 V. This voltage can match the pass voltage applied to unselected layers in this block, and can enable channel boosting to prevent program disturb.

Bit lines coupled to the selected charge storage sites for cells 270, 271, can be biased at a low voltage, such as about 0 V to support a programming field in combination with the high voltage applied to the word lines. The source lines SL1 and SL2 can be coupled to the supply potential, to apply VCC to the source end of the NAND strings being accessed.

Bit lines coupled to unselected charge storage sites can be coupled to the supply potential about VCC to inhibit current flow in the unselected active pillars, allowing boosting of unselected active pillars to inhibit program disturb.

The word lines for unselected blocks in the first row coupled to the conductors 206 and 205 can be left floating.

The block in the second row coupled to the conductors 209 and 210, and in the second column of blocks 202, can be biased for programming as well.

Table 1 illustrates a representative program bias arrangement which can be adapted to a given embodiment by empirical testing, by simulation, or by both. The array with this architecture can be biased to program only one side of each active pillar at a time. This enables the use of both sides of each active pillar at each layer to store data, with multiple bits per side.

TABLE 1

| PROGRAM BIAS | |
| --- | --- |
| SELECTED WL(N)_even: | Vprog (ISPP, e.g. 18 to 22 V) |
| OPPOSITE SIDE WL(N)_odd | Vpass, pgm (e.g. +10 V) |
| OTHER WLs: (other layers, even and odd) | Vpass, pgm (e.g. +10 V) |
| GSL: | Vpass, pgm (e.g. +10 V) |
| SELECTED BLs: | Vsense (e.g. 0 V) |
| UNSELECTED BLs: | Vref (e.g. 3.3 V) |
| Local SLs: | Vref (e.g. 3.3 V) |
| SELECTED SSL(i): | Von (e.g. +2.5 V) |

TABLE 1-continued

PROGRAM BIAS

| | |
|---|---|
| SELECTED SSL(i + 1): | Von (e.g. +2.5 V) |
| ADJACENT SSL(i − 1): | Vsuppress (e.g. −5 to −8 V) |
| ADJACENT SSL(i + 2): | Vsuppress (e.g. −5 to −8 V) |
| FAR SSLs: | Voff (e.g. −0.5 V) |

In one example, the programming algorithm can be an incremental stepped pulse programming sequence ISPP, with increasing pulse height and program verify steps being executed until desired threshold levels are satisfied. In other systems, a single pass, multilevel program operation can be applied, such as described in co-pending and commonly owned U.S. patent application Ser. No. 14/153,934, entitled PROGRAMMING MULTIBIT MEMORY CELLS; by Hsieh et al., filed on 13 Jan. 2014 (now US Pat. Pub. No. 2014/0198570), which application is incorporated by reference as if fully set forth herein. One example process, executed by the controller to operate a multiple-bit-per-cell memory, comprises storing a data set for programming a plurality of multi-level memory cells in a page buffer, the data set indicating one of a plurality of program states or an inhibit state for each memory cell in the plurality, where the plurality of program states correspond to a corresponding plurality of target program levels for the multi-level memory cells. For the data set, the method includes executing a plurality of program cycles for the plurality of multi-level memory cells, wherein a program cycle in the plurality of program cycles includes applying a program bias to multi-level memory cells in the plurality of program states, and after applying the program bias applying program verify steps for more than one of the plurality of program levels to change the data set program states to the inhibit state for the multi-level memory cells in the plurality which pass verify at the indicated target program level. The data set can be applied in each cycle in the one-pass, multiple-level operation to determine inhibit and program states for the selected cells.

Table 2 illustrates a representative erase bias arrangement which can be adopted to a given implementation by empirical testing, by simulation, or by both. A block erase bias can be applied in a periodic array that includes a plurality of cell blocks such as that illustrated in FIG. 9.

TABLE 2

ERASE BIAS

| | |
|---|---|
| ALL WLs selected block: | Vref (e.g. 0 V) |
| ALL WLs unselected blocks: | Floating |
| ALL BLs: | Verase(e.g. +20 V) |
| ALL Local SLs: | Verase (e.g. +20 V) |
| ALL SSLs: | Vgidl (e.g. +6 V) |

Figure 10:
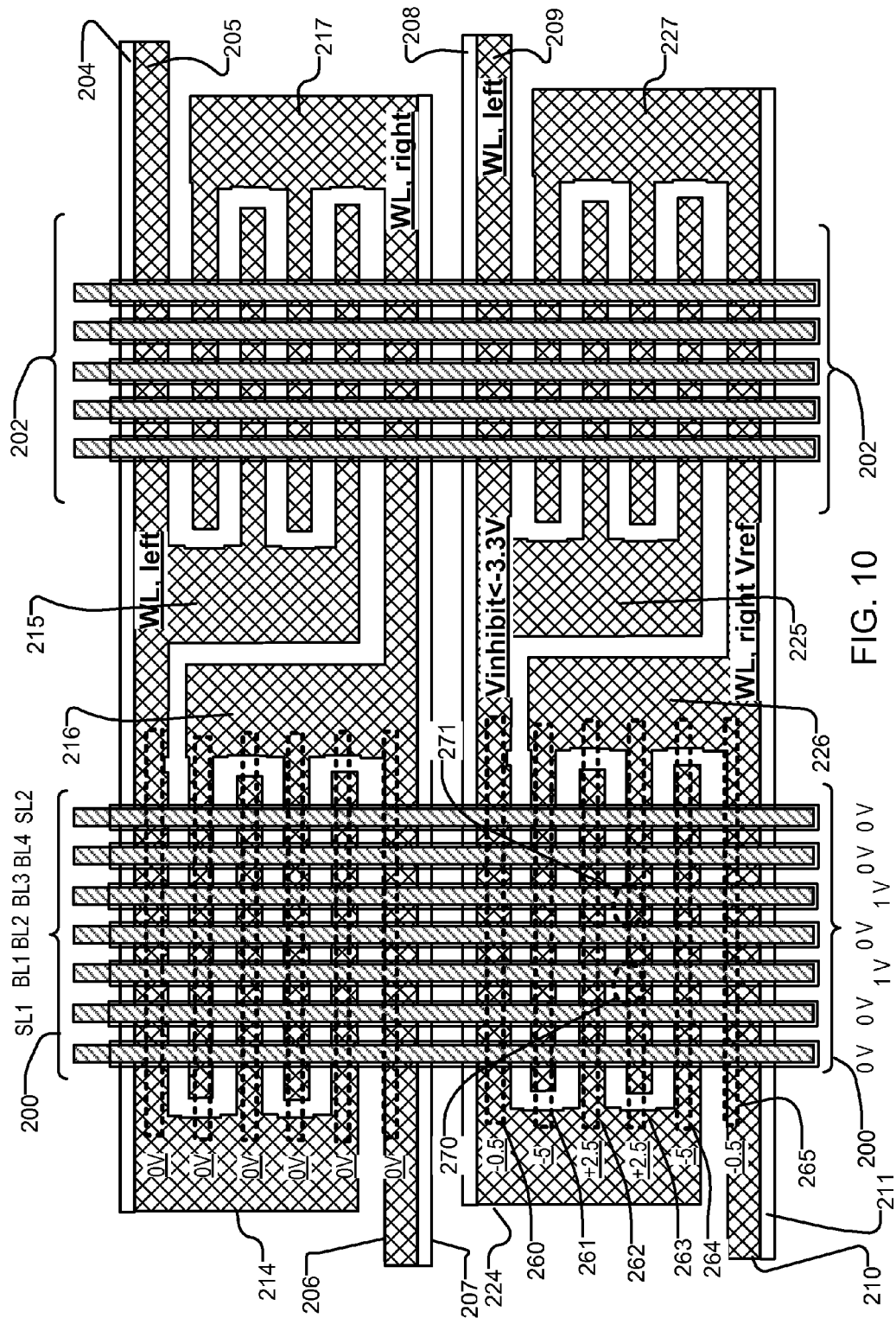
FIG. 10 is a partial layout view showing four blocks of a 3D memory device, as in FIG. 9, and showing a read pulse bias arrangement.

FIG. 10 illustrates the layout also shown in FIG. 9, with the same reference numerals. In FIG. 10, however, the bias voltages are illustrated for a read operation for the cells 270, 271 in a multiple-bit-per-cell, independent double gate structure.

The bias voltages for the string select lines are the same as used for programming. The bias voltages for unselected bit lines BL2 and BL4 and for the source lines SL1 and SL2 are about 0 V. The bias voltage for selected bit lines BL1 and BL3 is about one volt.

The bias voltage applied to the right side word line structure is the read voltage Vref. In unselected layers of the structure, the right side word line voltage will be a pass voltage. The bias voltage applied to the left side word line structure is an inhibit voltage of about −3.3 V for example.

In the deselected blocks, the word lines are left floating and the string select lines and ground select lines are turned off.

Table 3 illustrates a representative read bias arrangement.

TABLE 3

READ BIAS

| | |
|---|---|
| SELECTED WL(N)_even: | Vread (set for threshold states) |
| OPPOSITE SIDE WL(N)_odd | Vinhibit (e.g. −3.3 V) |
| OTHER WLs: (other layers, even and odd) | Vpass, read (e.g. +6 to +7 V) |
| GSL: | Vpass, read (e.g. +6 to +7 V) |
| SELECTED BLs: | Vsense (e.g. +1 V) |
| UNSELECTED BLs: | Vref (e.g. 0 V) |
| Local SLs: | Vref (e.g. 0 V) |
| SELECTED SSL(i): | Von (e.g. +2.5 V) |
| SELECTED SSL(i + 1): | Von (e.g. +2.5 V) |
| ADJACENT SSL(i − 1): | Vdeplete (e.g. −5 to −8 V) |
| ADJACENT SSL(i + 2): | Vdeplete (e.g. −5 to −8 V) |
| FAR SSLs: | Voff (e.g. −0.5 V) |

Note that for each page, only half of the global bit lines are utilized. To sense the data in the other half of the global bit lines, the two adjacent pages on the same word line must be accessed sequentially using this bias arrangement. Since the even/odd word lines each contact one side of two of the active pillars, the read method illustrated reads only the stored charge on one side of the selected word lines. In this way, each side of the cell in a selected active column can be accessed separately, establishing two charge storage sites at each frustum of each pillar. Each of the two charge storage sites can store more than one bit, such as two bits per side. In this manner, the cells at each frustum of each pillar store four or more bits of data. This can result in a very high density memory array.

Figure 11:
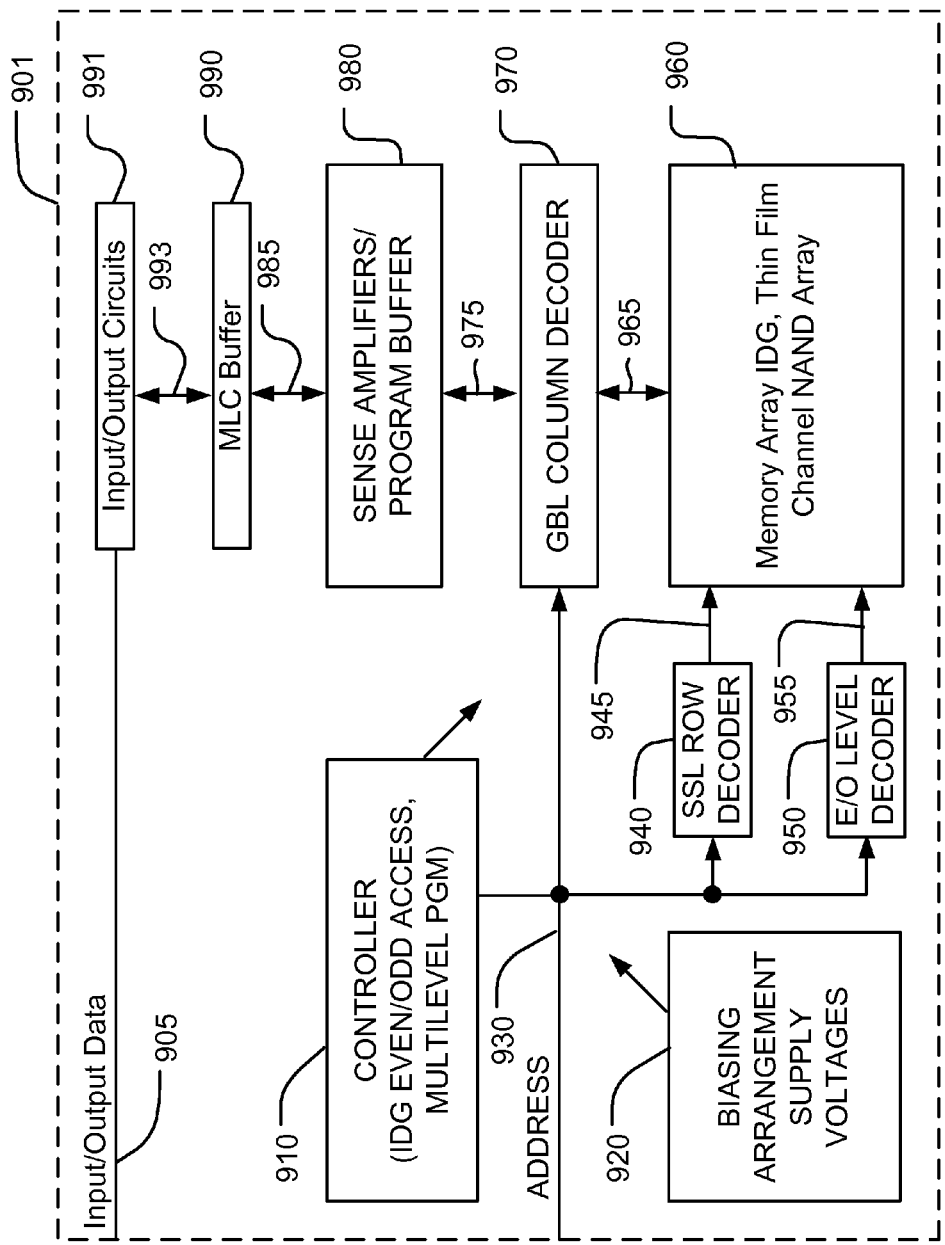
FIG. 11 is a block diagram of an integrated circuit memory including a 3D memory array having thin-channel film structures.

FIG. 11 is a simplified chip block diagram of an integrated circuit 901 including a 3D, vertical thin-channel film NAND array. The integrated circuit 901 includes a memory array 960 including one or more memory blocks as described herein with independent double gate, vertical channel cells, having multiple bits per cell on an integrated circuit substrate.

An SSL decoder 940 is coupled to a plurality of SSL lines 945, arranged in the memory array 960. An even/odd level decoder 950 is coupled to a plurality of even/odd word lines 955. A global bit line column decoder 970 is coupled to a plurality of global bit lines 965 arranged along columns in the memory array 960 for reading data from and writing data to the memory array 960. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 11, control logic 910, using a bias arrangement state machine, controls the application of supply voltages generated or provided through the voltage supply or supplies in block 920, such as read, erase, verify and program bias voltages. The control logic 910 is coupled to the multi-level buffer 990 and the memory array 960. The control logic 910 includes logic to control multiple-level program operations. In embodiments supporting the independent double gate vertical NAND structures described herein, the logic is configured to perform the method of:

selecting a layer of memory cells in the array, such as using a word line layer decoder;

selecting a vertical thin channel on a side of the vertical channel structures in the selected layer such as by selecting an even or odd side word line structure;

selecting vertical thin channel on a vertical channel structures in a selected row in the array such as by using SSL switches on the rows of vertical channel structures; and storing charge in charge trapping sites in the selected layer on the selected vertical thin channel on a side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages $V_T$. As mentioned above, single-bit-per-cell embodiments can include the structures described herein.

Figure 12:
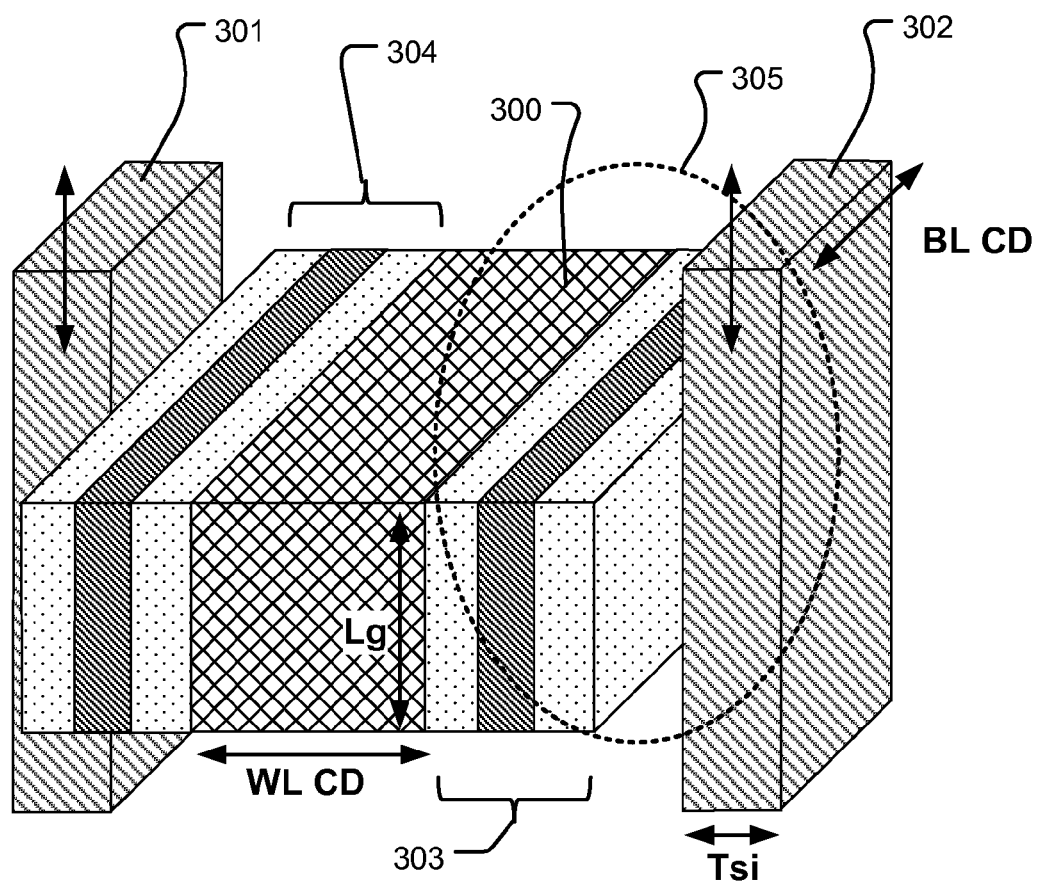
FIG. 12 is a perspective view of thin film vertical channel structures which can be used to form a 3D array as described herein.

FIG. 12 illustrates the structure implementing two vertical thin channel flash memory cells with a shared word line implemented by a horizontal conductive strip 300. Data storage structure 304 is disposed on the left side of the horizontal conductive strip 300. Data storage structure 303 is disposed on the right side of the horizontal conductive strip 300. A thin-film semiconductor strip configured as first vertical channel film 301 is disposed over the data storage structure 304 on the left side of the conductive strip 300. A thin-film semiconductor strip 302 configured as second vertical channel film is disposed over the data storage structure 303 on the right side of the conductive strip 300.

As result of the structure, memory cell 305 is formed on the right side. A similar memory cell structure is formed on the left side. The gate of the memory cell 305 is disposed in the strip 300, and the channel of the memory cell 305 is disposed in the vertical thin-film semiconductor strip 302. Thus, the vertical arrows on the thin-film semiconductor strips represent the direction of current flow in the memory structure.

The horizontal conductive strip 300 has a width labeled WL CD in the figure, for word line critical dimension. This width is "critical" for the purposes of determining the area, or density, of the layout of an array of cells. The WL CD can be determined in some manufacturing processes by an etching pattern used to form a plurality of stacks of conductive strips as described below. The vertical channel film (strip 302) has a width labeled BL CD in the figure, for bit line critical dimension. This width is "critical" also for the purposes of determining the area, or density, of the layout of an array of cells. The BL CD can also be determined in some manufacturing processes by an etching pattern used to form the plurality of thin-film semiconductor strips.

The horizontal conductive strip 300 also has a dimension labeled Lg, for length of gate. The length of the gate, or gate length, is an important parameter for determining performance of a flash memory cell. The Lg can be determined in some manufacturing processes by a thickness of a deposited layer of conductive material used to form the conductive strips.

The vertical channel film (strip 302) has a dimension labeled Tsi, for thickness of silicon. This label assumes that the semiconductor material used to form the thin-film strip is silicon Si. Other semiconductor materials can be utilized. In embodiments of the technology described herein dimension Tsi can be determined by the thickness of a deposited layer of the material.

The dimension Tsi in the structure can be 10 nm or less. For the purposes of this description, a vertical channel film formed using a thin-film semiconductor strip has a thickness in the Tsi dimension 10 nm or less, at least in the regions of the memory cells.

Figure 13:
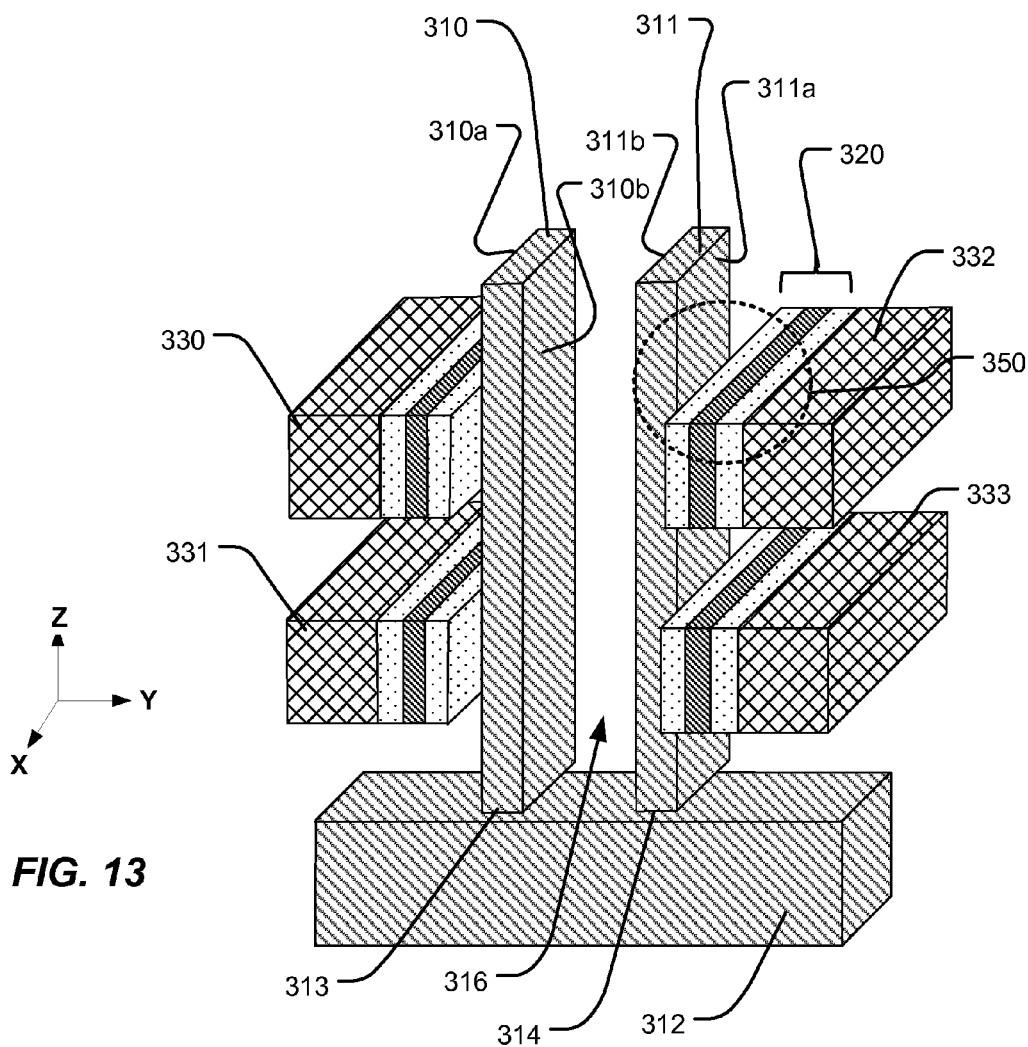
FIG. 13 is a perspective view of a stack of conductive strips including sidewalls having memory cells with thin-channel films on opposing sidewalls.

FIG. 13 illustrates aspects of one embodiment of a memory structure as described herein. The embodiment illustrated in FIG. 13 includes a vertical channel structure comprising a semiconductor film 310 and a semiconductor film 311 having outside surfaces 310a, 311a and inside surfaces 310b, 311b. The outside surfaces 310a, 311a are disposed on data storage structures (e.g. 320) on the sidewalls of corresponding stacks of semiconductor strips. Thus, an even side stack of semiconductor strips includes strip 330 and strip 331 in this illustration, which can be configured as word lines. An odd side stack of semiconductor strips includes strip 332 and strip 333 in this illustration which can be configured as word lines. Memory cells (e.g. 350) in the structure reside at the cross points of the semiconductor films 310, 311 and the semiconductor strips 330, 331, 332, 333.

In the embodiment illustrated in FIG. 13, the semiconductor film 310 and the semiconductor film 311 extend to a reference conductor 312, with electrical contact at the lower ends 313, 314 of the films.

The semiconductor films 310, 311 are separated by a gap 316, or other type of insulating structure, at least in the regions of the memory cells.

The semiconductor films are preferably thin films, which as used herein refers to films having thicknesses in the regions of the memory cells 10 nm or less.

Figure 14:
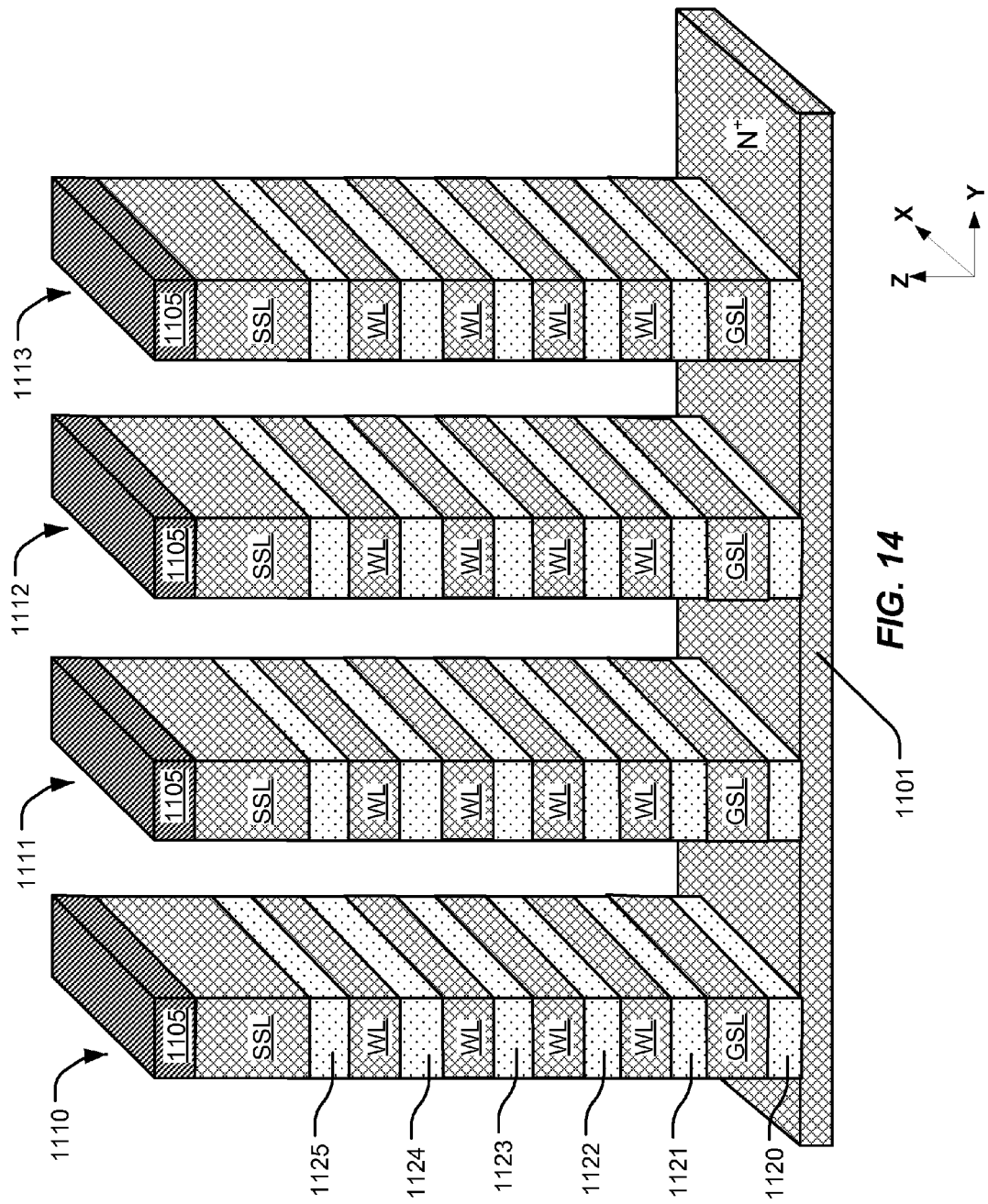
FIGS. 14-27 illustrate structures during manufacturing stages for a 3D NAND as described herein.

FIGS. 14 through 27 illustrate an example process flow for a vertical thin-channel film structure. FIG. 14 illustrates a stage of the process flow after forming reference conductor 1101 which comprises a unitary conductive element, such as a doped region which can be a relatively heavily n-type doped N+ region, in a semiconductor substrate, or other type of conductive material, such as a layer of doped polysilicon or metal, on a substrate. The reference conductor 1101 is unitary in this embodiment in the sense that it is a single conductor which underlies a block of memory cells and can be used as a common reference conductor, such as a reference conductor as used in NAND structures. The single conductor is rectangular in this example, but can be patterned as desired in a particular embodiment.

To form the structure shown in FIG. 14, a plurality of layers of a first conductive material, such as doped polysilicon, or other material suitable for use as word lines, separated by layers of insulating material are disposed over the reference conductor 1101. In embodiments described herein, the conductive material can be a heavily p-type doped polysilicon (P+ polysilicon) or other material selected for compatibility with the data storage structure. A layer of silicon nitride which can be used to provide tensile stress, is deposited over a top layer, in this example. This layer can improve the uniformity of the stacks and reduce bending, when they are etched with high aspect ratios and narrow lines. An insulating layer separates the reference conductor 1101 from the layers of conductive material. The layers of insulating material can comprise silicon dioxide deposited in a variety of ways as known in the art. Also, the layers of insulating material can comprise other insulating materials, and combinations of insulating materials. In this example, all of the insulating layers, with the exception of the top layer 1105, consist of the same material. In other examples, different materials can be used in different layers as suits a particular design goal. After the plurality of layers is formed, a patterned etch is applied to form a plurality of stacks of conductive strips.

FIG. 14 illustrates a stage of the process after etching the plurality of layers, and stopping at the reference conductor 1101, to define a plurality of stacks of conductive strips, including stacks 1110, 1111, 1112 and 1113. The stacks 1110, 1111, 1112 and 1113 include at least a bottom plane (GSL) of conductive strips, a plurality of intermediate planes (WLs) of conductive strips, and a top plane of conductive strips (SSLs). The plurality of intermediate planes can include N planes, ranging from 0 to N−1 for the stack. A top layer 1105 of silicon nitride is disposed on each stack. Although not shown, the conductive strips are linked by pads which can be defined in the pattern used for etching the stacks. The stacks 1110, 1111, 1112 and 1113 include layers of insulating material 1120, 1121, 1122, 1123, 1124, 1125 as labeled in stack 1110, separating the conductive strips from one another, and from the reference conductor 1101.

Figure 15:
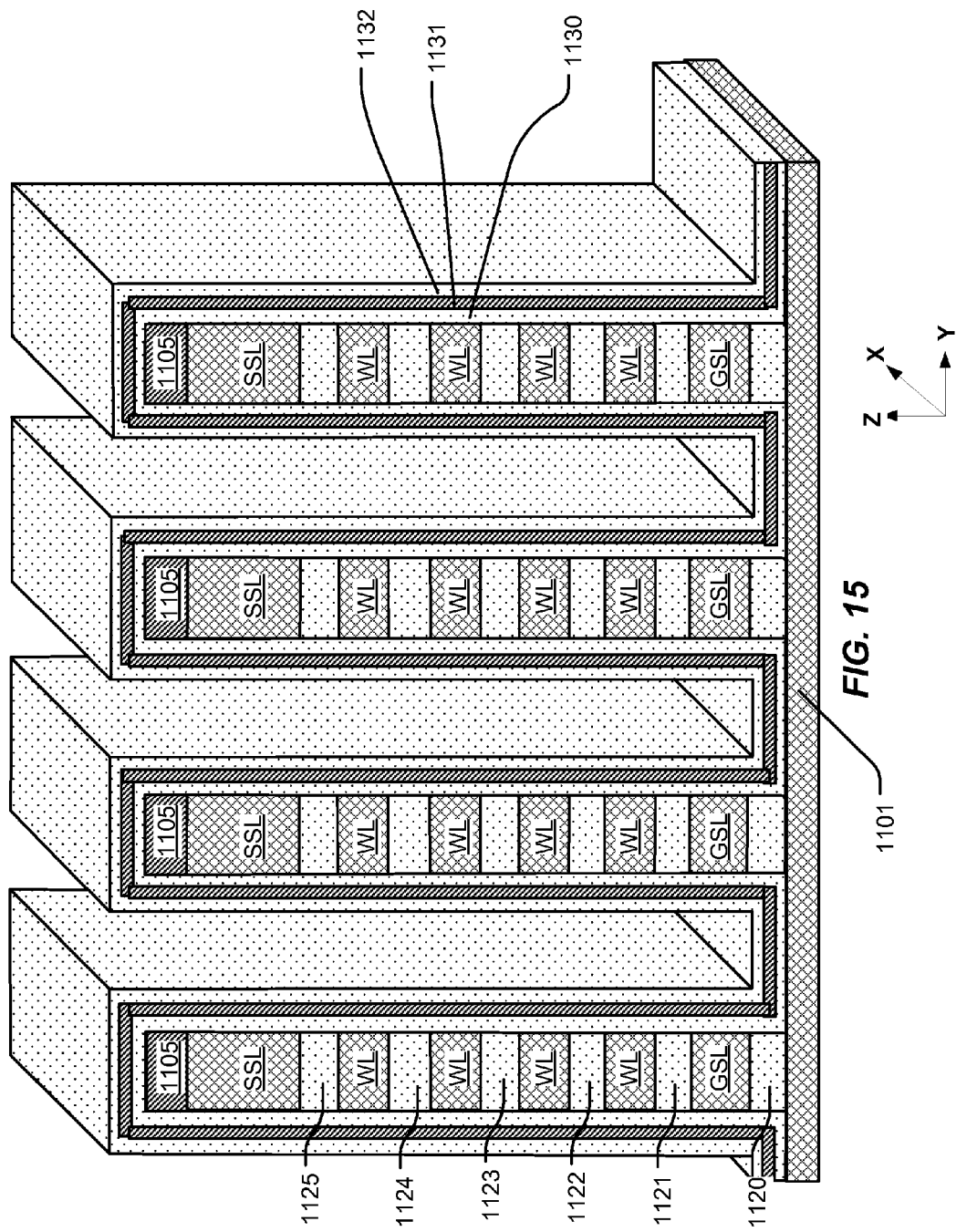

FIG. 15 illustrates a stage of the process flow after forming a memory layer over and on sides of conductive strips in the plurality of stacks. The memory layer contacts side surfaces of the plurality of conductive strips. The memory layer can comprise a multilayer data storage structure, as illustrated including a tunneling layer 1132, a charge storage layer 1131, and a blocking layer 1130, examples of which are discussed above. In one preferred example, the memory layer is implemented as illustrated below with reference to FIG. 35.

Figure 16:
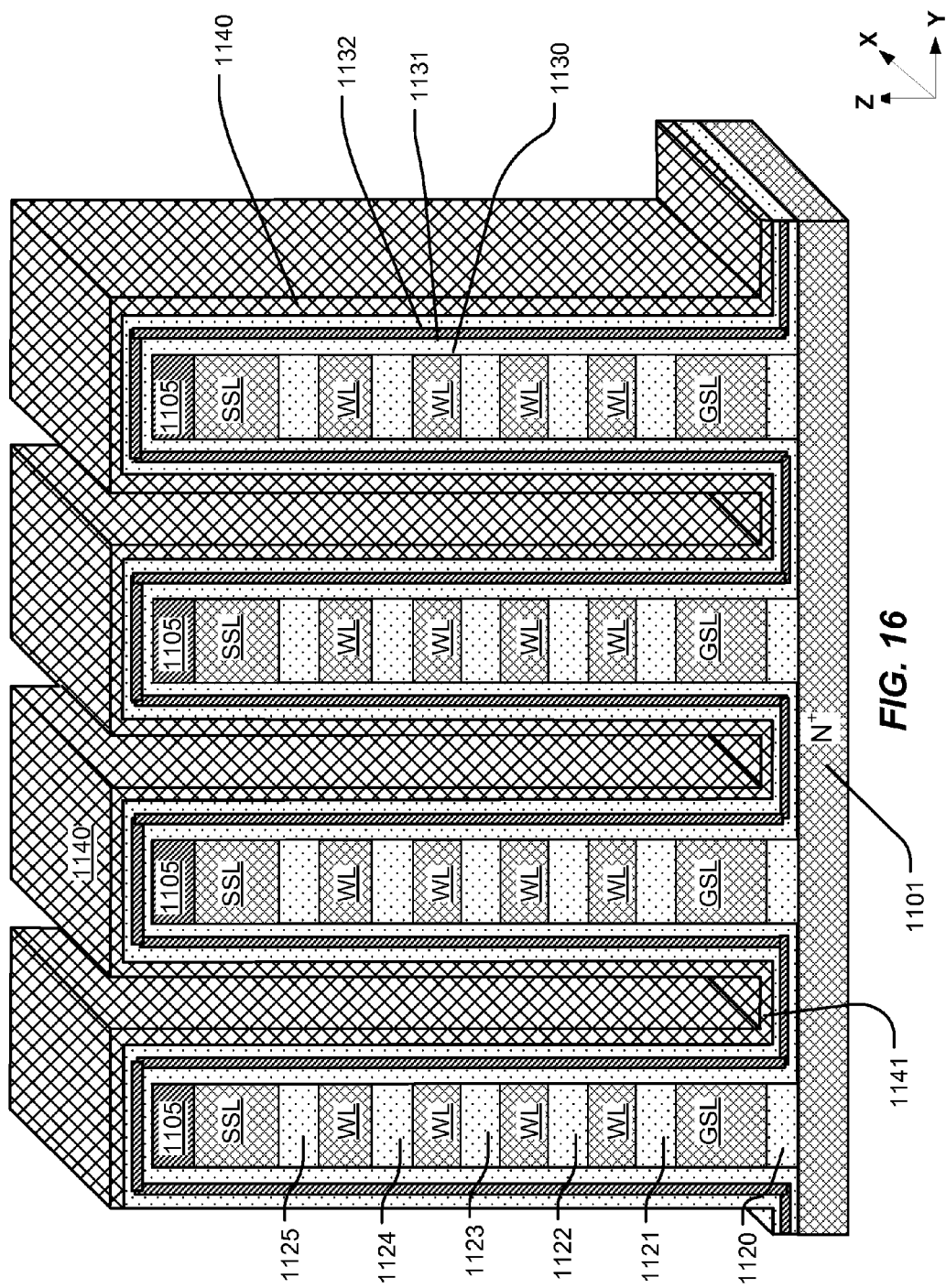

FIG. 16 illustrates a stage of the process flow after forming a thin layer 1140 of a semiconductor material over, and having a surface conformal with, the memory layer on the plurality of stacks. In the dielectric charge storage embodiment, the thin layer 1140 contacts the tunneling layer 1132 at least in the regions in which memory cells are being formed. The semiconductor material in layer 1140 comprises a semiconductor adapted by choice of material, e.g. silicon, and doping concentrations (e.g. undoped or lightly doped) to act as channel regions for vertical strings of memory cells, at least in the regions between the stacks. The thin layer 1140 can have a thickness of about 3 to 5 nanometers, for example. As illustrated, in the regions 1141 between the stacks, the thin layer 1140 extends to the bottom of the trenches between the stacks, and overlies the dielectric layers 1130, 1131, 1132.

Figure 17:
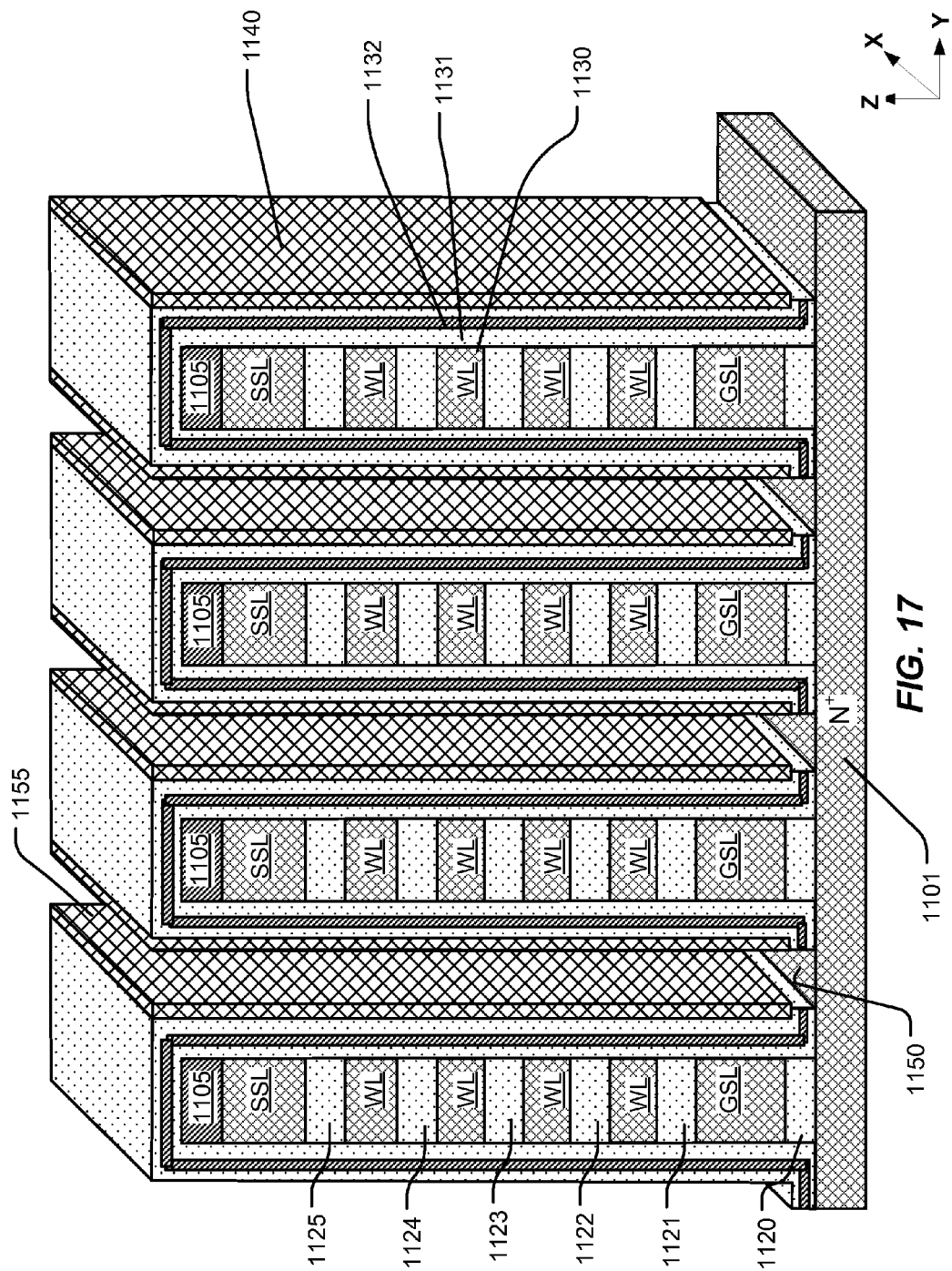

FIG. 17 illustrates a stage of the process flow after applying a spacer etch to the thin layer 1140. A spacer etch uses anisotropic etching technology to remove the thin layer 1140 on horizontal surfaces, while leaving the vertical surfaces. The spacing between the stacks should be sufficient to allow spacer etch to form spacers (e.g. layer 1155) on the sidewalls of the stacks that comprise semiconductor material. The spacers provide an etch mask for etching through the memory layer (dielectric layers 1130, 1131, 1132) and expose the reference conductor 1101 in the bottom 1150 of the trench between the stacks of conductive strips.

Figure 18:
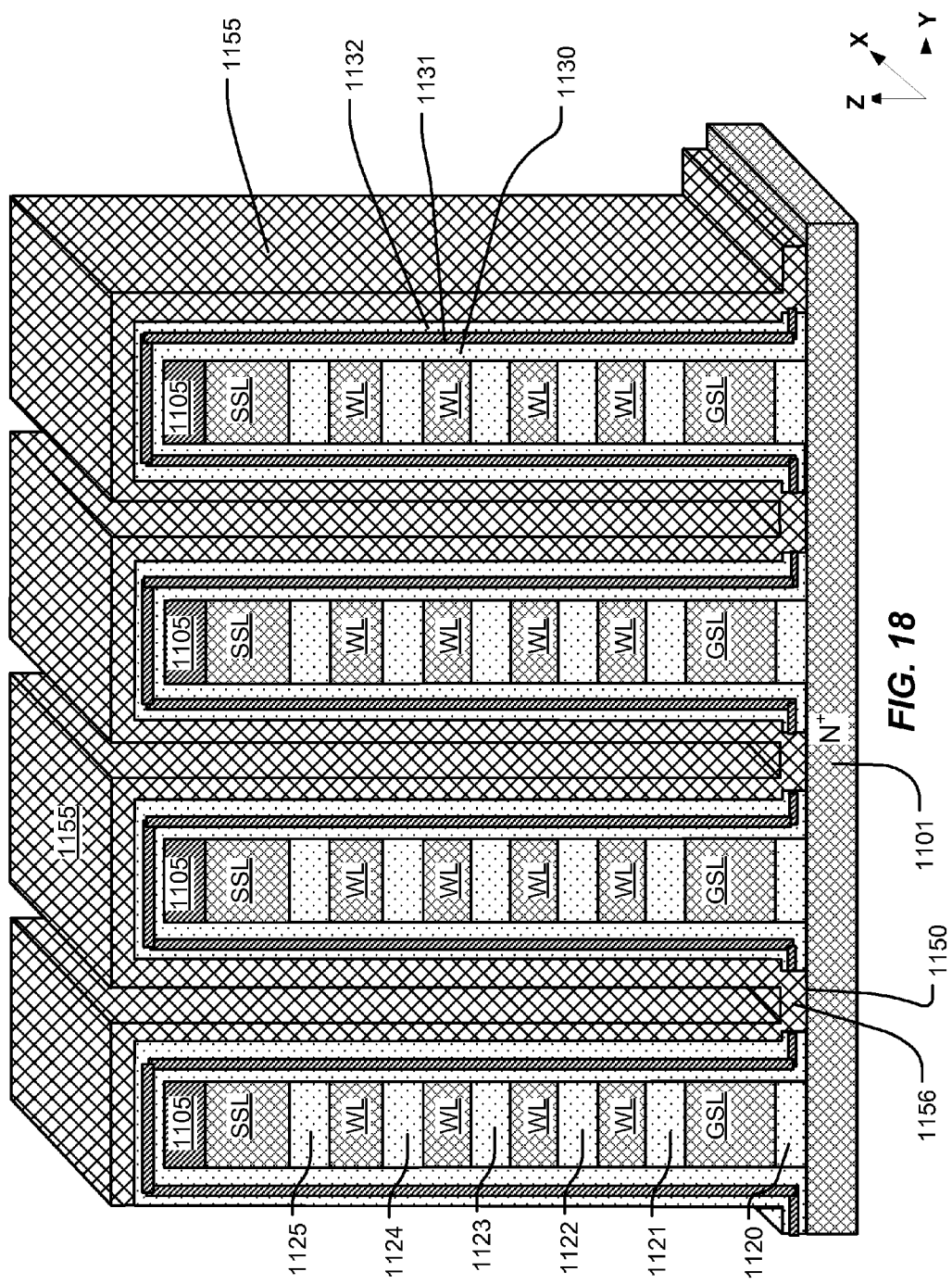

FIG. 18 illustrates a stage in the process flow after building a layer of semiconductor material to act as thin film vertical channels. In one example process flow, this layer can be built by applying a step to clean the surface of the reference conductor 1101 in the bottom 1150 of the trenches, followed by deposition of a second thin layer of semiconductor material, adding about 3 to 5 nm thickness on to the spacers (e.g. layer 1155 in FIG. 17). Then, the spacers and the added layer are merged by a thermal anneal to form a thin film semiconductor layer 1155 which covers the stacks as illustrated, including the sidewalls and the top surfaces. In addition, the thin film semiconductor layer 1155 is continuous across the width of the trench in the region 1156, and contacts the surface of the reference conductor 1101 in the region 1156, or is otherwise formed in electrical communication with the reference conductor 1101.

The thin film semiconductor layer 1155 in embodiments implementing thin-channel memory cells is a silicon material, such as polysilicon, having a thickness 10 nanometers or less in the regions of the memory cells. A vertical thin channel film as used herein, is a semiconductor film less than 10 nm thick in the channel regions of the memory cells.

Figure 19:
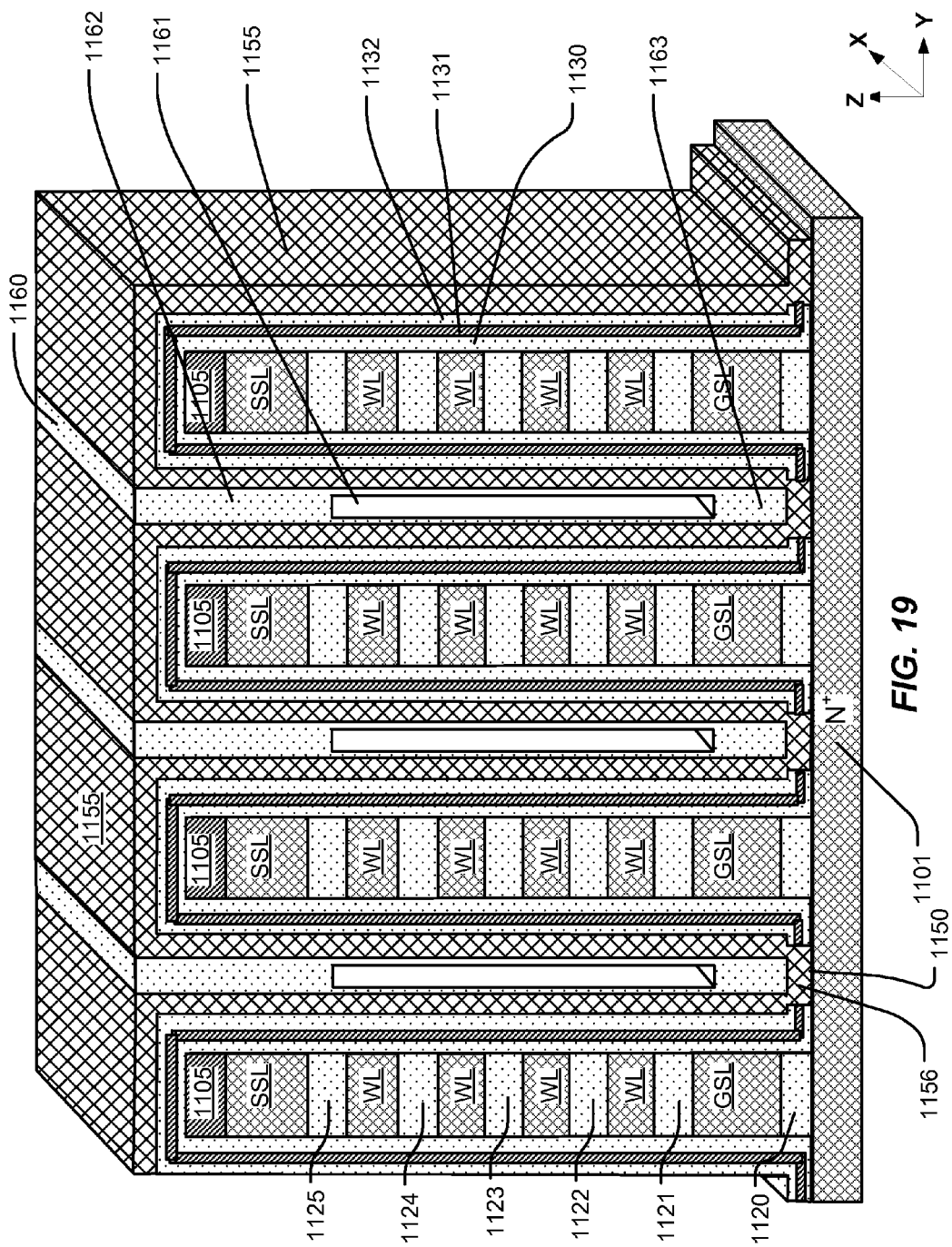

FIG. 19 illustrates a stage in the process flow after performing a step to fill between stacks on the inside surfaces of the thin film semiconductor layer 1155 with an insulating material such as silicon dioxide. After the fill step, an etch back or planarizing step such as chemical mechanical polishing can be applied to expose the top surface of the thin film semiconductor layer 1155. In the illustrated example, the fill 1160 includes gaps (e.g. 1161) in the regions of the memory cells. In the regions (e.g. 1162) adjacent the conductive strips in the top layer which can be used for string select lines, and in the regions (e.g. 1163)

adjacent the conductive strips in the bottom layer which can be used for ground select lines, the oxide material can completely fill the regions between the stacks. In other embodiments, an insulating liner can be formed which leaves a gap throughout the entire stack.

Figure 20:
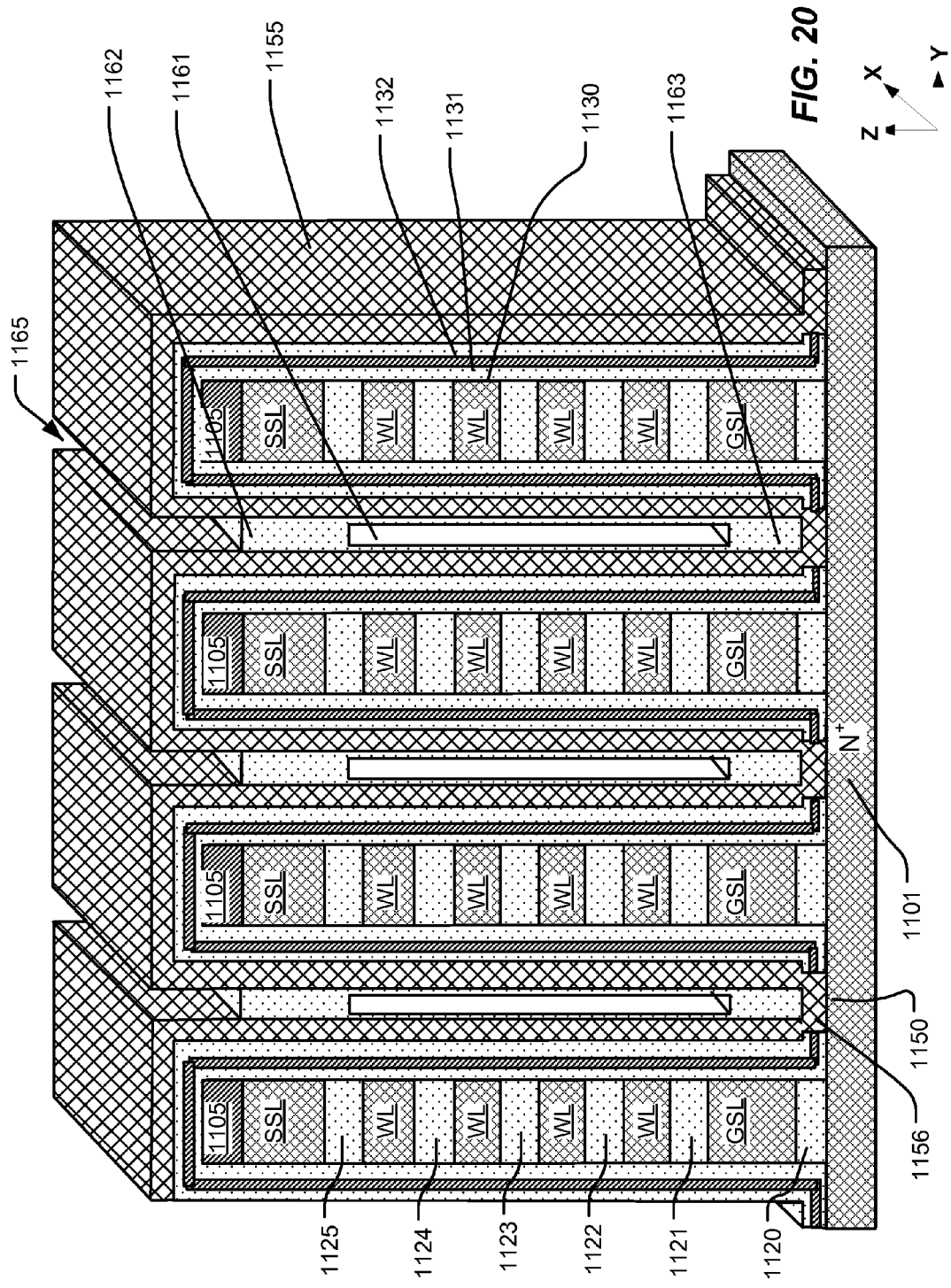

FIG. 20 illustrates a stage in the process flow after applying a process to form a recess 1165 in the fill 1160. The recess can be formed using a selective timed etch for example.

Figure 21:
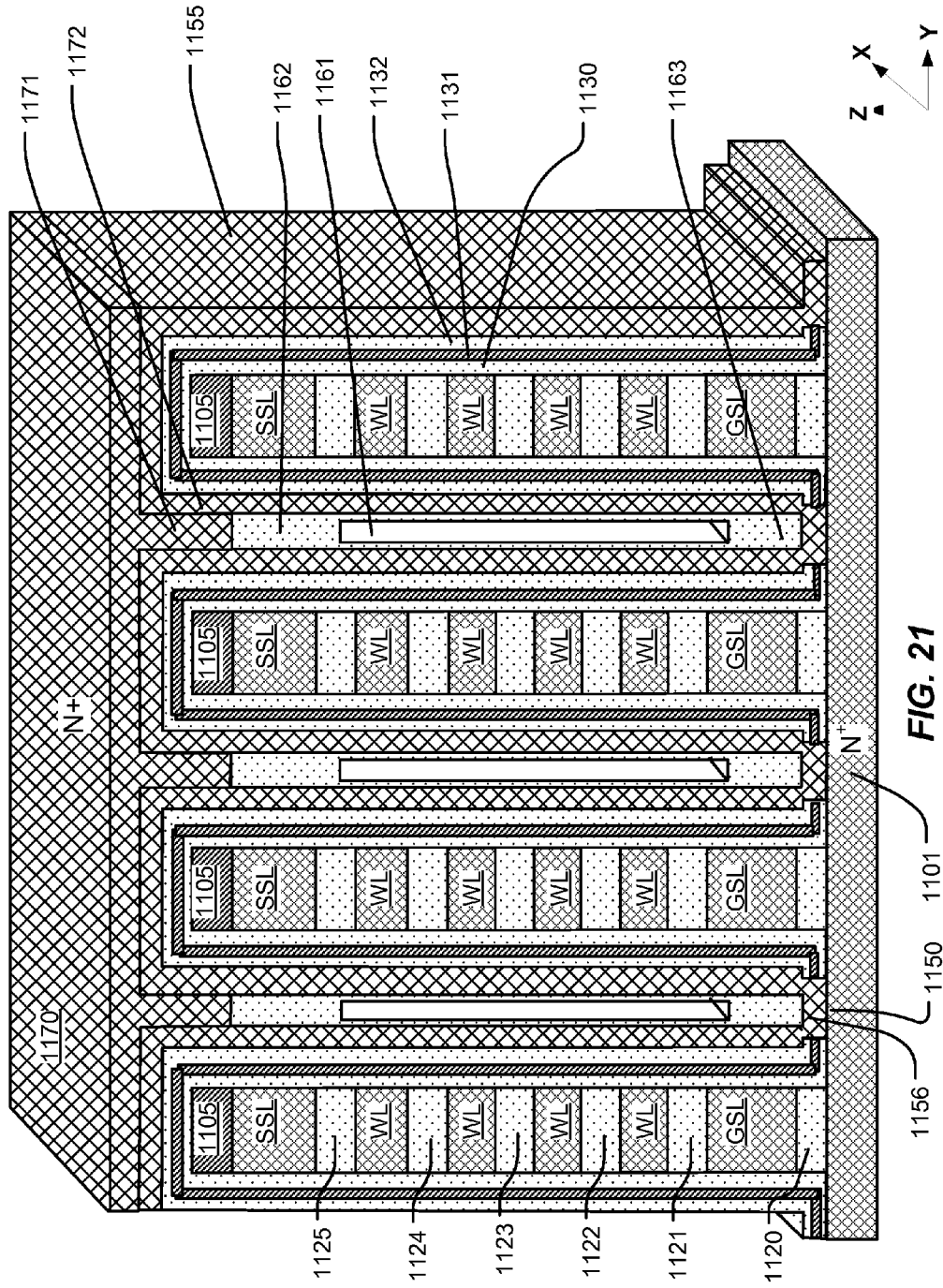

FIG. 21 illustrates a following stage in the process, after forming a layer 1170 of conductive material, such as conductively doped polysilicon (e.g. N+ polysilicon). The conductive material is chosen for compatibility with the thin film semiconductor layer 1155, and forms extensions (e.g. 1171) filling the recesses (e.g. 1165 shown in FIG. 20). The extensions 1171 form an electrical contact with the thin film semiconductor layer 1155 in the region 1172.

Figure 22:
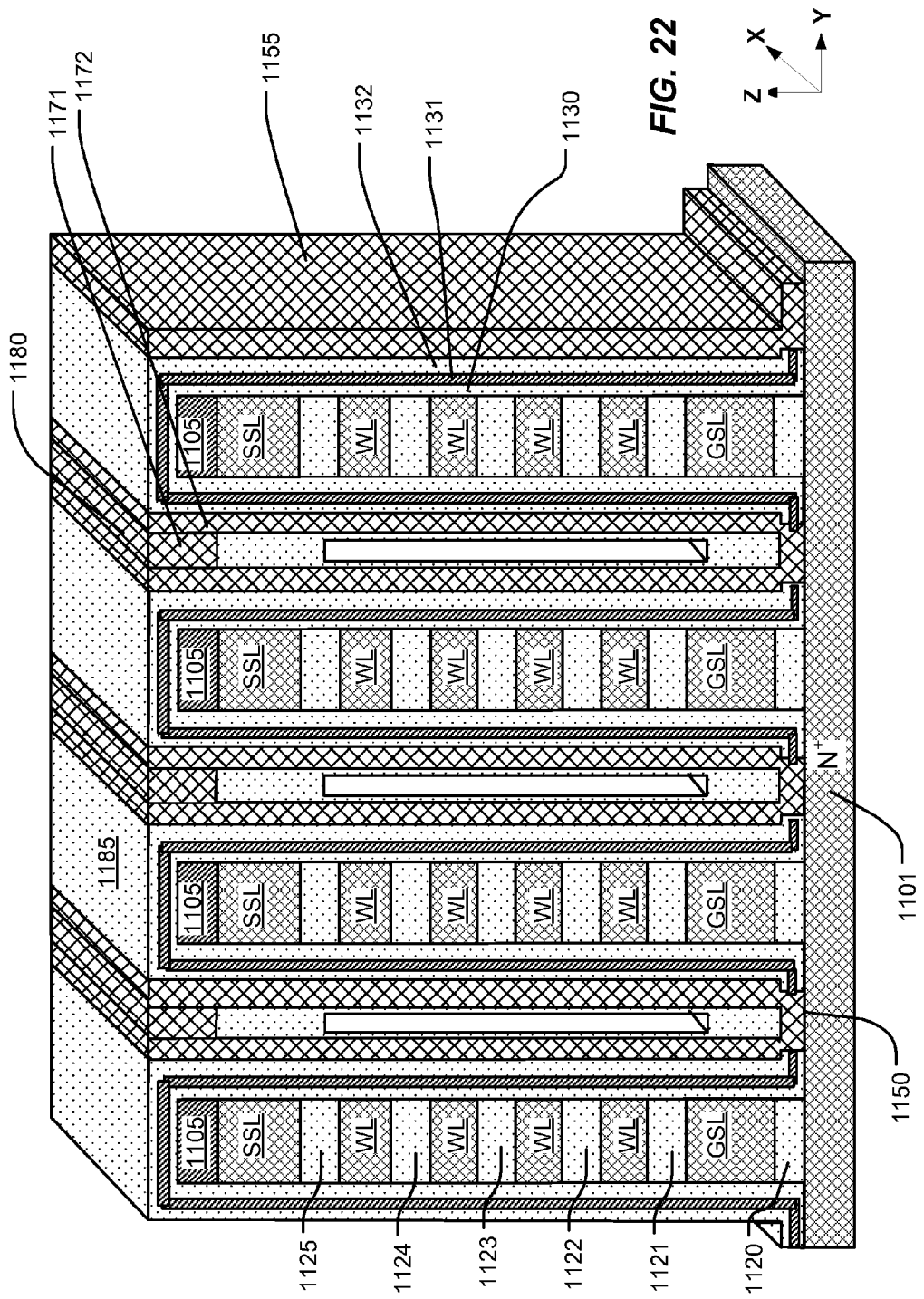

FIG. 22 illustrates a stage in the process after applying a step to etch back the poly layer 1170, or planarize the structure using chemical mechanical polishing process for example. The resulting structure exposes an elongated conductive plug (e.g. 1180) between the thin film semiconductor layers on the opposing sides of a trench. Also, an upper surface 1185 is formed in which an insulating material, such as one of the layers of the data storage structure over the stacks of conductive strips, is exposed between the elongated conductive plugs (e.g. 1180).

Figure 23:
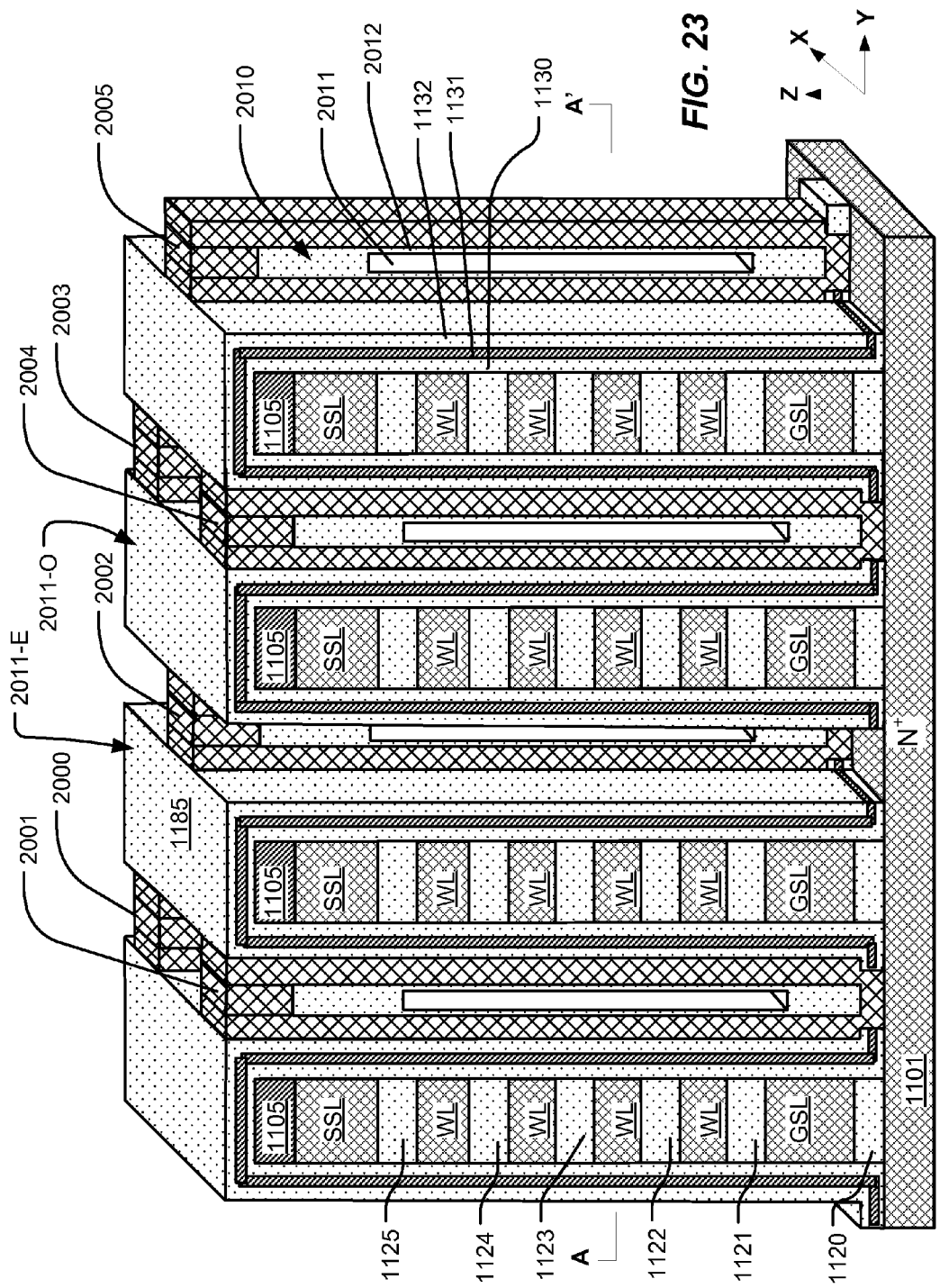

FIG. 23 illustrates a stage in the process after applying a pillar cut etch which includes etching holes between the stacks through the elongated conductive plug and thin film semiconductor layers to form a plurality of vertical channel structures (2000, 2001, 2002, 2003, 2004, 2005). The holes extend in this example to expose the reference conductor 1101. As a result of the holes, the vertical channel structures are formed, which are disposed between the even stacks (e.g. 2011-E) and odd stacks (e.g. 2011-O). The vertical channel structure 2002 is disposed between the stack 2011-E and the stack 2011-O in this example. The vertical channel structures comprise even and odd semiconductor films that act as vertical channel films, having outside surfaces and inside surfaces. The outside surfaces are disposed on and contact the data storage structures on the sidewalls of the corresponding even and odd stacks forming a 3D array of memory cells. The inside surfaces are separated by an insulating structure (e.g. 2010), which in this example includes a layer of insulating material (e.g. 2012) and a gap (e.g. 2011) in the regions of the memory cells. For thin-channel embodiments, the even and odd semiconductor films in the vertical channel structures have thicknesses of 10 nm or less.

Figure 28:
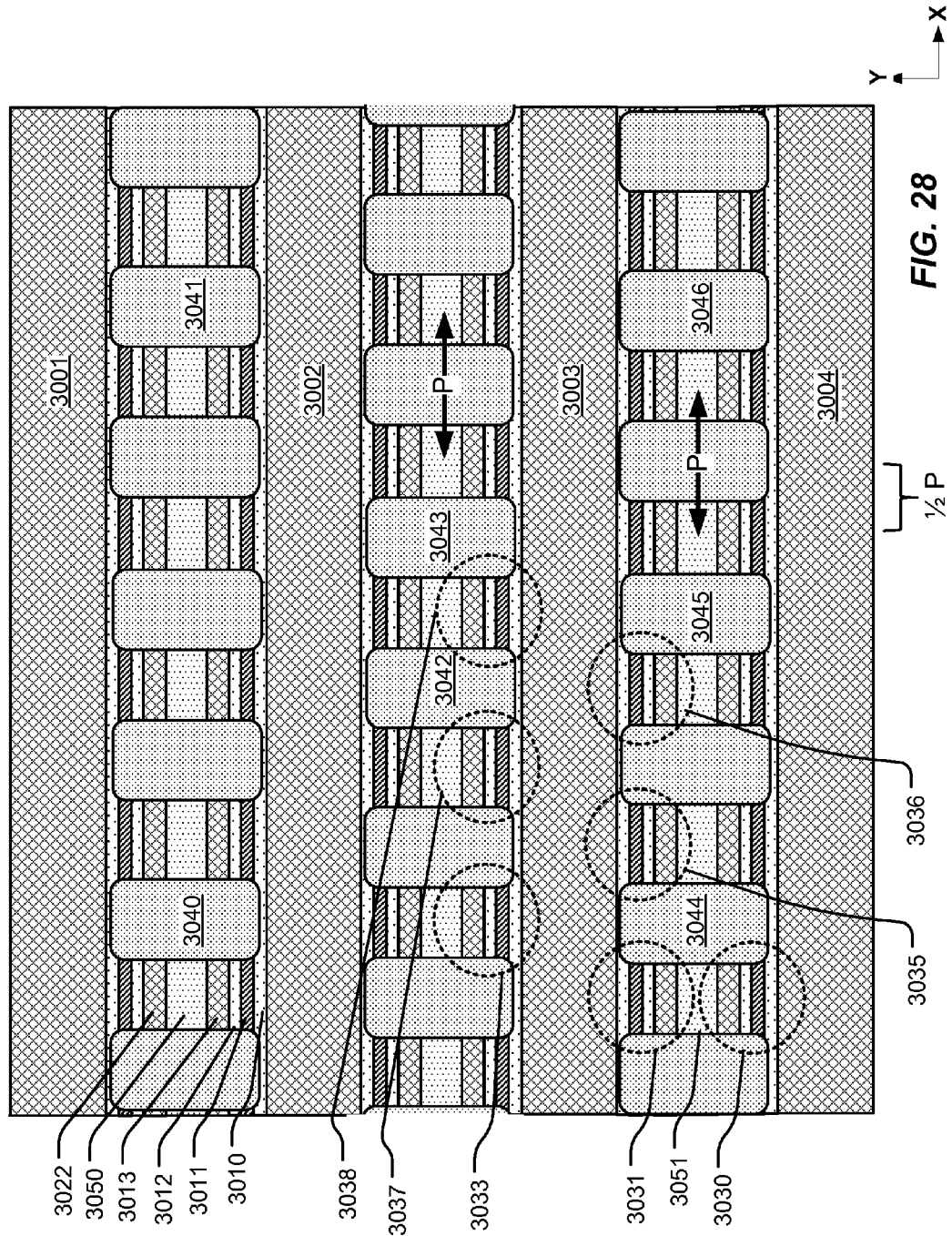
FIG. 28 illustrates in layout view one embodiment of a thin-channel film 3D NAND structure.
Figure 29:
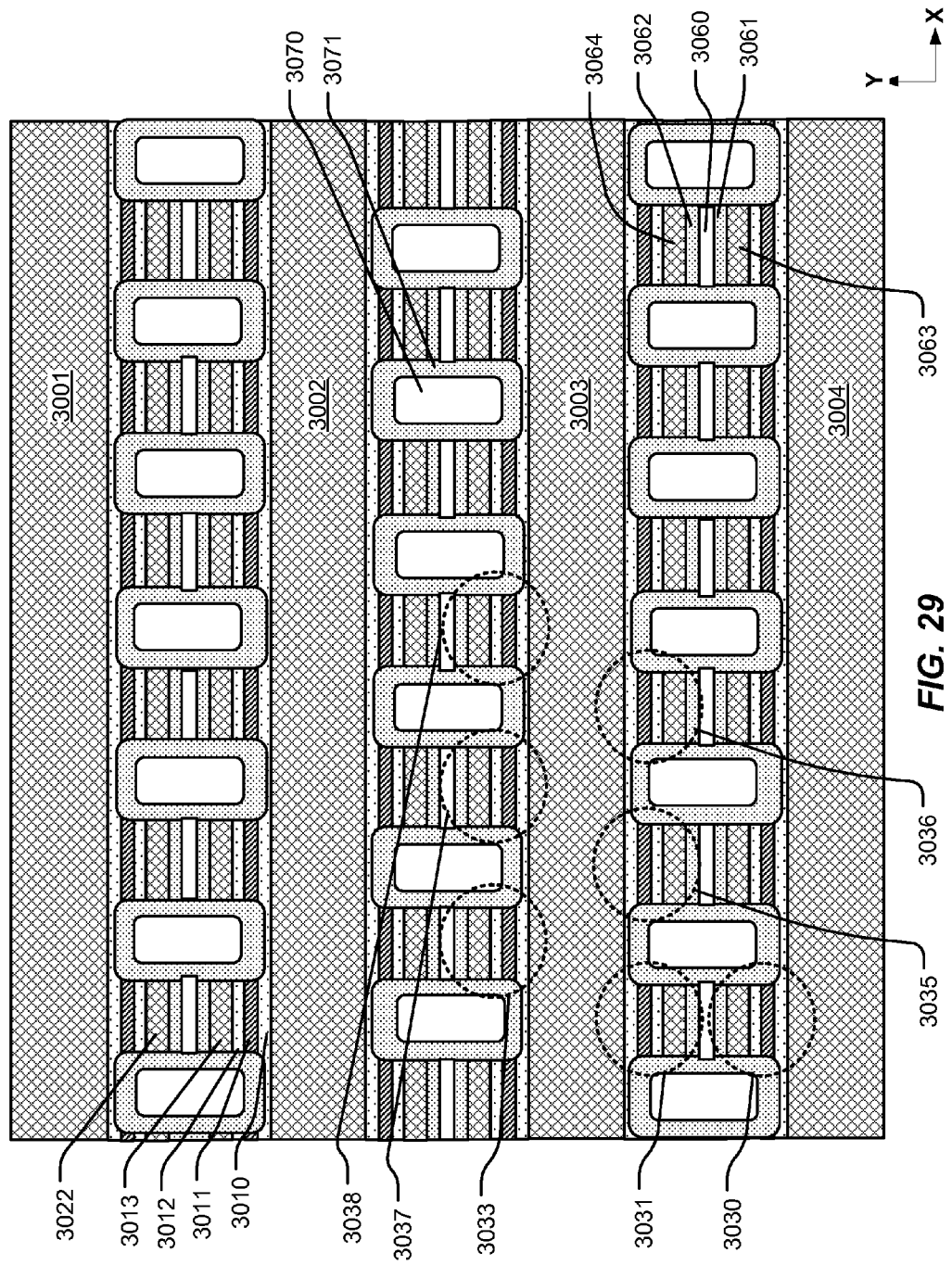
FIG. 29 illustrates in layout view another embodiment of a thin-channel film 3D NAND having gaps that separate opposing vertical thin channel films.

As illustrated in FIG. 23, the vertical channel structures 2000-2005, are laid out in a honeycomb arrangement, so that each row of vertical channel structures is offset in the row direction from adjacent rows. This honeycomb arrangement facilitates formation of overlying bit lines with a tighter pitch. Insulating fill (not shown) is applied in the holes between the vertical channel structures. FIGS. 28 and 29 below illustrate alternative layout views, from the point of view of cross-sections taken in the XY plane A-A' as marked in FIG. 23.

Figure 24:
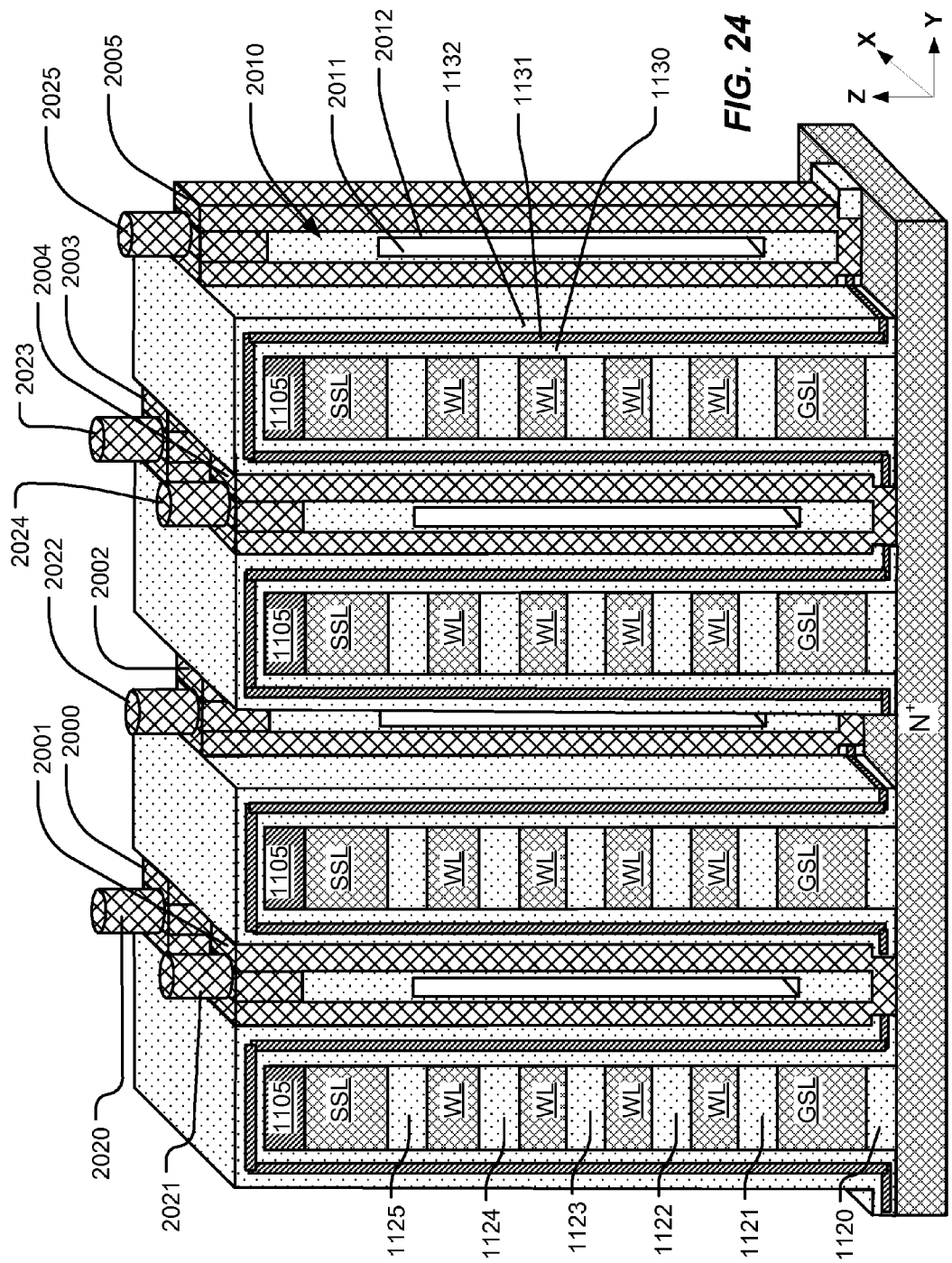

FIG. 24 illustrates a following stage after formation of an array of contact plugs (2020, 2021, 2022, 2023, 2024, 2025) through an interlayer dielectric (not shown), landing on corresponding vertical channel structures. The contacts can comprise a polysilicon plug, or other material which is compatible with the conductive material used at the upper surfaces of the vertical channel structures. The contacts provide for electrical connection to both of the thin-channel films in the active pillar.

Figure 25:
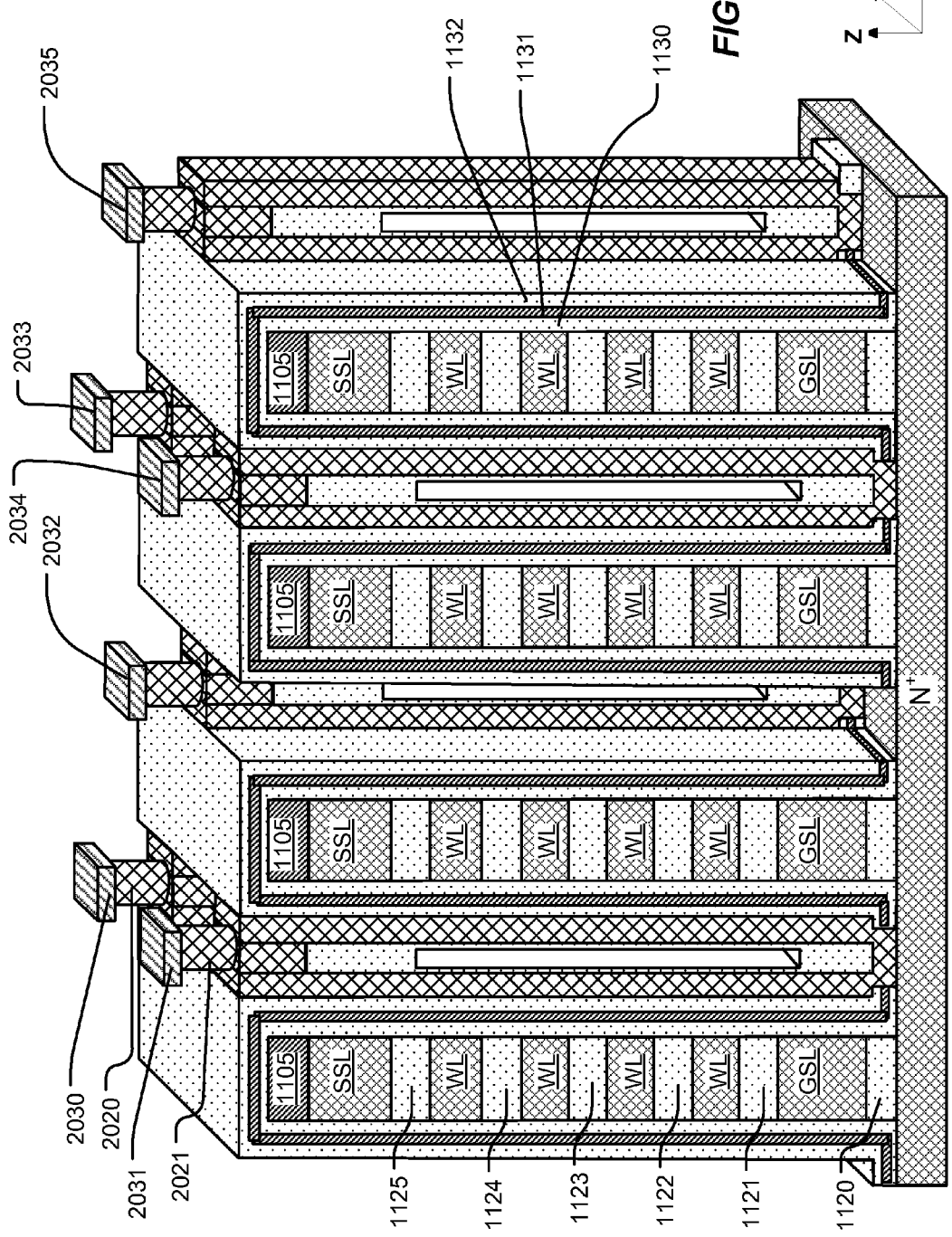

FIG. 25 illustrates the structure after a following stage that includes formation of posts (2030, 2031, 2032, 2033, 2034, 2035) in a patterned conductor layer which overlies an interlayer dielectric (not shown), such as the first metal layer in a process flow. The posts 2030-2035 are aligned over and make electrical contact with the contacts 2020-2025. Although not illustrated, patterned conductors in this layer can be disposed between the posts parallel with and overlying the stacks, with distributed connections to the SSL strips in the stacks (that is strapping for the SSL lines), to provide for reduced resistance of the SSL structures across the array.

Figure 26:
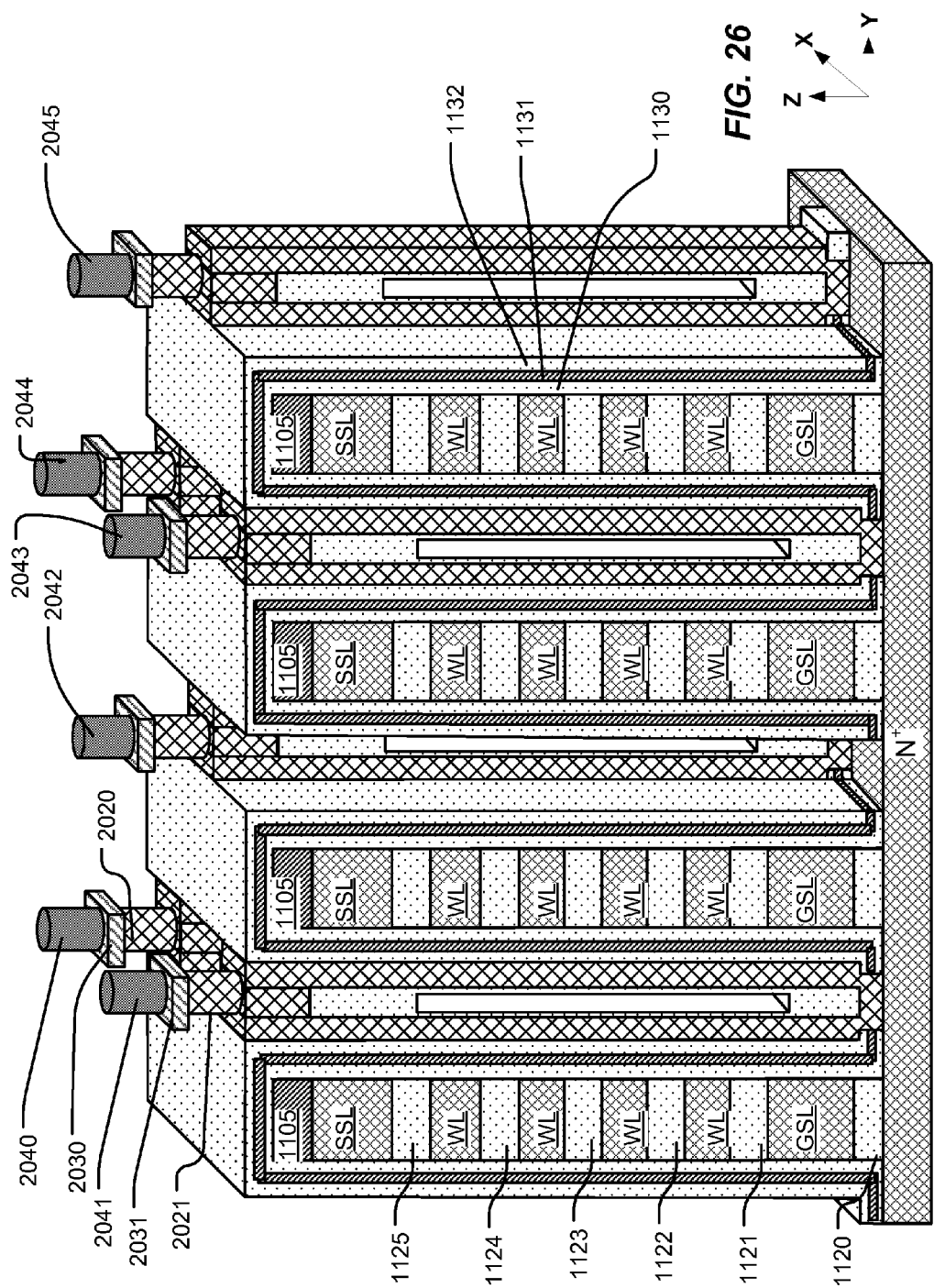

FIG. 26 illustrates the structure after a following stage that includes formation of elliptical or otherwise slim plugs (2040, 2041, 2042, 2043, 2044, 2045) through vias in an interlayer dielectric (not shown). The slimmed plugs 2040-2045 can be more narrow in the X dimension or row direction, than in the Y dimension or column direction. This facilitates high density layout of overlying bit lines.

Figure 27:
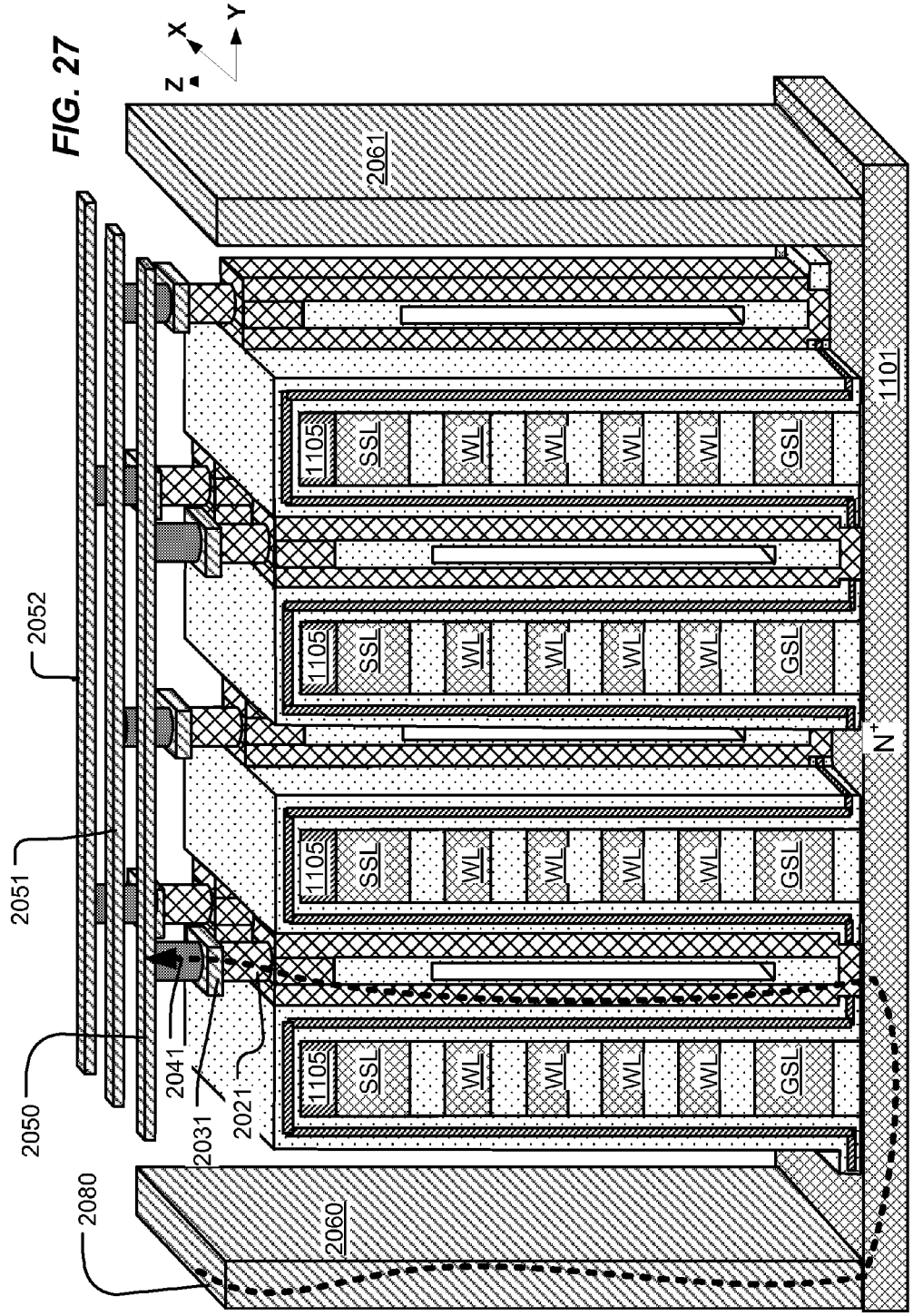

FIG. 27 illustrates the structure after applying a second patterned conductor layer, such as a metal layer in a process flow, over the slimmed plugs 2040-2045. The second patterned conductor layer includes bit lines 2050, 2051, 2052 in this example in contact with the slimmed plugs 2040-2045.

FIG. 27 also illustrates an example of conductors used for making contact to the reference conductor 1101. In this example, interlayer connectors 2060, 2061 are disposed as elongated walls parallel to the plurality of stacks of conductive strips, extending to the surface of the reference conductor 1101. The interlayer connectors 2060, 2061 can comprise a conductive material such as tungsten or other metal in some embodiments. Also, the interlayer connectors 2060, 2061 can comprise a doped semiconductor material. The interlayer connectors 2060, 2061 can be disposed adjacent each block of stacks in an array of blocks. Also, interlayer connectors can be disposed within the blocks of stacks in some embodiments as necessary by for example replacing one of the stacks of conductive strips with a conductive material, or by utilizing a row of vertical channel structures as connectors to the reference conductor 1101.

FIG. 27 includes a line 2080 illustrating a current path for accessing memory cells in a vertical channel film on one side of the vertical channel structure. The current path proceeds through the interlayer connector 2060 to the reference conductor 1101. From the reference conductor 1101, it proceeds through the electrical contact made in the thin film semiconductor layer through the vertical channel film up the sidewall of the stack. At the top of the vertical channel film, the current path proceeds through the plug 2021, the post 2030, and plug 2041, to the bit line 2050.

For the bottom source, thin channel NAND strings shown in FIG. 27, one bias arrangement that can be applied to program a selected cell is provided in TABLE 1. Particular bias arrangements can be adapted to given implementations by empirical testing, by simulation, or by both.

TABLE 1

| PROGRAM BIAS | |
|---|---|
| SELECTED WL | Vpgm (e.g. ISPP ~+15 V stepping to ~+24 V) |
| OTHER WLs: | Vpass, pgm (e.g. ~+9 V) |
| ALL GSL's | ~0 V or −1 V |
| SELECTED SSL: | Vdd (e.g. ~+3 V) |

TABLE 1-continued

PROGRAM BIAS

| | |
|---|---|
| UNSELECTED SSL | Vinh. Read (e.g. ~0, ~−1 V) |
| SELECTED BLs: | Vbl (e.g. ~0 V) |
| UNSELECTED BLs: | Vdd (e.g. ~+3 V) |
| SLs: | Vdd (e.g. ~+3 V) |

For the bottom source, thin channel NAND strings shown in FIG. 27, one bias arrangement that can be applied to erase a selected cell is provided in TABLE 2. Particular bias arrangements can be adapted to given implementations by empirical testing, by simulation, or by both.

TABLE 2

ERASE BIAS

| | |
|---|---|
| ALL WLs | ~0 V |
| ALL GSLs | Floated, or ~+7 V |
| ALL BLs: | ~+20 V |
| ALL SLs: | Floated, or ~+7 V |

For the bottom source, thin channel NAND strings shown in FIG. 27, one bias arrangement that can be applied to read a selected cell is provided in TABLE 3. Particular bias arrangements can be adapted to given implementations by empirical testing, by simulation, or by both.

TABLE 3

READ BIAS

| | |
|---|---|
| SELECTED WL:: | Vref (Vref1, Vref2, Vref3 for multiple bit per cell) |
| OTHER WLs: | Vpass, read (e.g. ~+7 V) |
| SELECTED SSL: | Vsel, read (e.g. ~+5) |
| UNSELECTED SSL | Vinh. Read (e.g. 0, −1 V) |
| GSLs: | (e.g. ~+5 V) |
| SELECTED BLs: | Vsense (e.g. +0.7 V) |
| SLs: | Vref (e.g. 0 V) |

FIG. 28 is a cross-section taken in the XY plane A-A' which is marked in FIG. 23. The cross-section through a layer in the block, illustrates a layout view with an insulating fill between the vertical channel structures provides the insulating structure (e.g. insulators 3040, 3041, 3042, 3043, 3044, 3045, 3046) isolating the channels of adjacent cells along a conductive strip. Also, the layout shown in FIG. 28 illustrates an embodiment in which the insulating structure between the thin-channel films within the active pillars is a solid insulator. The solid insulator can be implemented using a dielectric such as silicon dioxide. In the layout, the conductive strips 3001, 3002, 3003, 3004 are illustrated. Each of the conductive strips is disposed in a separate stack of conductive strips. Active pillars are disposed between the conductive strips. Active pillars in this example include a dielectric charge trapping structure represented by the multiple dielectric layers 3010-3012. Representative types of dielectric charge trapping structures are discussed above. The dielectric layer 3010 can be a blocking dielectric which includes one or more layers of dielectric contacting the conductive strip 3002. The dielectric layer 3011 can be a charge storage layer which includes one or more layers of dielectric contacting the blocking dielectric layer 3010. The dielectric layer 3012 can be a tunneling layer implemented using one or more layers of dielectric contacting layer 3011 and the outside surface of the thin-film semiconductor layer 3013 which acts as a vertical channel film. Insulating structure 3050 within a vertical channel structure is disposed on the inside surface of the thin film semiconductor layer 3013, and separates the thin film semiconductor layer 3022 from the thin film semiconductor layer 3022. The thin film semiconductor layer 3022 is the vertical channel film for the memory cell on the opposing side wall of the stack, and coupled with the conductive strip 3001.

There are two cells in a frustum of an active pillar at corresponding layers of conductive strips. Thus, the active pillar adjacent to the insulating fill 3044 includes a cell 3030 contacting the conductive strip 3004, and a cell 3031 contacting the conductive strip 3003. Insulating structure 3051 separates the cells 3030 and 3031. The memory cells in the layer illustrated in FIG. 28 include cells disposed on a first side of the conductive strip, such as cell 3031 on a first side of the conductive strip 3003, and cells disposed on a second side of the same conductive strip, such as cell 3033 disposed on a second side of the conductive strip 3003. The cells along a first side of a conductive strip (e.g. cells 3031, 3035 3036) are arranged with a uniform pitch P in the X direction along the first side of the conductive strip 3003. Also, the cells along an opposing side of the same conductive strip (e.g. cells 3033, 3037, 3038) are arranged with a uniform pitch P in the X direction along the second side of the conductive strip 3003. In this embodiment, the cells on the first side of the conductive strip are offset in the X direction by one half of the uniform pitch (½ P) from the cells on the second side of the conductive strip. This results in a twisted layout allowing a tighter pitch for overlying bit lines. The length of the pitch P is selected to meet manufacturing requirements for the formation of the stacks of conductive strips, and the structures on the sidewalls of the stacks as described above. In some examples, the pitch can be on the order of 60 to 100 nm.

FIG. 29, like FIG. 28, is a cross-section taken in the XY plane A-A' which is marked in FIG. 23. The reference numbers applied in FIG. 28 for corresponding structures are used again in FIG. 29, and not described again. The cross-section of FIG. 29 is taken through a layer in the block, and illustrates a layout view with the insulating structures within an active pillar comprising a gap. For example, the insulating structure in the active pillar between conductive strips 3003 and 3004 and that includes the thin-channel film 3063 and the thin-channel film 3064 includes an insulating structure that comprises the gap 3060, and thin insulator layers 3061 and 3062 on the inside surfaces of the thin-channel films 3063, 3064. When the thin-channel films 3063, 3064 comprise silicon, such as polysilicon, the thin insulator layers 3061 and 3062 can comprise silicon oxide. Another difference between the structure in FIG. 29 and that shown FIG. 28 is the insulator structures between the vertical active pillars. The insulator structures between the vertical active pillars in the example of FIG. 29 comprise gaps (e.g. 3070) with thin insulator liners 3071.

In a representative structure, the width of the channel for a memory cell is determined by the width in the X direction of the thin-channel films 3063, 3064 and can be on the order of 30 to 50 nm. The length of the channel for the memory cell is determined by the thickness of the horizontal conductive strips 3003, 3004 in the Z direction and can be on the order of 30 to 50 nm. The thickness of the thin-channel films in the Y direction is determined by the thickness of the semiconductor film used to form the structures, and can be thin enough, e.g. less than or equal to 10 nm, to provide performance improvement such as reducing short channel effects.

The spacing between the conductive strips 3003, 3004 is selected according to the manufacturing processes. In an example as described herein with multiple layers deposited, polysilicon spacer etching which opens the bottom of the trenches, and an air gap in the insulating structure within the active pillars which reduces back-to-back channel coupling during self-boosting inhibit biasing, the spacing between the conductive strips 3003, 3004 can be on the order of 120 to 160 nm. The widths of the conductive strips in the Y direction for a representative example can be on the order of 30 to 50 nm.

As mentioned with reference to FIG. 23, a patterned hole etch is executed to separate the active pillars between the stacks of conductive strips. In the layout view showing FIG. 28 and FIG. 29, the hole cuts through the dielectric charge trapping structure exposing the sidewalls of the conductive strips in the stacks of conductive strips or, as illustrated in FIGS. 28 and 29, leaving only a small portion of the blocking dielectric layer of the dielectric charge trapping structure. The pattern of hole cuts of FIGS. 28 and 29 results in the width of the thin-channel strip being about the same as the width of the dielectric charge trapping structure in each active pillar.

Figure 30A:
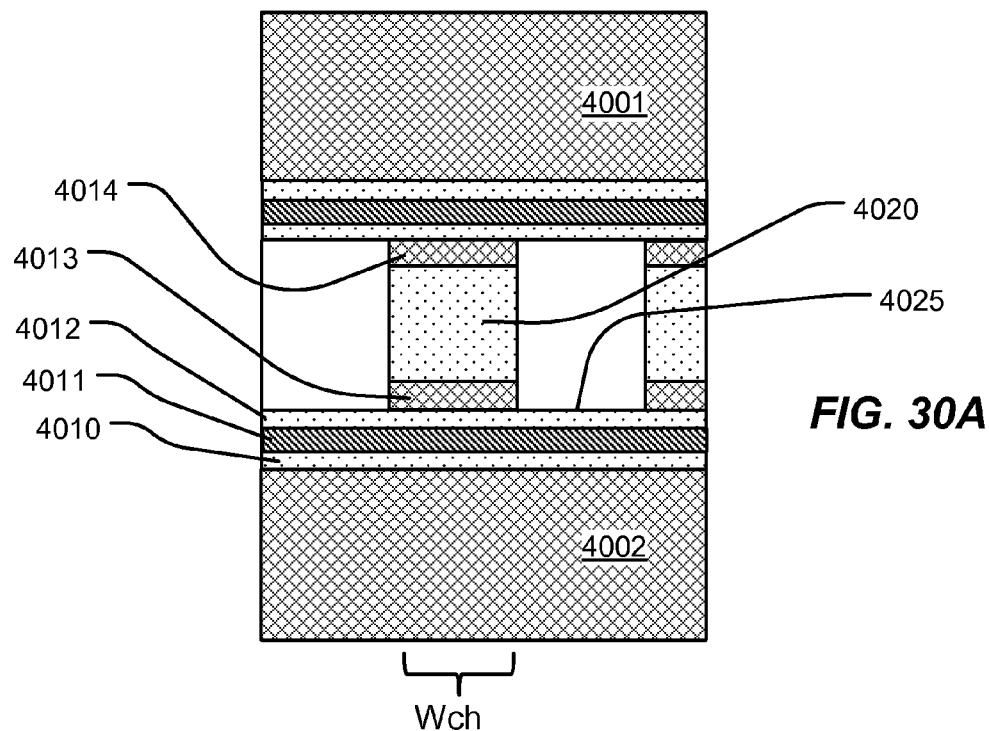
FIGS. 30A-30B illustrate alternative embodiments of active pillars for a 3D NAND structure as described herein.
Figure 30B:
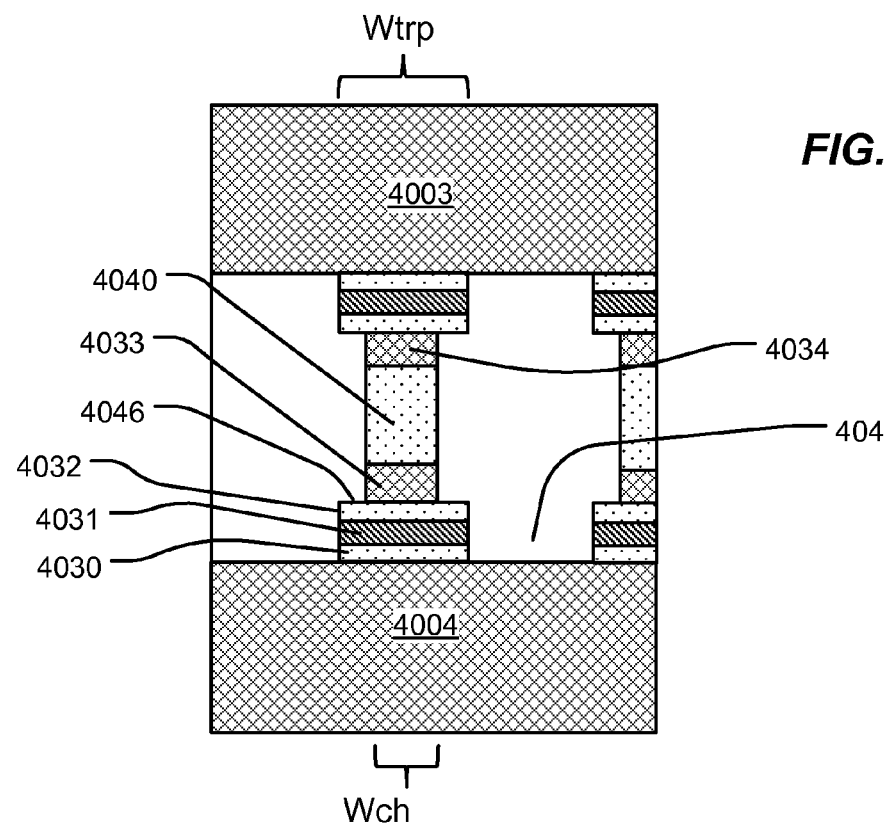

FIGS. 30A and 30B illustrate alternative hole cut patterns for formation of the insulating structures between the active pillars. In FIG. 30A, the patterned hole etch does not remove the dielectric charge trapping structure between the active pillars. Thus, the multilayer dielectric structure used as the dielectric charge trapping structure for each active pillar includes a tunneling layer 4012, a charge trapping layer 4011, and a blocking layer 4010 which is continuous along the conductive strips 4001, 4002. As illustrated, an insulating structure 4020 separates the thin-channel films 4013, 4014. The dielectric charge trapping structure extends in the region 4025 between the adjacent active pillars. The thin-channel films 4013, 4014 have a channel width Wch which is determined by the hole etch.

In FIG. 30B, the structure is illustrated which results from the patterned hole etch like that used to form the structure of FIGS. 28 and 29, followed by a slight lateral recess etch of the thin-film semiconductor acting as the thin-channel films. Thus, dielectric charge trapping structure includes a segment 4046 for each active pillar including a tunneling layer 4032, a charge trapping layer 4031, and a blocking layer 4030 along the conductive strip 4004. A mirror image charge trapping structure is disposed on the conductive strip 4003. The dielectric charge trapping structure has a width Wtrp determined by the hole etch, such that gaps (e.g. 4045) separates multiple dielectric layers used for charge trapping structures along the conductive strips. The thin-channel films 4033, 4034 have widths Wch which is less than the width Wtrp slightly. As illustrated, an insulating structure 4040 separates the thin-channel films 4033, 4034. The charge trapping structure and recessed thin-channel film results in a memory cell having better device windows.

Figure 31:
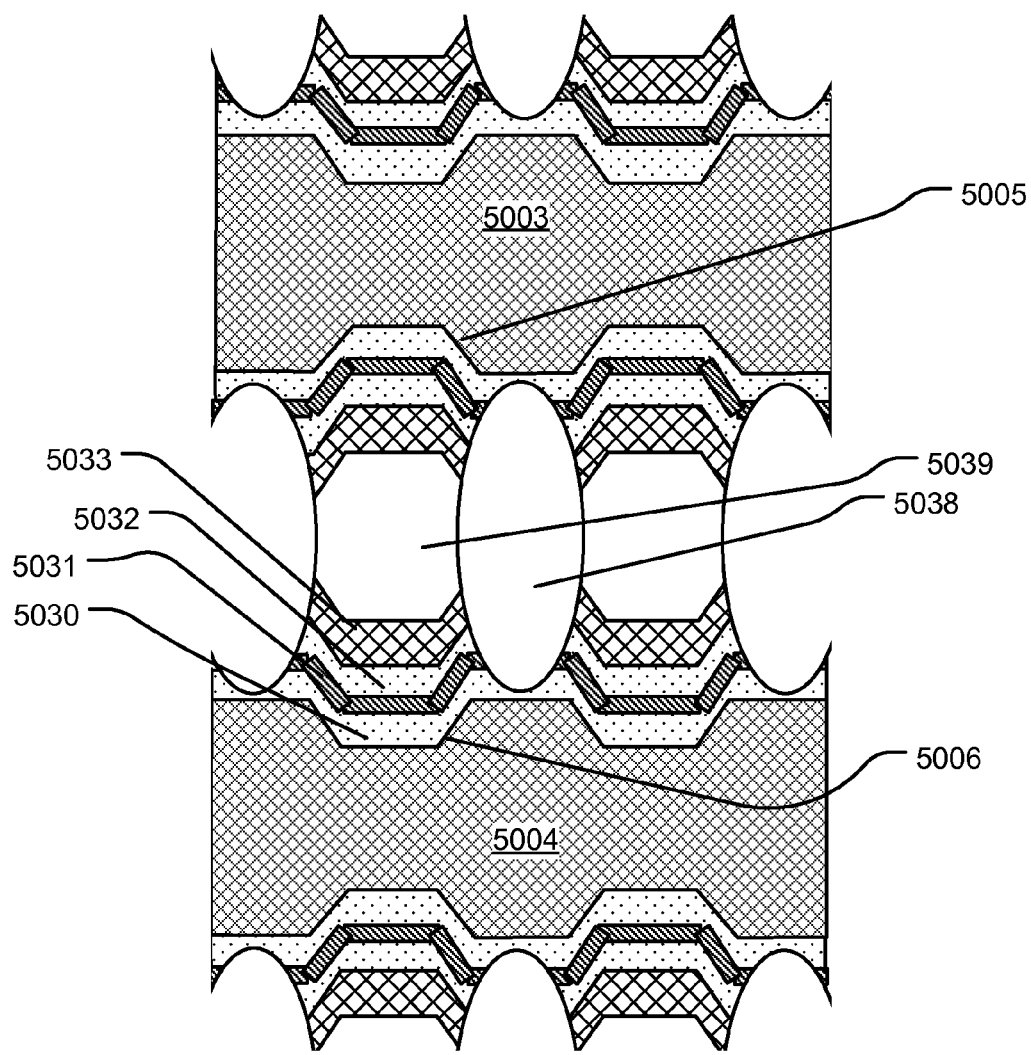
FIG. 31 illustrates yet another alternative embodiment of an active pillar for a 3D NAND structure.

FIG. 31 illustrates an alternative layout pattern, in which the conductive strips 5003, 5004 have crenellated sidewalls 5005, 5006. This crenellated effect can be created for example by replacing the patterned line etch used to create the structure of FIG. 14 with a pair of patterned hole etches, including a first pattern of larger diameter holes, combined in any order with a second pattern of smaller diameter holes. The deposition of the dielectric layers to form the dielectric charge trapping structure on crenellated sidewalls 5005, 5006 results in a curved layout including a blocking layer 5030, a charge trapping layer 5031, and a tunneling layer 5032 contacting a curved thin-channel film 5033. The curvature of the thin-channel film 5033 in the dielectric charge trapping structure can produce a mild field enhancement effect for the charge trapping memory cell. In the illustrated embodiment, air gaps 5039 provide insulating structures within the active pillars, separating the thin-channel films, and air gaps 5038 provide slated structures between the active pillars.

Figure 32:
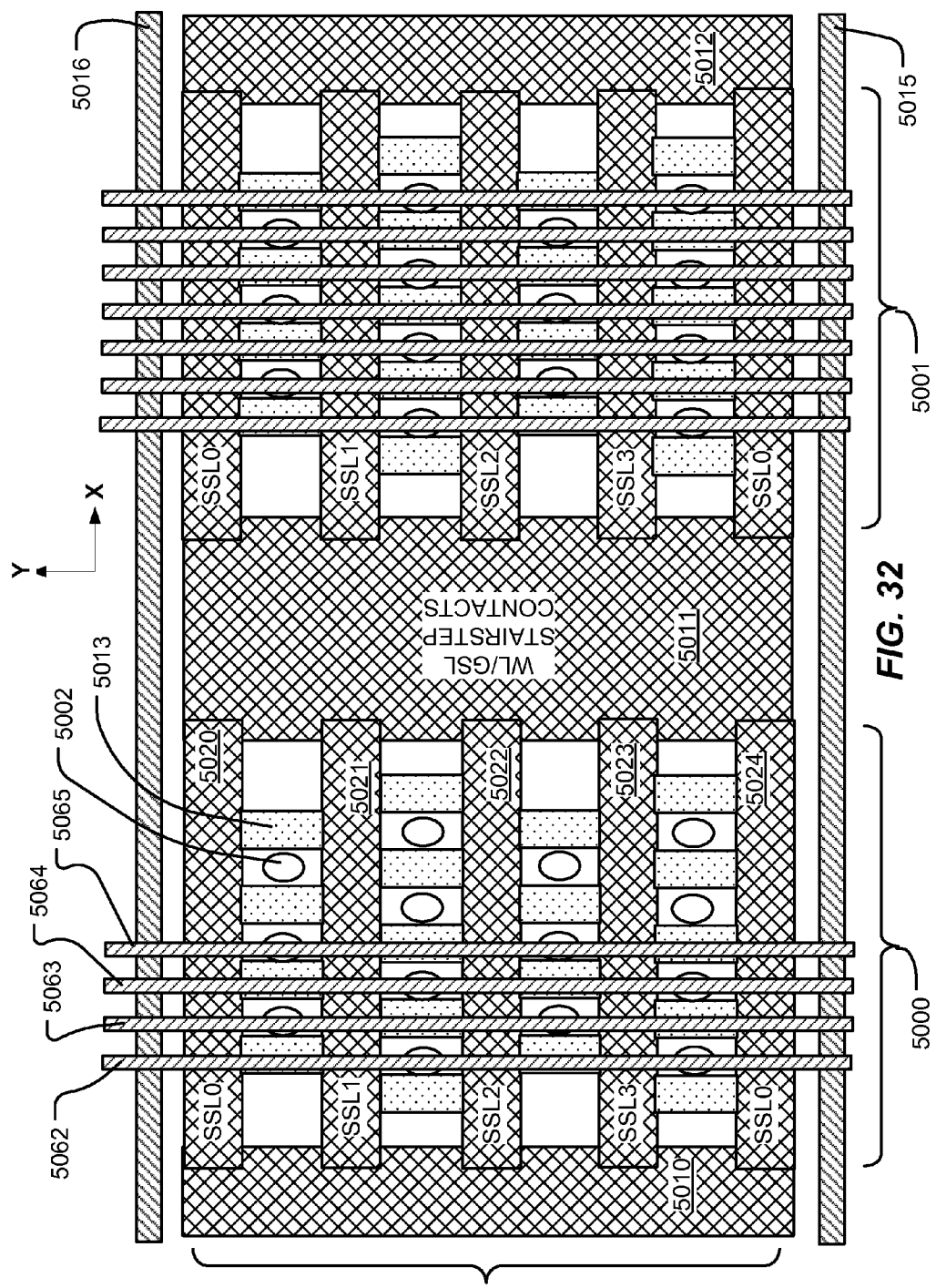
FIG. 32 provides a layout view of two blocks of a 3D NAND structure described herein.

FIG. 32 illustrates the layout of the stacks of conductive strips, the reference line interlayer conductor and the bit lines for one example of an integrated circuit using the vertical thin-channels like that of FIG. 27. In FIG. 32 a first block 5000 and a second block are illustrated. The vertical active pillars are represented by the ovals (e.g. 5002) and the insulating structures that separate the active pillars are represented by the rectangles 5013. The layout of active pillars follows the twisted layout discussed above with reference to FIGS. 28 and 29.

The upper layer of the stacks of conductive strips comprises string select lines SSL. In the illustrated example, five conductive strips 5020, 5021, 5022, 5023, 5024 in block 5000 provide effect for SSL lines, SSL0 to SSL3. Block 5001 shares the contact structure 5041 with block 5000. As illustrated, SSL0 in block 5000 includes the conductive strip 5020 and the conductive strip 5024. The active pillars on the lower edge of conductive strip 5020, and the active pillars on the upper edge of conductive strips 5024 provide a pair of memory cells controlled by the SSL line and connected to different bit lines 5062-5065 (some of the bit lines over the block 5000 are removed for the purposes of the illustration). For example, bit line 5062 is connected to the active pillar which is adjacent to the conductive strip 5024 of SSL0. The bit line 5063 is connected to the active pillar which is adjacent to the conductive strip 5020 of SSL0.

The word lines and GSL lines are formed in underlying layers of the plurality of stacks and obscured by the SSL lines in this illustration. The word lines and GSL lines terminate in respective pads 5010, 5011, 5012 in which stairstep contact structures are implemented to provide for interlayer connection from each layer to overlying patterned conductors. The overlying patterned conductors can provide word line strapping in a patterned metal layer overlying the plurality of stacks, to reduce the resistance for propagation of word line signals across a plurality of blocks. In a representative embodiment, the stairstep contacts for word line strapping can be spaced along the structure periodically. For example, the stairstep contacts can be placed every 100μ along the plurality of blocks. In other embodiments, the spacing can be other intervals as needed for a particular implementation.

The interlayer conductors 5015, 5016 connected to the underlying reference conductor are disposed outside the plurality of stacks of conductive strips for corresponding blocks. Thus, the layout of the interlayer conductors 5015, 5016 is absorbed by the block layout overhead, rather than by structures inside the block. Thus, for the purpose of description of these locations, the plurality of stacks of conductive strips can be characterized as having outside stacks and inside stacks. The interlayer conductors 5015, 5016 are disposed outside the outside stacks of the plurality of stacks of conductive strips for each block, which are terminated in a common stairstep contact structure (e.g. pad 5011).

The number of SSL lines in a given block can be much higher, such as for example 16 or 32. Likewise, the number of bit lines can be much higher as suits a particular implementation.

Figure 33:
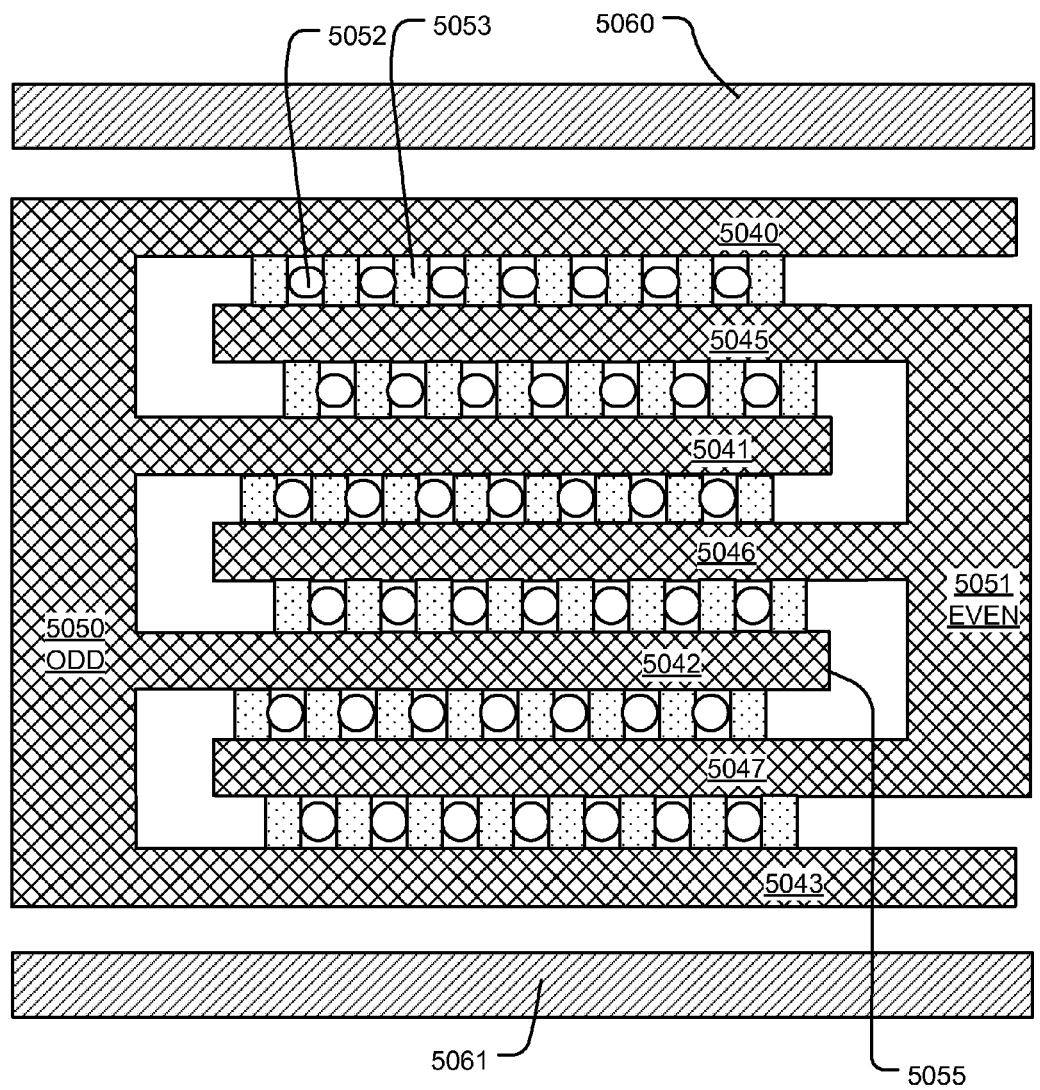
FIG. 33 illustrates the layout of a layer of conductive strips in an embodiment of a 3D NAND described herein.

FIG. 33 illustrates a layout of one of the layers of conductive strips configured as word lines for a block. The active pillars are represented by the ovals (e.g. 5052) and the insulating structures which separate the active pillars are represented by the rectangles (e.g. 5053). The conductive strips include odd conductive strips which terminate in the odd pad 5050, and even conductive strips which terminate in even pad 5051. As illustrated, the odd conductive strips (e.g. strip 5042) terminate (such as at the end 5055 of conductive strip 5042) before reaching the even pad 5051. The conductive strips 5040, 5041, 5042, 5043 which terminate in the odd pad 5050 are interdigitated with the conductive strips 5045, 5046, 5047 which terminate in the even pad 5051. The interlayer connectors 5060, 5061 used for connection to the underlying reference conductor are disposed along the sides of the plurality of stacks as discussed above. The even and odd layout of the conductive strips used for word lines allows for more flexible biasing operations for operation of the 3D memory. In other embodiments, the conductive strips configured as even and odd word lines in a block are connected in common to one pad.

Figure 34:
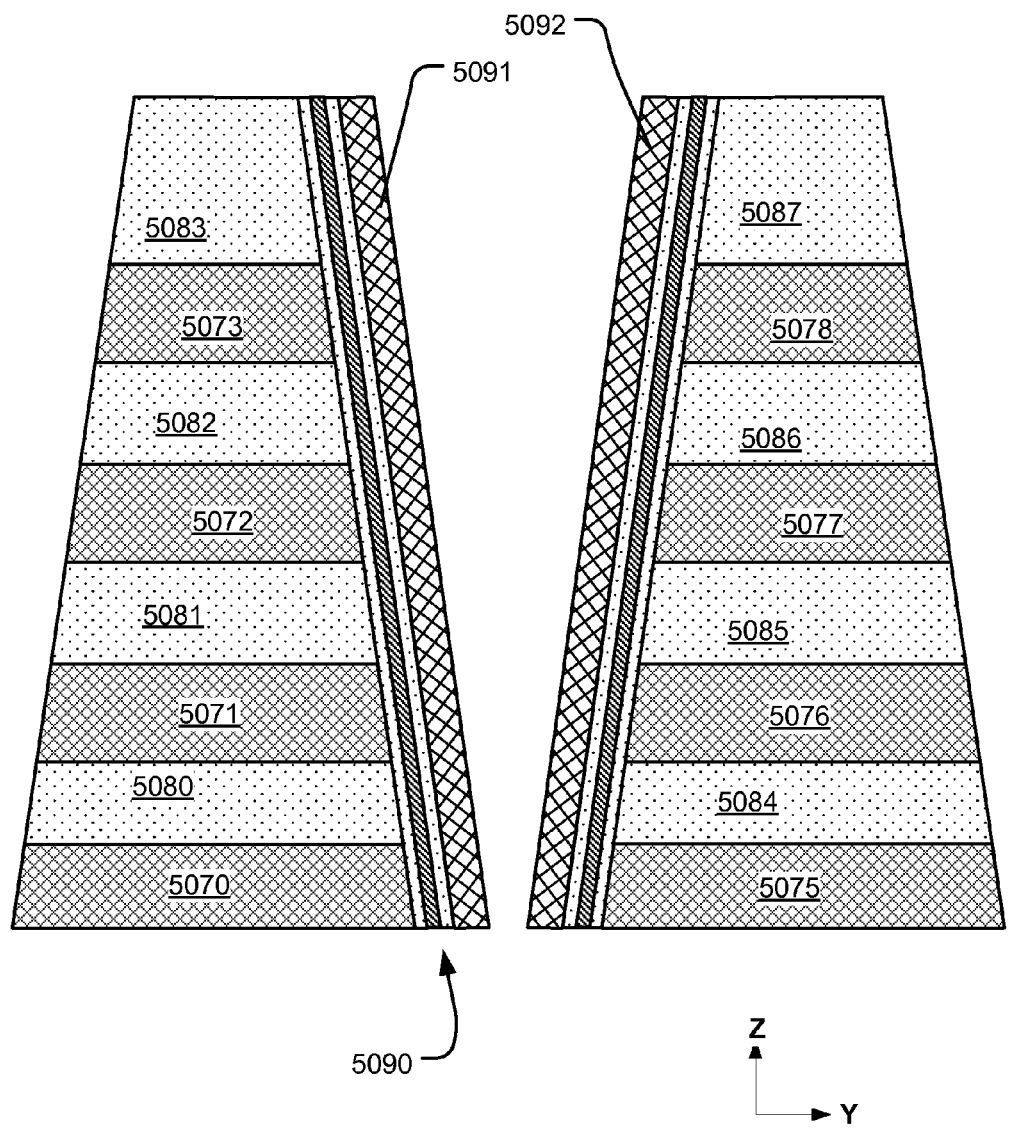
FIG. 34 illustrates aspects of a thin-channel film on sidewalls of a stack of conductive strips as described herein.

FIG. 34 illustrates the uniformity of the thin-channel films which can be achieved using the thin film deposition process discussed above with respect to FIG. 16. In FIG. 34 a first stack of conductive strips including conductive strips 5070, 5071, 5072, 5073, with alternating insulating layers 5080, 5081, 5082, 5083 is illustrated adjacent a second stack of conductive strips including conductive strips 5075, 5076, 5077, 5078, with alternating insulating layers 5084, 5085, 5086, 5087. The stacks are illustrated with sides having an exaggerated slope, representing a result of a deep etch, which may not have perfectly vertical sidewalls. Using a thin-film process, as opposed to a fill process, the thickness of the thin-film layers 5091, 5092 on the sidewalls of the stacks, over the dielectric charge trapping layers (e.g. 5090) can be very uniform over the entire depth of the stack. This uniformity and the thickness of the thin films, used to form the vertical thin-channels can improve uniformity of operation of the memory cells in the 3D array.

Figure 35:
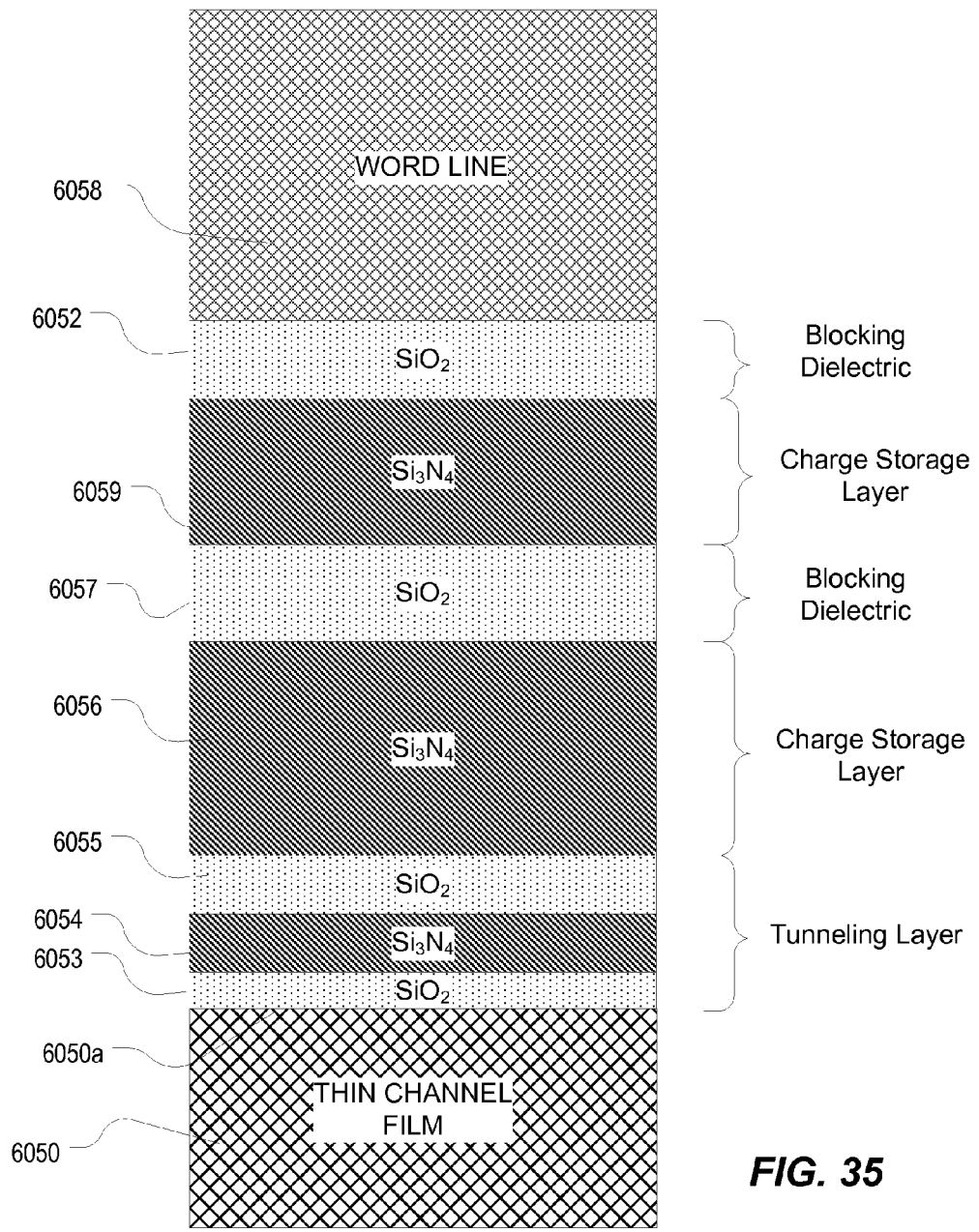
FIG. 35 illustrates one type of data storage structure which can be utilized in 3D NAND memory as described herein.

FIG. 35 is a simplified diagram of an improved BE-SONOS dielectric charge storage layer that can be utilized in the structure described herein.

The dielectric charge trapping structure includes a tunneling layer in contact with the vertical channel structure 6050, comprises a composite of materials, includes multiple layers, including a first tunneling layer 6053 of silicon oxide, a tunneling layer 6054 of silicon nitride, and a second tunneling layer 6055 of silicon oxide.

The first tunneling layer 6053 of silicon dioxide on the surface 6050a of the channel structure 6050 is formed for example using in-situ steam generation ISSG with optional nitridation by either a post deposition NO anneal or by addition of NO to the ambient during deposition. The thickness of the first tunneling layer 6053 of silicon dioxide is less than 20 Å, and preferably 7-15 Å. The first tunneling layer 6053 can be engineered with alternatives such as nitrided oxide for improved endurance, and/or fluorine treatments for improved interface state quality.

The tunneling layer of silicon nitride 6054, also referred to as a tunneling nitride layer, lies on the first tunneling layer 6053 of silicon oxide formed for example using low-pressure chemical vapor deposition LPCVD, using for example dichlorosilane DCS and $NH_3$ precursors at 680 degrees C. In alternative processes, the tunneling nitride layer comprises silicon oxynitride, made using a similar process with an $N_2O$ precursor. The thickness of the layer 6054 of silicon nitride is less than 30 Å, and preferably 10-30 Å, including for example 20 Å. Because of its thinness, layer 6054 is poor at storing charge.

Layer 6054 provides a low hole barrier height to facilitate hole injection for −FN erasing. However, layer 6054 has a low trapping efficiency. Various materials for layer 6054, along with their valence band offsets with silicon are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The second tunneling layer 6055 of silicon dioxide lies on the tunneling layer 6054 of silicon nitride and is formed for example using LPCVD high temperature oxide HTO deposition. The thickness of the second tunneling layer 6055 of silicon dioxide is less than 45 Å, and preferably 15-45 Å, for example 30 Å. The second tunneling layer 6055 provides sufficient barrier thickness to block charge loss for improved charge retention. The second tunneling layer 6055 blocks direct tunneling leakage. Other low leakage oxides such as $Al_2O_3$ are possible.

A first charge storage layer 6056 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006. High charge trapping efficiency alternatives are oxynitride, silicon-rich nitride, embedded nanoparticles, and $HfO_2$.

A first blocking layer 6057 of silicon dioxide lies on the first charge storage layer 6056 and is formed for example using LPCVD high temperature oxide HTO deposition. The thickness of the first blocking layer 6057 of silicon dioxide is less than 70 Å, including for example a range of 55-70 Å, including for example 50 Å. The first blocking layer 6057 provides sufficient barrier thickness to block charge mixing and charge transport between the charge storage layers 6056 and 6059. Other low leakage oxides such as $Al_2O_3$ are possible.

A second charge storage layer 6059 in this embodiment comprises silicon nitride having a thickness greater than 30 Å, including for example a range of 30-60 Å, including for example about 40 Å in this embodiment formed for example using LPCVD. Other embodiments are similar to the first charge trapping layer. The second charge storage layer 6059 traps electrons during −FN erasing to stop gate electron injection, allowing continuous erase of first charge storage layer 6056 by channel hole injection. High charge trapping efficiency alternatives are oxynitride, silicon-rich nitride, embedded nanoparticles, and $HfO_2$.

A second blocking layer 6052 of silicon dioxide lies on the second charge storage layer 6059 and is formed for example using LPCVD high temperature oxide HTO deposition. The thickness of the second blocking layer 6052 of silicon dioxide is less than 60 Å, including for example a range of 30-60 Å, including for example 35 Å.

Finally, a layer 6058 of gate material, such as a thin film semiconductor layer configured as a vertical channel film, is formed on the second blocking layer 6052.

Figure 36:
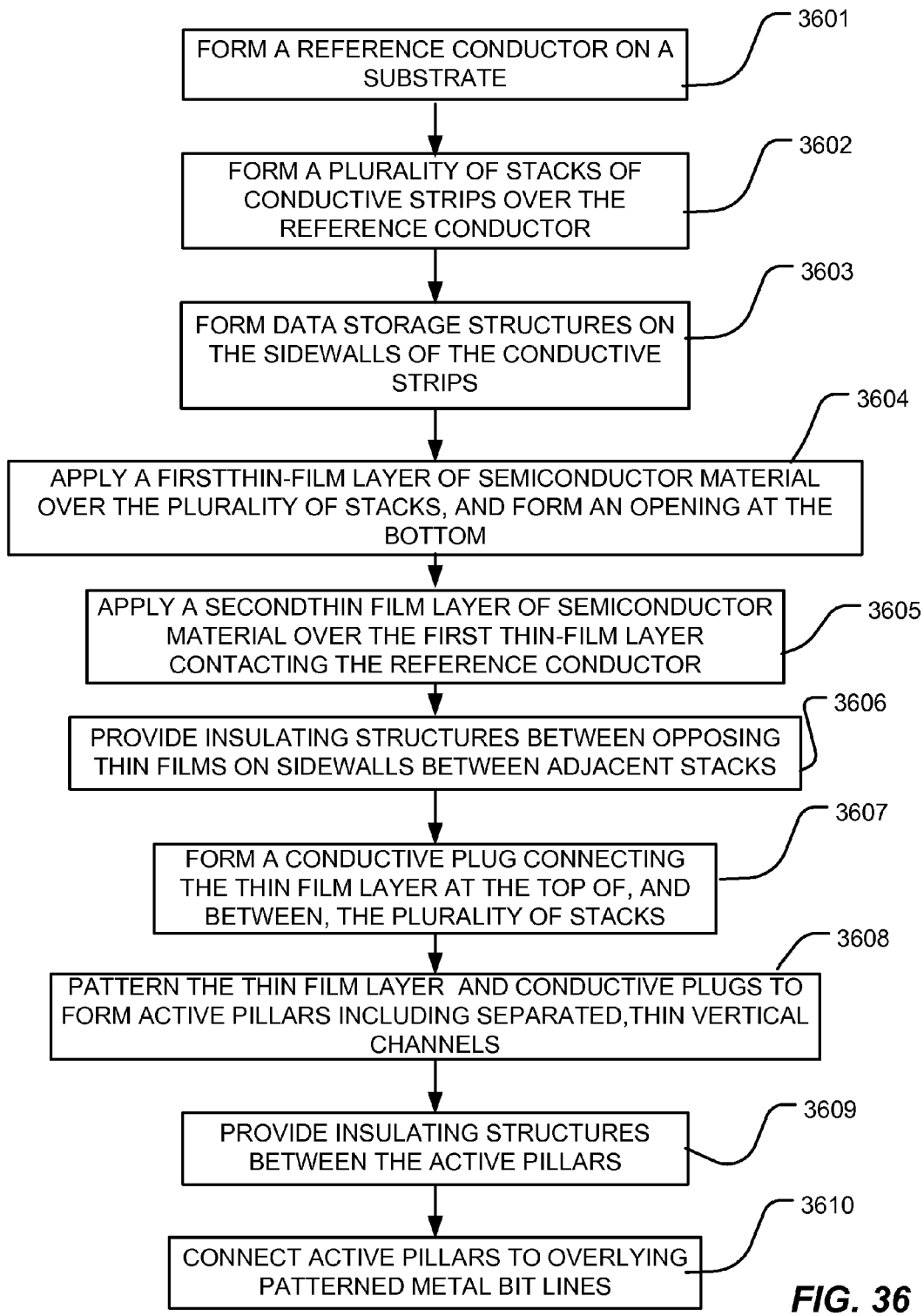
FIG. 36 is a flow chart illustrating a method for manufacturing a double gate vertical channel structure.

FIG. 36 is a flow chart illustrating a method for manufacturing a memory device. The method includes identifying areas on a substrate for formation of 3D memory blocks having a structure like that of FIG. 27. For each area, the method includes forming a reference conductor or conductors on the substrate by, for example, implanting heavy N-type doping, or by patterning conductive material on the substrate (3601). Over the reference conductor (e.g., 1101 in FIG. 14), the process includes forming a plurality of layers of a first conductive material, suitable to act as word lines, separated by insulating material, and etching the plurality of layers to define a plurality of stacks of conductive strips (3602). The stacks can include at least a bottom plane (GSL) of conductive strips, a plurality of intermediate planes (WLs) of conductive strips, and a top plane of conductive strips (SSLs).

The method includes forming a memory layer on side surfaces of conductive strips in the plurality of stacks (3603). The memory layer can comprise a dielectric charge trapping structure as discussed above with reference to FIGS. 15 and 35. The memory layer contacts side surfaces of the plurality of conductive strips.

The method includes forming a first thin-film layer of a semiconductor material over and having a surface conformal with the memory layer on the plurality of stacks. The thin film extends down the sidewalls of the trenches between the stacks, and over the bottom of the trenches. Then a spacer etch is applied to the thin film to form an opening at the bottom exposing the reference conductor as discussed with reference to FIGS. 16 and 17 (3604).

The method includes forming a second thin-film layer of semiconductor material over the first thin-film layer. The second thin-film layer contacts the reference conductor in the opening at the bottom as discussed with reference to FIG. 18 (3605). A thermal anneal can be applied to merge the first thin film on the sidewall of the trenches with the second thin film. Other techniques can be applied to line the sidewalls of the trenches with the thin film semiconductor layer, which is continuous across the bottom of the trenches, and in electrical contact with the reference conductor.

An insulating structure is provided between the opposing thin films on the sidewalls of adjacent stacks as discussed with reference to FIG. 19 (3606). In some embodiments, the insulating structure includes a gap at least in the regions of the memory cells being formed. This step of providing an insulating structure can comprise simply leaving the gap separating the thin films on opposing sides of the trenches without treatment, applying a brief oxidation process to oxidize the exposed surfaces.

A conductive plug is formed along the upper ends of the gaps between the stacks, connecting the thin-film layer of semiconductor material across the gaps in the plurality of stacks. The plug can be then etched back or planarized as discussed above with reference to FIGS. 20-22 (3607).

Then, the structures between the plurality of stacks of conductive strips are etched using a pattern of holes to define active pillars that include separated, vertical thin channel films in the regions of the memory cells as discussed with reference to FIG. 23 (3608). Insulating structures are provided between the active pillars which can be formed as discussed above with reference to FIG. 28 or 29 for example (3609).

The method can further include forming a first overlying patterned conductor layer connected to the plurality of bit line structures, including a plurality of global bit lines coupled to sensing circuits, and forming a second overlying patterned conductor layer connected to the at least one reference line structure, coupled to a reference voltage source as discussed reference to FIGS. 24-27 (3610). Also, the same or additional patterned conductor layers can be coupled to the SSL strips, and to the GSL and word line pads.

As a result of forming the active pillars, memory cells are formed at each frustum of the pillars in interface regions at cross-points on opposing side surfaces of the conductive strips in the plurality of intermediate planes (WLs) with the vertical thin channel films of the plurality of bit line structures. Also, string select switches are disposed at interface regions with the top plane of conductive strips (SSLs), and reference select switches are disposed at interface regions with the bottom plane (GSL) of conductive strips. The memory layer can comprise dielectric layers that can act as the gate dielectric layers for the string select switches and reference select switches.

With reference to FIG. 36 and other disclosure herein, several aspects of the manufacturing process can be understood. In one aspect, a manufacturing method is described which includes forming first and second stacks of conductive strips having sidewalls; forming data storage structures on the sidewalls of the first and second stacks; and forming first and second opposing vertical channel films on the data storage structures, leaving a gap between the first and second opposing vertical channel films.

In another aspect, the manufacturing method includes forming a reference conductor on a substrate; forming first and second stacks of conductive strips over the reference conductor; forming data storage structures on the sidewalls of the first and second stacks; forming first and second opposing vertical channel films on the data storage structures between the first and second stacks, and in electrical contact with the reference conductor; and forming a bit line over the first and second stacks in electrical contact with the first and second opposing vertical channel films.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A memory device, comprising: first and second stacks of conductive strips having sidewalls;
   data storage structures on the sidewalls of the conductive strips in the first and second stacks, and on top surfaces of the first and second stacks;
   first and second vertical thin channel films having outside surfaces and inside surfaces, the outside surfaces disposed on the data storage structures on the sidewalls of the first and second stacks;
   first memory cells at cross-points between the outside surfaces of the first vertical thin channel films and the conductive strips in the first stacks of conductive strips, and second memory cells at cross-points between the outside surfaces of the second vertical thin channel films and the conductive strips in the second stacks of conductive strips;
   a reference conductor below the first and second stacks, and wherein the first and second vertical thin channel films are in physical contact with the reference conductor; and
   insulating structures isolating the first vertical thin channel films of adjacent first memory cells along the conductive strips in the first stack of conductive strips, and isolating the second vertical thin channel films of adjacent second memory cells along the conductive strips in the second stack of conductive strips.

2. The memory device of claim 1, including a solid dielectric material between the inside surfaces of the first and second vertical thin channel films.

3. The memory device of claim 1, including a gap between the inside surfaces of the first and second vertical channel films.

4. The memory device of claim 1, wherein the data storage structure comprises a multilayer dielectric charge trapping structure.

5. The memory device of claim 1, including a conductive element connecting the first and second vertical thin channel films at upper ends, a bit line over the first and second stacks, and an interlayer connector connecting the bit line to the conductive element.

6. The memory device of claim 1, wherein the vertical thin channel films have a width, and the data storage structures include dielectric charge storage layers having a width that is less than the width of the vertical thin channel films.

7. A memory device including a plurality of memory cells, comprising:
a plurality of stacks of conductive strips, the plurality including adjacent first and second stacks, the first stack having a first side and a second side and the second stack having a first side opposed to the second side of the first stack, and a second side;
data storage structures on sidewalls of the conductive strips on the first and second sides of the stacks, and on top surfaces of the first and second stacks;
a first thin-film semiconductor strip disposed vertically in contact with the data storage structure on the first side of the first stack;
a second thin-film semiconductor strip disposed vertically in contact with the data storage structures on the second side of the first stack;
a third thin-film semiconductor strip disposed vertically in contact with the data storage structure on the first side of the second stack;
a fourth thin-film semiconductor strip disposed vertically in contact with the data storage structures on the second side of the second stack;
the memory cells in the plurality of memory cells having channels in the thin-film semiconductor strips and gates in the conductive strips;
a patterned conductor layer or layers over the plurality of stacks;
a first interlayer connector connecting a first conductor in the patterned conductor layer or layers to a top surface of the first thin-film semiconductor strip;
a second interlayer connector connecting a second conductor in the patterned conductor layer or layers to a top surface of the second and third thin-film semiconductor strips;
a reference conductor below the plurality of stacks, and wherein the second thin-film semiconductor strip and the third thin-film semiconductor strip are physically connected to the reference conductor between the adjacent first and second stacks; and
a third interlayer connector connecting a third conductor in the patterned conductor layer or layers to a top surface of the fourth thin-film semiconductor strip.

8. The memory device of claim 7, including a gap between the second and third thin-film semiconductor strips.

9. The memory device of claim 8, including insulating layers on the second thin-film semiconductor strip and on the third thin-film semiconductor strip, the insulating layers being separated by said gap.

10. A memory device, comprising:
a plurality of stacks of conductive strips having sidewalls, the plurality of stacks including even stacks and odd stacks;
data storage structures on the sidewalls of the conductive strips in the plurality of stacks including the even and odd stacks, and on top surfaces of the plurality of stacks including the even and odd stacks;
a plurality of active pillars arranged between corresponding even and odd stacks of conductive strips in the plurality of stacks, active pillars in the plurality comprising even and odd vertical thin channel films having outside surfaces and inside surfaces, defining a multilayer array of interface regions at cross-points between outside surfaces of the even and odd vertical thin channel films and conductive strips in the corresponding even and odd stacks of conductive strips;
a 3D array of even memory cells in the interface regions accessible via the active pillars and conductive strips in the even stacks of conductive strips and odd memory cells in the interface regions accessible via the active pillars and conductive strips in the odd stacks of conductive strips, wherein the odd memory cells on a given active pillar are configured as a first NAND string, and the even memory cells on said given active pillar are configured as a second NAND string, and wherein the inside surfaces of the even and odd vertical thin channel films of said given active pillar are separated in the interface regions;
insulating structures isolating the even vertical thin channel films of adjacent even memory cells along the conductive strips in the even stacks, and isolating the odd vertical thin channel films of adjacent odd memory cells along the conductive strips in the odd stacks;
conductive strips in an upper level in the even and odd stacks being configured as string select lines for both the first and second NAND strings on a given active pillar;
conductive strips in intermediate levels in the even and odd stacks being configured as word lines for respective ones of the first and second NAND strings on a given active pillar;
conductive strips in a lower level in the even and odd stacks being configured as ground select lines for both the first and second NAND strings on a given active pillar;
a reference conductor beneath and physically connected to active pillars in the plurality of active pillars; and
control circuitry configured to apply different bias voltages to the even and odd conductive strips.

11. The memory device of claim 10, wherein active pillars in the plurality of active pillars include a dielectric material separating the even and odd vertical thin channel films.

12. The memory device of claim 10, wherein active pillars in the plurality of active pillars include a gap separating the even and odd vertical thin channel films.

13. The memory device of claim 10, wherein the plurality of stacks of conductive strips are arranged in blocks, and in a given block, conductive strips in a given layer of an odd stack are configured in a comb-like structure with strips extending from an odd pad, and conductive strips in the given layer of an even stack are configured in a comb-like structure with strips extending from an even pad, the conductive strips extending from the odd and even pads in the given block being interdigitated.

14. The memory device of claim 10, wherein the memory cells comprise dielectric charge storage structures.

15. The memory device of claim 10, including one or more patterned conductor layers over the plurality of stacks, including bit lines, and interlayer connectors connecting the bit lines to corresponding active pillars.

16. The memory device of claim 10, including a patterned conductor disposed beside the plurality of stacks, and connected to the reference conductor.

17. A manufacturing method, comprising:
    forming a reference conductor on a substrate;
    forming over the reference conductor, first and second stacks of conductive strips having side walls;
    forming data storage structures on the sidewalls of the first and second stacks, and on top surfaces of the first and second stacks;
    forming first and second opposing vertical thin channel films on the data storage structures on the sidewalls of the first and second stacks, and in physical contact with the reference conductor; and
    forming a bit line over the first and second stacks, in electrical contact with the first and second opposing vertical thin channel films.

18. The method of claim 17, including leaving a gap between the first and second vertical thin channel films.

19. The method of claim 17, including forming a conductive element connecting the first and second vertical thin channel films at upper ends, forming a contact plug on the conductive element, the bit line being in electrical communication with the contact plug.

20. The method of claim 17, wherein forming the reference conductor comprises forming a layer of semiconductor material below the first and second stacks.

21. The method of claim 17, wherein forming the first and second stacks includes:
    forming a plurality of layers of conductive material separated by layers of insulating material; and
    etching trenches in the plurality of layers to define the first and second stacks.

22. The method of claim 21, wherein forming the vertical thin channel films includes:
    depositing a layer of semiconductor material over the first and second stacks having a thickness 10 nanometers or less on the sides of the conductive strips in the stacks; and
    etching a pattern in the layer of semiconductor material to define the first and second vertical thin channel films.

23. The method of claim 21, wherein forming the data storage structures includes forming a plurality of layers of dielectric material over the sidewalls of the first and second stacks.

* * * * *